United States Patent
Kim et al.

(10) Patent No.: US 7,873,104 B2
(45) Date of Patent: Jan. 18, 2011

(54) DIGITAL TELEVISION TRANSMITTING SYSTEM AND RECEIVING SYSTEM AND METHOD OF PROCESSING BROADCASTING DATA

(75) Inventors: Jin Woo Kim, Seoul (KR); In Hwan Choi, Gyeonggi-do (KR); Kook Yeon Kwak, Gyeonggi-do (KR); Jong Moon Kim, Gyeonggi-do (KR); Won Gyu Song, Seoul (KR); Hyoung Gon Lee, Seoul (KR); Byoung Gill Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 376 days.

(21) Appl. No.: 11/871,081

(22) Filed: Oct. 11, 2007

(65) Prior Publication Data

US 2008/0089407 A1  Apr. 17, 2008

Related U.S. Application Data

(60) Provisional application No. 60/884,208, filed on Jan. 9, 2007, provisional application No. 60/829,271, filed on Oct. 12, 2006.

(30) Foreign Application Priority Data

Nov. 2, 2006  (KR) .................. 10-2006-0108038

(51) Int. Cl.
*H04N 7/12* (2006.01)
(52) U.S. Cl. .................. 375/240.02; 375/240.12; 375/240.15; 375/240.16; 375/240.25
(58) Field of Classification Search ............. 375/240.12
See application file for complete search history.

(56) References Cited

U.S. PATENT DOCUMENTS

| | | |
|---|---|---|
| 4,642,755 A | 2/1987 | Hinch |
| 5,177,796 A | 1/1993 | Feig et al. |
| 5,208,816 A | 5/1993 | Seshardi et al. |

(Continued)

FOREIGN PATENT DOCUMENTS

CA  2404404  3/2003

(Continued)

OTHER PUBLICATIONS

Yao, J., "IP Datacasting and Channel Error Handling with DVB-H", Proceedings of the 2005 Emerging Information Technology Conference; XP-010856441; Aug. 15, 2005.

(Continued)

*Primary Examiner*—Jamie J Atala
(74) *Attorney, Agent, or Firm*—Lee, Hong, Degerman, Kang & Waimey

(57) ABSTRACT

A digital television (DTV) transmitting system includes a first frame decoder, a second frame decoder, and a frame multiplexer. The first frame decoder forms first enhanced data frames, encodes each data frame for error correction, forms a first super frame by combining the encoded first frames, and interleaves the first super frame. The second frame decoder forms second enhanced data frames, encodes each data frame for error correction, forms a second super frame by combining the encoded second frames, and interleaves the second super frame. The frame multiplexer multiplexes the interleaved first and second enhanced data frames.

18 Claims, 17 Drawing Sheets

U.S. PATENT DOCUMENTS

| | | | |
|---|---|---|---|
| 5,258,987 A | 11/1993 | Wei | |
| 5,301,167 A | 4/1994 | Proakis et al. | |
| 5,488,635 A | 1/1996 | Chennakeshu et al. | |
| 5,502,506 A | 3/1996 | Choi | |
| 5,508,752 A | 4/1996 | Kim et al. | |
| 5,511,096 A | 4/1996 | Huang et al. | |
| 5,602,593 A * | 2/1997 | Katto | 375/240.16 |
| 5,606,569 A | 2/1997 | MacDonald et al. | |
| 5,619,269 A | 4/1997 | Lee et al. | |
| 5,636,251 A | 6/1997 | Citta et al. | |
| 5,691,993 A | 11/1997 | Fredrickson | |
| 5,754,651 A | 5/1998 | Blatter et al. | |
| 5,757,416 A | 5/1998 | Birch et al. | |
| 5,771,239 A | 6/1998 | Moroney et al. | |
| 5,867,503 A | 2/1999 | Ohsuga et al. | |
| 5,903,324 A | 5/1999 | Lyons et al. | |
| 5,956,373 A | 9/1999 | Goldsten et al. | |
| 5,978,424 A | 11/1999 | Turner | |
| 6,005,894 A | 12/1999 | Kumar | |
| 6,021,421 A | 2/2000 | Retter et al. | |
| 6,049,651 A | 4/2000 | Oshima | |
| 6,075,569 A | 6/2000 | Lee et al. | |
| 6,124,898 A | 9/2000 | Patel et al. | |
| 6,212,659 B1 | 4/2001 | Zehavi | |
| 6,219,386 B1 | 4/2001 | Amrany et al. | |
| 6,226,380 B1 | 5/2001 | Ding | |
| 6,233,295 B1 | 5/2001 | Wang | |
| 6,243,469 B1 | 6/2001 | Kataoka et al. | |
| 6,272,660 B1 | 8/2001 | Chen et al. | |
| 6,289,485 B1 | 9/2001 | Shiomoto | |
| 6,334,187 B1 | 12/2001 | Kadono | |
| 6,339,618 B1 | 1/2002 | Puri et al. | |
| 6,356,598 B1 | 3/2002 | Wang | |
| 6,405,338 B1 | 6/2002 | Sinha et al. | |
| 6,411,253 B1 | 6/2002 | Cox et al. | |
| 6,446,234 B1 | 9/2002 | Cox et al. | |
| 6,456,611 B1 | 9/2002 | Hu et al. | |
| 6,459,741 B1 | 10/2002 | Grabb et al. | |
| 6,470,047 B1 | 10/2002 | Kleinerman et al. | |
| 6,490,007 B1 | 12/2002 | Bouillet et al. | |
| 6,498,936 B1 | 12/2002 | Raith | |
| 6,512,759 B1 | 1/2003 | Hashimoto et al. | |
| 6,515,713 B1 | 2/2003 | Nam | |
| 6,553,538 B2 | 4/2003 | Zehavi | |
| 6,573,947 B1 | 6/2003 | Oh | |
| 6,577,685 B1 | 6/2003 | Bao et al. | |
| 6,650,880 B1 | 11/2003 | Lee et al. | |
| 6,651,250 B1 | 11/2003 | Takai | |
| 6,665,308 B1 | 12/2003 | Rakib et al. | |
| 6,665,343 B1 | 12/2003 | Jahanghir et al. | |
| 6,671,002 B1 | 12/2003 | Konishi et al. | |
| 6,686,880 B1 | 2/2004 | Marko et al. | |
| 6,687,310 B1 | 2/2004 | Fimoff | |
| 6,694,518 B1 | 2/2004 | Dulac | |
| 6,704,358 B1 * | 3/2004 | Li et al. | 375/240.02 |
| 6,731,700 B1 | 5/2004 | Yaknich et al. | |
| 6,734,920 B2 | 5/2004 | Ghosh et al. | |
| 6,738,949 B2 | 5/2004 | Senda et al. | |
| 6,744,474 B2 | 6/2004 | Markman | |
| 6,744,822 B1 | 6/2004 | Gaddam et al. | |
| 6,744,926 B1 * | 6/2004 | Nishigaki | 382/239 |
| 6,760,077 B2 | 7/2004 | Choi et al. | |
| 6,768,517 B2 | 7/2004 | Limberg et al. | |
| 6,775,334 B1 | 8/2004 | Liu et al. | |
| 6,803,970 B1 | 10/2004 | Limberg et al. | |
| 6,810,084 B1 | 10/2004 | Jun et al. | |
| 6,810,090 B1 | 10/2004 | Perlow | |
| 6,816,204 B2 | 11/2004 | Limberg | |
| 6,842,875 B2 | 1/2005 | Kondo et al. | |
| 6,904,110 B2 | 6/2005 | Trans et al. | |
| 6,909,743 B1 | 6/2005 | Ward et al. | |
| 6,917,655 B2 | 7/2005 | Fimoff et al. | |
| 6,922,215 B2 | 7/2005 | Choi et al. | |
| 6,924,753 B2 | 8/2005 | Bretl et al. | |
| 6,925,126 B2 * | 8/2005 | Lan et al. | 375/240.25 |
| 6,927,708 B2 | 8/2005 | Fimoff | |
| 6,934,331 B2 * | 8/2005 | Kamikura et al. | 375/240.12 |
| 6,944,242 B2 | 9/2005 | Yaknich et al. | |
| 6,947,487 B2 | 9/2005 | Choi et al. | |
| 6,952,595 B2 | 10/2005 | Ikedo et al. | |
| 6,956,619 B2 | 10/2005 | Choi et al. | |
| 6,973,137 B2 | 12/2005 | Birru et al. | |
| 6,975,689 B1 | 12/2005 | McDonald et al. | |
| 6,977,914 B2 | 12/2005 | Paila et al. | |
| 6,977,977 B1 | 12/2005 | Dubrovin et al. | |
| 6,980,603 B2 | 12/2005 | Choi et al. | |
| 6,985,420 B2 | 1/2006 | Shishido | |
| 6,985,537 B1 | 1/2006 | Milbar | |
| 6,993,021 B1 | 1/2006 | Chuah et al. | |
| 6,993,062 B1 | 1/2006 | Kong et al. | |
| 6,996,133 B2 | 2/2006 | Bretl et al. | |
| 7,010,038 B2 | 3/2006 | Choi et al. | |
| 7,016,446 B1 | 3/2006 | Spalink | |
| 7,020,481 B2 | 3/2006 | Kivijarvi | |
| 7,030,935 B2 | 4/2006 | Choi et al. | |
| 7,038,732 B1 | 5/2006 | Limberg et al. | |
| 7,042,949 B1 | 5/2006 | Omura et al. | |
| 7,085,324 B2 | 8/2006 | Choi et al. | |
| 7,092,447 B2 | 8/2006 | Choi et al. | |
| 7,092,455 B2 | 8/2006 | Choi et al. | |
| 7,096,484 B2 | 8/2006 | Mao et al. | |
| 7,102,692 B1 | 9/2006 | Carlsgaard et al. | |
| 7,110,449 B2 | 9/2006 | Heo et al. | |
| 7,111,221 B2 | 9/2006 | Birru et al. | |
| 7,130,313 B2 | 10/2006 | Pekonen | |
| 7,148,932 B2 | 12/2006 | Choi et al. | |
| 7,151,575 B1 | 12/2006 | Landry et al. | |
| 7,170,849 B1 | 1/2007 | Arivoli et al. | |
| 7,194,047 B2 | 3/2007 | Strolle et al. | |
| 7,209,459 B2 | 4/2007 | Kangas | |
| 7,221,358 B2 | 5/2007 | Sasaki | |
| 7,343,487 B2 | 3/2008 | Lindqvist et al. | |
| 7,356,549 B1 | 4/2008 | Bruso et al. | |
| 7,376,074 B2 | 5/2008 | Jung et al. | |
| 7,376,186 B2 * | 5/2008 | Boyce et al. | 375/240.15 |
| 7,400,820 B2 | 7/2008 | Uchida et al. | |
| 7,440,516 B2 | 10/2008 | Kim et al. | |
| 7,450,613 B2 | 11/2008 | Choi et al. | |
| 7,454,683 B2 | 11/2008 | Vesma et al. | |
| 7,460,606 B2 | 12/2008 | Choi et al. | |
| 7,590,187 B2 | 9/2009 | Jeong et al. | |
| 7,593,474 B2 | 9/2009 | Jeong et al. | |
| 7,620,118 B2 | 11/2009 | Choi | |
| 7,634,006 B2 | 12/2009 | Choi et al. | |
| 7,653,143 B2 | 1/2010 | Kim et al. | |
| 7,675,994 B2 | 3/2010 | Gaddam et al. | |
| 7,698,621 B2 | 4/2010 | Choi et al. | |
| 7,705,920 B2 | 4/2010 | Lee et al. | |
| 7,733,426 B2 | 6/2010 | Lee et al. | |
| 7,733,819 B2 | 6/2010 | Lee et al. | |
| 7,733,820 B2 | 6/2010 | Choi et al. | |
| 7,779,337 B2 | 8/2010 | Song et al. | |
| 2001/0011213 A1 | 8/2001 | Hindie et al. | |
| 2001/0034867 A1 | 10/2001 | Jaffe et al. | |
| 2002/0046406 A1 | 4/2002 | Chelehmal et al. | |
| 2002/0051087 A1 | 5/2002 | Limberg et al. | |
| 2002/0080992 A1 | 6/2002 | Decker et al. | |
| 2002/0085632 A1 | 7/2002 | Choi et al. | |
| 2002/0089078 A1 | 7/2002 | Suzuki et al. | |
| 2002/0126222 A1 | 9/2002 | Choi et al. | |
| 2002/0136197 A1 | 9/2002 | Owen et al. | |
| 2002/0141440 A1 | 10/2002 | Stanley et al. | |
| 2002/0150167 A1 | 10/2002 | Demjanenko et al. | |

| | | | | | | |
|---|---|---|---|---|---|---|
| 2002/0150246 | A1 | 10/2002 | Ogina | 2006/0203944 | A1 | 9/2006 | Kwak et al. |
| 2002/0154709 | A1 | 10/2002 | Choi et al. | 2006/0212910 | A1 | 9/2006 | Endres et al. |
| 2002/0159520 | A1 | 10/2002 | Choi et al. | 2006/0223461 | A1 | 10/2006 | Laroia et al. |
| 2002/0172154 | A1 | 11/2002 | Uchida et al. | 2006/0245488 | A1 | 11/2006 | Puputti et al. |
| 2002/0186780 | A1 | 12/2002 | Choi et al. | 2006/0245505 | A1 | 11/2006 | Limberg |
| 2002/0186790 | A1 | 12/2002 | Choi et al. | 2006/0246836 | A1 | 11/2006 | Simon |
| 2002/0187767 | A1 | 12/2002 | Meehan | 2006/0248563 | A1 | 11/2006 | Lee et al. |
| 2002/0191716 | A1 | 12/2002 | Xia et al. | 2006/0253890 | A9 | 11/2006 | Park et al. |
| 2002/0194570 | A1 | 12/2002 | Birru et al. | 2006/0262227 | A1 | 11/2006 | Jeong |
| 2003/0046431 | A1 | 3/2003 | Belleguie | 2006/0262744 | A1 | 11/2006 | Xu et al. |
| 2003/0067899 | A9 | 4/2003 | Chen et al. | 2006/0262863 | A1 | 11/2006 | Park et al. |
| 2003/0093798 | A1 | 5/2003 | Rogerson | 2006/0268673 | A1 | 11/2006 | Roh et al. |
| 2003/0099303 | A1 | 5/2003 | Birru et al. | 2006/0269012 | A1 | 11/2006 | Kim et al. |
| 2003/0152107 | A1 | 8/2003 | Pekonen | 2006/0285608 | A1 | 12/2006 | Kim et al. |
| 2003/0206053 | A1 | 11/2003 | Xia et al. | 2007/0019579 | A1 | 1/2007 | Xu et al. |
| 2003/0223519 | A1 | 12/2003 | Jeong et al. | 2007/0053606 | A1 | 3/2007 | Ali |
| 2003/0234890 | A1 | 12/2003 | Bae et al. | 2007/0071110 | A1 | 3/2007 | Choi et al. |
| 2004/0022278 | A1 | 2/2004 | Thomas et al. | 2007/0092027 | A1 | 4/2007 | Yu et al. |
| 2004/0028076 | A1 | 2/2004 | Strolle et al. | 2007/0092043 | A1 | 4/2007 | Yu et al. |
| 2004/0034491 | A1 | 2/2004 | Kim | 2007/0094566 | A1 | 4/2007 | Park et al. |
| 2004/0061645 | A1 | 4/2004 | Seo et al. | 2007/0094567 | A1 | 4/2007 | Park et al. |
| 2004/0071241 | A1 | 4/2004 | Bouillet et al. | 2007/0113145 | A1 | 5/2007 | Yu et al. |
| 2004/0090997 | A1 | 5/2004 | Choi et al. | 2007/0121681 | A1 | 5/2007 | Kang et al. |
| 2004/0100588 | A1 | 5/2004 | Hartson et al. | 2007/0127598 | A1 | 6/2007 | Kang et al. |
| 2004/0101046 | A1 | 5/2004 | Yang et al. | 2007/0130495 | A1 | 6/2007 | Yoon et al. |
| 2004/0105507 | A1 | 6/2004 | Chang et al. | 2007/0135166 | A1 | 6/2007 | Ding et al. |
| 2004/0110522 | A1 | 6/2004 | Howard et al. | 2007/0136643 | A1 | 6/2007 | Kang et al. |
| 2004/0125235 | A1 | 7/2004 | Kim et al. | 2007/0140368 | A1 | 6/2007 | Kim et al. |
| 2004/0148642 | A1 | 7/2004 | Park et al. | 2007/0147432 | A1 | 6/2007 | Kang et al. |
| 2004/0156460 | A1 | 8/2004 | Kim et al. | 2007/0168844 | A1 | 7/2007 | Jeong et al. |
| 2004/0181800 | A1 | 9/2004 | Rakib et al. | 2007/0172003 | A1 | 7/2007 | Kim et al. |
| 2004/0184547 | A1 | 9/2004 | Choi et al. | 2007/0195889 | A1 | 8/2007 | Hong et al. |
| 2004/0246373 | A1* | 12/2004 | Kadono et al. ........... 348/384.1 | 2007/0201544 | A1 | 8/2007 | Zhu et al. |
| 2004/0260985 | A1 | 12/2004 | Krieger | 2007/0211769 | A1 | 9/2007 | Lee et al. |
| 2005/0013380 | A1 | 1/2005 | Kim et al. | 2007/0217499 | A1 | 9/2007 | Limberg |
| 2005/0024543 | A1 | 2/2005 | Ramaswamy et al. | 2007/0230607 | A1 | 10/2007 | Yu et al. |
| 2005/0031097 | A1 | 2/2005 | Rabenko et al. | 2007/0248055 | A1 | 10/2007 | Jain et al. |
| 2005/0049923 | A1 | 3/2005 | Tanaka et al. | 2007/0253502 | A1 | 11/2007 | Park et al. |
| 2005/0090235 | A1 | 4/2005 | Vermola et al. | 2008/0008155 | A1 | 1/2008 | Yoon et al. |
| 2005/0097428 | A1 | 5/2005 | Chang et al. | 2008/0019466 | A1 | 1/2008 | Limberg |
| 2005/0111586 | A1 | 5/2005 | Kang et al. | 2008/0063089 | A1 | 3/2008 | Chen |
| 2005/0129132 | A1 | 6/2005 | Choi et al. | 2008/0069147 | A1 | 3/2008 | Lee et al. |
| 2005/0132413 | A1 | 6/2005 | Barreyro et al. | 2008/0095096 | A1 | 4/2008 | Cho et al. |
| 2005/0141606 | A1 | 6/2005 | Choi et al. | 2008/0112479 | A1 | 5/2008 | Garmany et al. |
| 2005/0152446 | A1 | 7/2005 | Choi et al. | 2008/0134007 | A1 | 6/2008 | Lee et al. |
| 2005/0157758 | A1 | 7/2005 | Yoo | 2008/0137525 | A1 | 6/2008 | Liu |
| 2005/0162886 | A1 | 7/2005 | Jeong et al. | 2008/0151937 | A1 | 6/2008 | Lee et al. |
| 2005/0172208 | A1 | 8/2005 | Yoon | 2008/0152035 | A1 | 6/2008 | Lee et al. |
| 2005/0175080 | A1 | 8/2005 | Bouillett | 2008/0159279 | A1 | 7/2008 | Younis et al. |
| 2005/0218237 | A1 | 10/2005 | Lapstun et al. | 2008/0170162 | A1 | 7/2008 | Kim et al. |
| 2005/0249300 | A1 | 11/2005 | Jeong et al. | 2008/0239161 | A1 | 10/2008 | Kim et al. |
| 2005/0249301 | A1 | 11/2005 | Jeong et al. | 2008/0240293 | A1 | 10/2008 | Kim et al. |
| 2005/0271158 | A1 | 12/2005 | Birru | 2008/0273589 | A1 | 11/2008 | Kim et al. |
| 2006/0015914 | A1 | 1/2006 | Lee | 2008/0279270 | A1 | 11/2008 | Zeng |
| 2006/0029159 | A1 | 2/2006 | Oh et al. | 2009/0028230 | A1 | 1/2009 | Leitner |
| 2006/0039460 | A1 | 2/2006 | Fimoff et al. | 2009/0034629 | A1 | 2/2009 | Suh et al. |
| 2006/0039503 | A1 | 2/2006 | Choi et al. | 2009/0037794 | A1 | 2/2009 | Choi et al. |
| 2006/0052052 | A1 | 3/2006 | Jung et al. | 2009/0059086 | A1 | 3/2009 | Lee et al. |
| 2006/0053436 | A1 | 3/2006 | Allwein et al. | 2009/0060097 | A1 | 3/2009 | Kim et al. |
| 2006/0072623 | A1 | 4/2006 | Park | 2009/0077588 | A1 | 3/2009 | Sugai |
| 2006/0078003 | A1 | 4/2006 | Watanabe et al. | 2009/0111486 | A1 | 4/2009 | Burstrom |
| 2006/0078071 | A1 | 4/2006 | Lee | 2009/0201997 | A1 | 8/2009 | Kim et al. |
| 2006/0078072 | A1 | 4/2006 | Cheon et al. | 2009/0262799 | A1 | 10/2009 | Limberg |
| 2006/0085726 | A1 | 4/2006 | Rhee et al. | 2010/0118206 | A1 | 5/2010 | Gao et al. |
| 2006/0104391 | A1 | 5/2006 | Choi et al. | 2010/0180294 | A1 | 7/2010 | Yun et al. |
| 2006/0126757 | A1 | 6/2006 | Choi et al. | | | | |
| 2006/0130099 | A1 | 6/2006 | Rooyen | | | | |
| 2006/0133429 | A1 | 6/2006 | Seo et al. | | FOREIGN PATENT DOCUMENTS | | | |
| 2006/0140301 | A1 | 6/2006 | Choi et al. | | | | |
| 2006/0146797 | A1 | 7/2006 | Lebizay | CN | 1582580 | 2/2005 | |
| 2006/0146955 | A1 | 7/2006 | Choi et al. | EP | 0526833 | 2/1993 | |
| 2006/0159183 | A1 | 7/2006 | Gaddam et al. | EP | 1566905 | 8/2005 | |
| 2006/0203127 | A1 | 9/2006 | Choi et al. | EP | 1628420 | 2/2006 | |
| | | | | JP | 2000224136 | 8/2000 | |

| | | |
|---|---|---|
| JP | 2001274769 | 10/2001 |
| JP | 2002218339 | 8/2002 |
| JP | 2003032640 | 1/2003 |
| JP | 2003209525 | 7/2003 |
| JP | 2003284037 | 10/2003 |
| JP | 2004129126 | 4/2004 |
| JP | 2006148543 | 6/2006 |
| JP | 2007096403 | 4/2007 |
| KR | 1020000040481 | 7/2000 |
| KR | 1020030026236 | 3/2003 |
| KR | 1020030037138 | 5/2003 |
| KR | 1020040032283 | 4/2004 |
| KR | 1020050065898 | 6/2005 |
| KR | 1020050093921 | 9/2005 |
| KR | 1020050097438 | 10/2005 |
| KR | 1020060009737 | 2/2006 |
| KR | 1020060012510 | 2/2006 |
| KR | 1020060039728 | 5/2006 |
| KR | 1020060063867 | 6/2006 |
| KR | 1020060065435 | 6/2006 |
| KR | 1020060068989 | 6/2006 |
| KR | 1020060070665 | 6/2006 |
| KR | 1020060072573 | 6/2006 |
| KR | 1020060095126 | 8/2006 |
| KR | 1020060095235 | 8/2006 |
| KR | 1020060102160 | 9/2006 |
| KR | 10-2006-112159 A | 10/2006 |
| KR | 1020060112159 A | 10/2006 |
| KR | 1020060117484 | 11/2006 |
| KR | 1020060133011 | 12/2006 |
| KR | 1020070007995 | 1/2007 |
| KR | 1020070034215 | 3/2007 |
| KR | 1020070068960 | 7/2007 |
| WO | 99/21323 | 4/1999 |
| WO | 02/37744 | 5/2002 |
| WO | 2005120062 A1 | 12/2005 |
| WO | WO 2005-115001 A1 | 12/2005 |
| WO | WO 2005120062 A1 | 12/2005 |
| WO | 2006003531 | 1/2006 |
| WO | 2006/093389 | 9/2006 |
| WO | 2007/008028 | 1/2007 |
| WO | 2007/091779 | 8/2007 |
| WO | 2008105587 | 9/2008 |

OTHER PUBLICATIONS

Kim, Sung-Hoon et al.; "Enhanced-x VSB System Development for Improving ATSC Terrestrial DTV Transmission Standard", IEEE Transactions on Broadcasting, vol. 52, No. 2, Jun. 2006.

Touzni, A., et al.; "Enhanced 8-VSB Transmission for North American HDTV Terrestrial Broadcast"; Proceedings on the 2003 IEEE International Conference on Acoustics, Speech and Signal Processing; vol. 2; pp. 437-440; XP010640975; Apr. 6, 2003.

Gaddam, V.R.; "A Newly Proposed ATSC DTV System for Transmitting a Robust Bit-Stream Along With the Standard Bit-Stream", IEEE Transactions of Consumer Electronics; XP001201224; vol. 49; Issue 4; Nov. 2003.

Fimoff, M, et al.; "E-VSB Map Signaling", IEEE Transactions on Consumer Electronics; vol. 49; Issue 3; pp. 515-518; Aug. 2003.

Uehara, M., et al.; "Transaction Scheme for the Terrestrial ISDB System"; IEEE Transactions on Consumer Electronics; vol. 45; Issue 1; Feb. 1999.

Advanced Television Systems Committee; "ATSC Standard; Digital Television Standard (A/53), Revision D, Including Amendment No. 1"; Doc A/53D; Jul. 19, 2005.

Chernock, Rich; "PSIP Generation and ATSC Stream Monitoring"; Triveni Digital, Oct. 8, 2004.

Advanced Television Systems Commitee; "Recommended practice: Guide to the use of the ATSC Digital Television Standard, Including Corrigendum No. 1"; Doc A/54A; Dec. 4, 2003.

European Telecommunication Standards Institute (ETSI); "Digital Video Broadcasting (DVB); DVB-H Implementation Guidelines"; ETSI TR 102 377 V 1.2.1, Nov. 2005.

ISO/IEC; "Information Technology—Generic Coding of Moving Pictures and Associated Audio Information: Systems" ISO/IEC 13818-1 International Standard; Second Edition; Dec. 1, 2000.

Federal Information Processing Standards Piblication 197; Announcing The Advanced Encryption Standard (AES); Nov. 26, 2001.

Advanced Television Systems Committee; "ATSC Recommended Practice: E-VSB Implementation Guidelines"; Doc A/112, Apr. 18, 2006.

Graell, A.; "Analysis and Design of Rate Compatible Serial Concatenated Convolution Codes"; Proceedings of the 2005 International Symposium on Information Theory; pp. 607-611; Sep. 4, 2005.

DVB-H Implementation Guidelines; DVB Document A092 Rev. 02, May 2007.

European Telecommunication Standards Institute (ETSI); "Radio Broadcasting Systems; Digital Audio Broadcasting (DAB) to Mobile, Portable and Fixed Receivers"; ETSI EN 300 401 V1.4.1., Jun. 2006.

Meyers, et al.; "Joint Carrier Phase and Symbol Timing Recovery for PAM Systems"; IEEE Transactions on Communications; vol. COM-28; No. 8; pp. 1121-1129; Aug. 1, 1980; XP000758588.

Hopkins, R., "Digital Terrestrial HDTV for North America—The Grand Alliance HDTV System," European Broadcasting Union (EBU) Review Technical, XP-000438385, pp. 36-50, Aug. 1994.

* cited by examiner

DIGITAL TELEVISION TRANSMITTING SYSTEM AND RECEIVING SYSTEM AND METHOD OF PROCESSING BROADCASTING DATA

This application claims the benefit of the Korean Patent Application No. 10-2006-0108038 filed on Nov. 2, 2006, which is hereby incorporated by reference as if fully set forth herein. This application also claims the benefit of U.S. Provisional Application No. 60/829,271, filed on Oct. 12, 2006, which is hereby incorporated by reference. Also, This application also claims the benefit of U.S. Provisional Application No. 60/884,208, filed on Jan. 9, 2007, which is hereby incorporated by reference.

BACKGROUND OF THE INVENTION

1. Field of the Invention

The present invention relates to a digital television (DTV) transmitting system and a DTV receiving system and a method of processing broadcast data.

2. Discussion of the Related Art

Presently, the technology for processing digital signals is being developed at a vast rate, and, as a larger number of the population uses the Internet, digital electric appliances, computers, and the Internet are being integrated. Therefore, in order to meet with the various requirements of the users, a system that can transmit diverse supplemental information in addition to video/audio data through a digital television channel needs to be developed.

Some users may assume that supplemental data broadcasting would be applied by using a PC card or a portable device having a simple in-door antenna attached thereto. However, when used indoors, the intensity of the signals may decrease due to a blockage caused by the walls or disturbance caused by approaching or proximate mobile objects. Accordingly, the quality of the received digital signals may be deteriorated due to a ghost effect and noise caused by reflected waves. However, unlike the general video/audio data, when transmitting the supplemental data, the data that is to be transmitted should have a low error ratio. More specifically, in case of the video/audio data, errors that are not perceived or acknowledged through the eyes or ears of the user can be ignored, since they do not cause any or much trouble. Conversely, in case of the supplemental data (e.g., program execution file, stock information, etc.), an error even in a single bit may cause a serious problem. Therefore, a system highly resistant to ghost effects and noise is required to be developed.

The supplemental data are generally transmitted by a time-division method through the same channel as the video/audio data. However, with the advent of digital broadcasting, digital television receiving systems that receive only video/audio data are already supplied to the market. Therefore, the supplemental data that are transmitted through the same channel as the video/audio data should not influence the conventional receiving systems that are provided in the market. In other words, this may be defined as the compatibility of broadcast system, and the supplemental data broadcast system should be compatible with the broadcast system. Herein, the supplemental data may also be referred to as enhanced data. Furthermore, in a poor channel environment, the receiving performance of the conventional receiving system may be deteriorated. More specifically, resistance to changes in channels and noise is more highly required when using portable and/or mobile receivers.

SUMMARY OF THE INVENTION

Accordingly, the present invention is directed to a digital broadcasting system and a data processing method that substantially obviate one or more problems due to limitations and disadvantages of the related art.

An object of the present invention is to provide a digital television system that is suitable for transmitting supplemental data and that is highly resistant to noise.

Another object of the present invention is to provide a digital broadcasting system and a data processing method that can perform additional encoding on enhanced data and transmitting the processed enhanced data, thereby enhancing the performance of the receiving system.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) transmitting system includes a first frame encoder, a second frame encoder, and a frame multiplexer. The first frame encoder forms a plurality of first enhanced data frames and encodes each first enhanced data frame for error correction. The first frame encoder further forms a first super frame by combining the encoded first enhanced data frames and interleaves the first super frame. Similarly, the second frame encoder forms a plurality of second enhanced data frames and encodes each second enhanced data frame for error correction. The second frame encoder further forms a second super frame by combining the encoded second enhanced data frames and interleaves the second super frame. The frame multiplexer then multiplexes the interleaved first enhanced data frames with the interleaved second enhanced data frames.

In another aspect of the present invention, a digital television (DTV) receiving system includes a tuner, a demodulator, an equalizer, a block decoder, a frame demultiplexer, a first frame decoder, and a second frame decoder. The tuner receives a digital broadcast signal containing enhanced data and main data. The demodulator demodulates the digital broadcast signal, and the equalizer performs channel equalization on the demodulated signal. The block decoder decodes each block of enhanced data in the equalized signal, and the frame demultiplexer demultiplexes the decoded enhanced data into first and second super frames. The first frame decoder deinterleaves the first super frame and decodes each of first enhanced data frames included in the first super frame for error correction. Similarly, the second frame decoder deinterleaves the second super frame and decodes each of second enhanced data frames included in the second super frame for error correction.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, the enhanced data may either consist of data including information such as program execution files, stock information, weather forecast, and so on, or consist of video/audio data. Additionally, the known data refer to data already known based upon a pre-determined agreement between the transmitting system and the receiving system. Furthermore, the main data consist of data that can be received from the conventional receiving system, wherein the main data include video/audio data. By performing additional encoding on the enhanced data and by transmitting the processed data, the present invention may provide robustness to the enhanced data, thereby enabling the data to respond more effectively to the channel environment that undergoes frequent changes. Particularly, in the present invention, the digital broadcast transmitting system (or digital broadcast transmitter) receives a plurality of enhanced data sets having other service information included therein. Thus, the transmitting system independently performs additional encoding processes and transmits the additionally processed data. A digital broadcast receiving system (or digital broadcast receiver) receives the processed data being transmitted, so as to decode the processed data.

Figure 1:
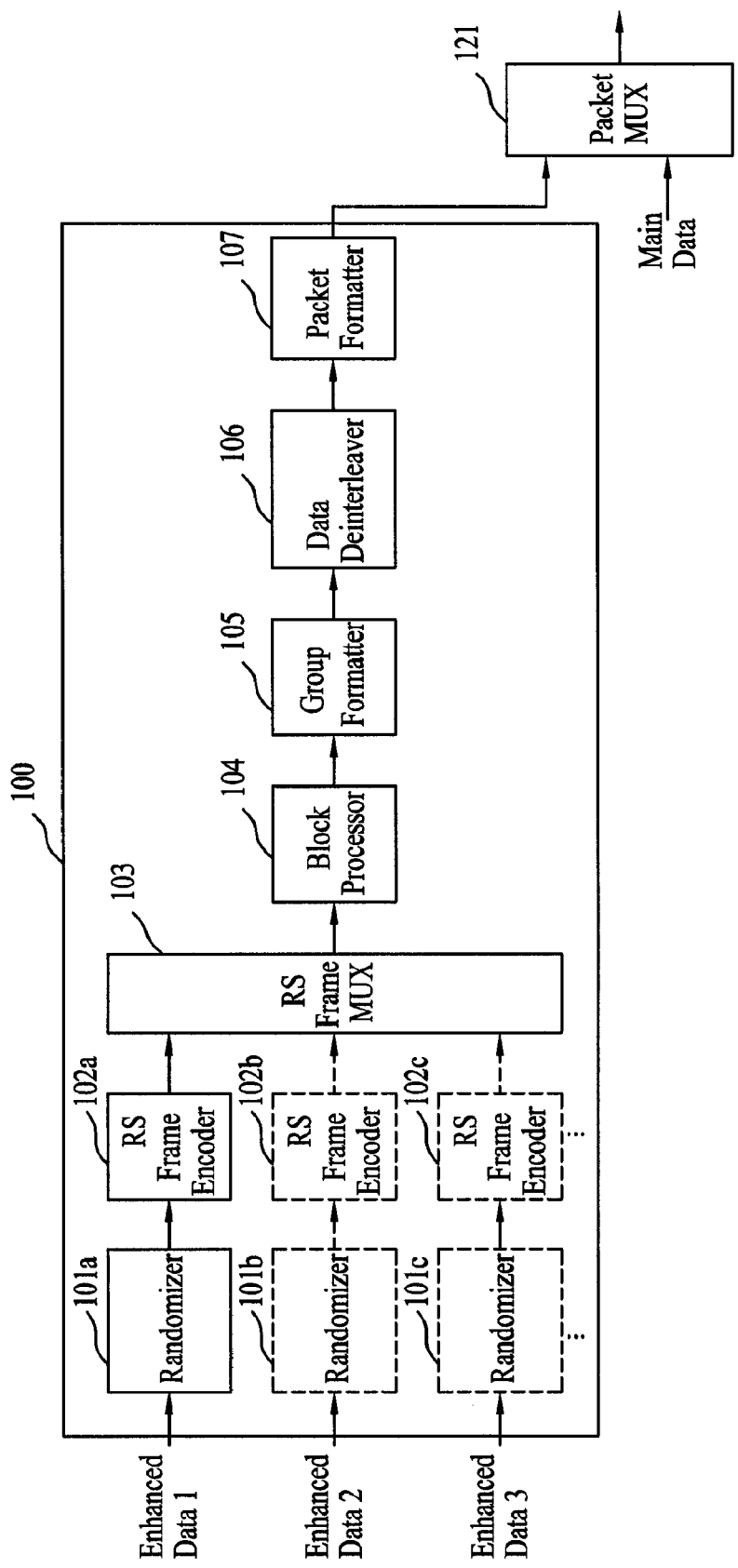
FIG. 1 illustrates a pre-processor within a transmitting system according to an embodiment of the present invention.
Figure 2:
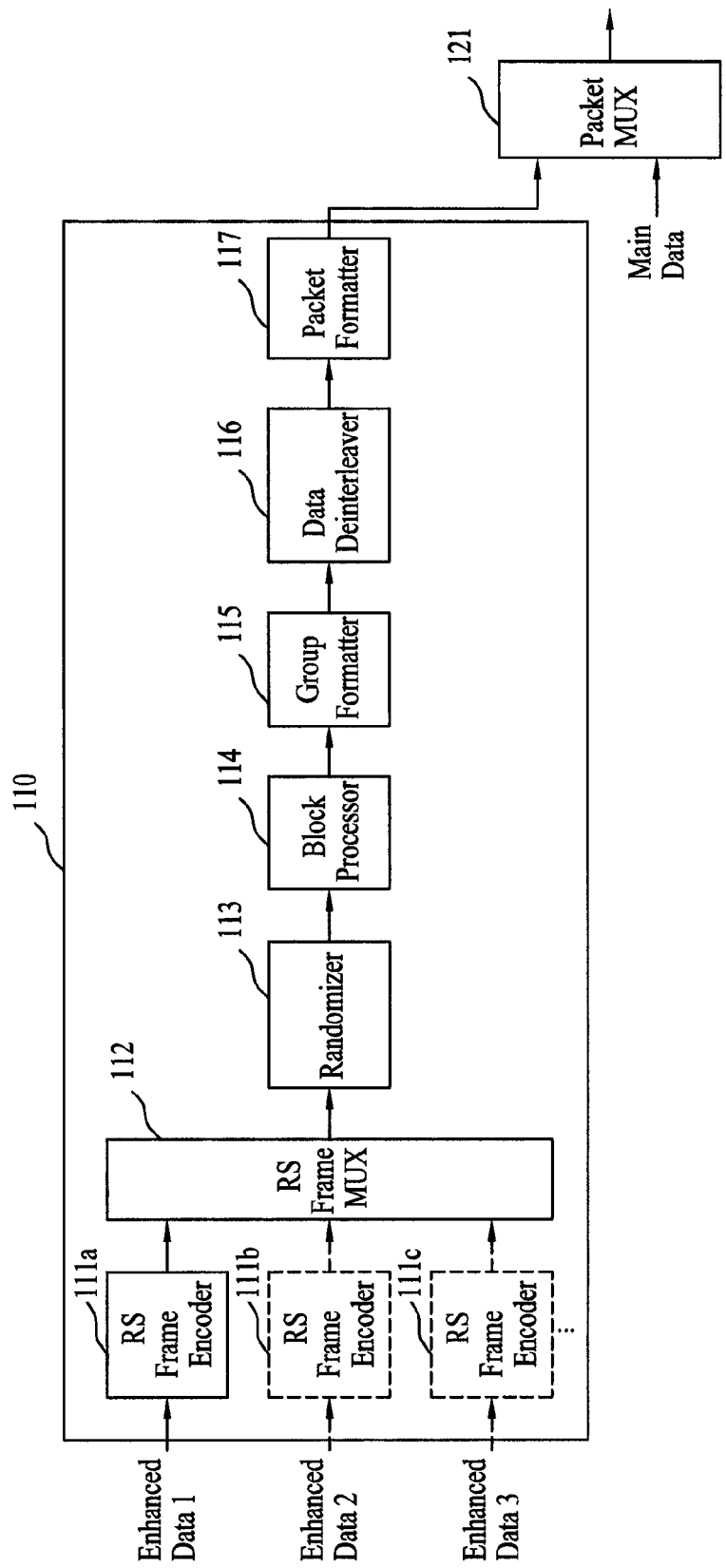
FIG. 2 illustrates a pre-processor within a transmitting system according to another embodiment of the present invention.

FIG. 1 and FIG. 2 illustrates examples of a portion of the transmitting system (or transmitter) for receiving various types of enhanced data and independently performing additional encoding processes according to the present invention. Referring to FIG. 1, the transmitting system includes a pre-processor 100 and a packet multiplexer 121. The pre-processor 100 includes the same number of randomizers and RS frame encoders. Herein, the number corresponds to the type (or number of sets) of enhanced data, which are to be processed with additional encoding. The alignment order of the randomizers ad RS frame encoders may vary in accordance with the design of the system designer. For example, an RS frame encoder may be positioned behind a randomizer. Alternatively, a randomizer may be positioned behind a RS frame encoder.

An example of a RS frame encoder being positioned behind a randomizer will now be described in detail as an embodiment of the present invention. In this example, each enhanced data set that is to be independently encoded is inputted to its respective randomizer through different paths. Herein, each enhanced data set that is being inputted to each randomizer through a different path may correspond to enhanced data each having different types of services included therein. Alternatively, each enhanced data set may also correspond to enhanced data having the same service type included therein. However, in this case, each enhanced data set is independently randomized by the randomizer and is then encoded in RS frame units. For example, the transmitting system according to the present invention may receive an enhanced data set including stock information and an enhanced data set including weather information through different paths. Then, the received enhanced data sets are sequentially processed independent randomizing and RS encoding processes. Furthermore, internal parameters of the RS frame encoders respectively performing RS frame encoding on each enhanced data set being randomized by each randomizer may vary depending upon priority levels or levels of importance of the enhanced data sets that are being inputted.

In the example of the present invention, first to third enhanced data sets enhanced data 1 to enhanced data 3 are inputted to first to third enhanced data randomizers 101a to 101c through each respective path. Furthermore, first to third RS encoders 102a to 102c are respectively positioned at the output end of the first to third enhanced data randomizer 101a to 101c. A RS frame multiplexer 103 is mutually provided at the output ends of the first to third RS frame encoders 102a to 102c. Herein, the RS frame multiplexer 103 multiplexes the enhanced data RS encoded by the first to third RS frame encoders 102a to 102c in RS frame units and outputs the multiplexed data. Then, a block processor 104, a group formatter 105, a data deinterleaver 106, and a packet formatter 107 are sequentially provided after the RS frame multiplexer 103.

In the present invention having the structure as shown in FIG. 1, the first to third enhanced data sets are respectively inputted to the first to third enhanced data randomizers 101a to 101c through different paths and then randomized, respectively. More specifically, by having each enhanced data randomizer 101a to 101c of the pre-processor 100 randomize the enhanced data, the randomizing process that is to be performed on the enhanced data by the randomizer positioned behind the packet multiplexer 121 may be omitted. The enhanced data sets respectively randomized by the first to third enhanced data randomizers 101a to 101c are, then, inputted to the first to third RS frame encoders 102a to 102c, respectively. Each of the first to third RS frame encoders 102a to 102c groups a plurality of randomized enhanced data bytes that are being inputted, thereby creating a RS frame, respectively. Then, each RS frame encoder performs an error correction encoding in RS frame units. At this point, an error detection encoding process may or may not be performed. Thus, by providing robustness to the enhanced data, the corresponding data may respond to the severely vulnerable and frequently changing frequency environment.

Figure 4:
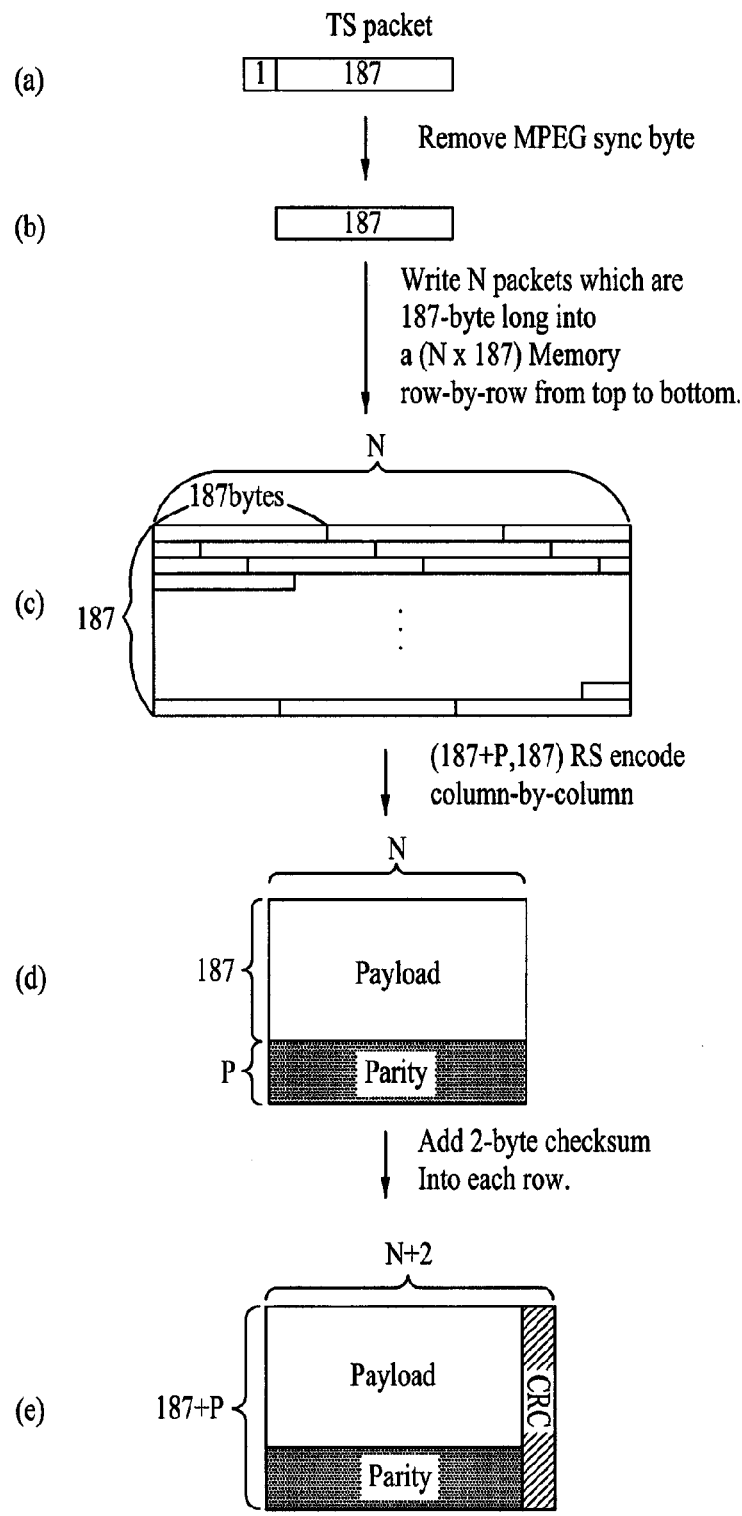
FIG. 4(a) to FIG. 4(e) illustrate examples showing the steps of an error correction coding process and an error detection coding process according to an embodiment of the present invention.

Each of the first to third RS frame encoders 102a to 102c may group a plurality of RS frames to create a super frame so as to perform interleaving or permutation in super frame units. Thus, by providing robustness to the enhanced data, a group error that may occur due to a change in the frequency environment may be scattered, thereby enabling the corresponding data to respond to the severely vulnerable and frequently changing frequency environment. Hereinafter, the process of creating a RS frame and the process of performing error correction encoding in RS frame units by each RS frame encoder will now be described in detail with reference to FIG. 4 and FIG. 5. More specifically, FIG. 4 illustrates an example of performing error detection encoding after performing error correction encoding, thereby adding a checksum. And, FIG. 5 illustrates an example of omitting the error detection encoding process.

In the present invention, RS encoding is applied as the error correction encoding process, and cyclic redundancy check (CRC) encoding is applied as the error detection encoding process. When performing RS encoding, parity data that are to be used for error correction are generated. And, when performing CRC encoding, CRC data that are to be used for error detection are generated. Other error detection encoding methods may be used instead of CRC encoding for error detection encoding process. Also, an error correction encoding method may be used to enhance the overall error correction performance in the receiving system.

Figure 5:
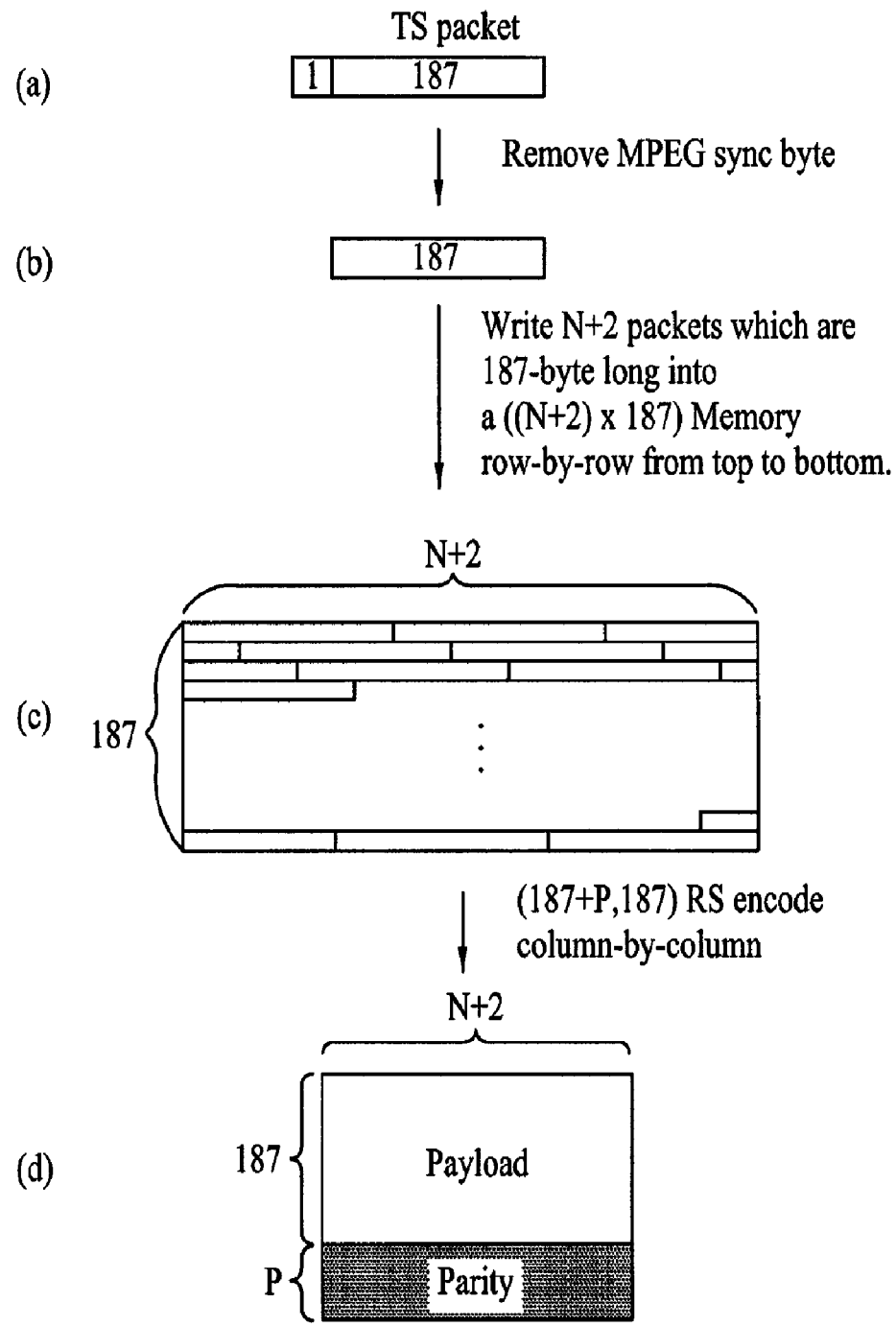
FIG. 5(a) to FIG. 5(d) illustrate examples showing the steps of an error correction coding process according to another embodiment of the present invention.

Referring to FIG. 4 and FIG. 5, the operations of one of the plurality of RS frame encoders (e.g., the first RS frame encoder 102a) will be described in detail. In case of the other RS frame encoders (e.g., the second and third RS frame encoders 102b and 102c), the internal parameters may vary. However, since the basic operations are identical to that of the first RS frame encoder 102a, detailed description of the same will be omitted for simplicity.

FIG. 4(a) to FIG. 4(e) illustrate examples showing the steps of an encoding process performed by the RS frame encoder according to an embodiment of the present invention. More specifically, the RS frame encoder 102a first divides the inputted enhanced data bytes into units of an equal length A.

Herein, the value A will be decided by the system designer. Accordingly, in the example of the present invention given herein, the specific length is equal to 187 bytes. Herein, the 187-byte unit will be referred to as a "packet" for simplicity. For example, if the enhanced data being inputted as shown in FIG. 4(a) correspond to a MPEG transport stream (TS) packet configured of 188-byte units, the first MPEG synchronization byte is removed, as shown in FIG. 4(b), thereby configuring a packet with 187 bytes.

Herein, the MPEG synchronization bytes are removed because each of the enhanced data packets has the same value. Furthermore, the process of removing the MPEG synchronization bytes may be performed while the enhanced data randomizer 101a randomizes the enhanced data. Herein, the RS frame encoder 102a may omit the process of removing the MPEG synchronization bytes. And, in this case, when the receiving system (or receiver) adds the MPEG synchronization bytes to the data, the derandomizer performs the process instead of the RS frame decoder. Therefore, if a fixed byte that can be removed is not included in the inputted enhanced data, or if the length of the inputted packet is not equal to 187 bytes, the enhanced data that are being inputted are divided into 187-byte units, thereby configuring a packet of 187 bytes.

Subsequently, N number of packets configured of 187 bytes is grouped to form a RS frame, as shown in FIG. 4(c). At this point, an RS frame may be configured by serially inserting a 187-byte packet into a RS frame having the size of N(rows)*187(columns). Herein, each column of N number of RS frames includes 187 bytes, as shown in FIG. 4(c). Therefore, in the present invention, a ((187+P),187)-RS encoding process is performed on each column, so as to generate P number of data bytes. Then, the generated P number of data bytes are added to the corresponding column behind the last data byte of the column, thereby creating a column of (187+P) bytes. Also, when the ((187+P),187)-RS encoding process is performed, as shown in FIG. 4(d), on all N number of columns, shown in FIG. 4(c), a RS frame having the size of N(rows)*(187+P) (columns) number of bytes may be created.

As shown in FIG. 4(c) or FIG. 4(d), each row of the RS frame is configured of N number of data bytes. However, depending upon channel conditions between the transmitting system and the receiving system, error may be included in the RS frame. When errors occur as described above, a checksum may be added to each row unit in order to verify whether error exists in each row unit. Herein, for example, CRC data (or CRC code or CRC checksum) may be used as the checksum. The RS frame encoder 102a performs CRC encoding on the enhanced data being RS encoded so as to create (or generate) the checksum (e.g., the CRC checksum). The CRC checksum that is generated by CRC encoding process may be used to indicate whether the enhanced data have been damaged while being transmitted through the channel.

As described above, the present invention may also use different error detection encoding methods other than the CRC encoding method. Alternatively, the present invention may use the error correction encoding method to enhance the overall error correction ability of the receiving system. FIG. 4(e) illustrates an example of using a 2-byte (i.e., 16-bit) CRC checksum as the CRC data. Herein, a 2-byte CRC checksum is generated for N number of bytes of each row, thereby adding the 2-byte CRC checksum at the end of the N number of bytes. Thus, each row is expanded to (N+2) number of bytes. Equation 1 below corresponds to an exemplary equation for generating a 2-byte CRC checksum for each row being configured of N number of bytes.

$$g(x) = x^{16} + x^{12} + x^5 + 1 \qquad \text{Equation 1}$$

The process of adding a 2-byte checksum in each row is only exemplary. Therefore, the present invention is not limited only to the example proposed in the description set forth herein. As described above, when the process of RS encoding and CRC encoding are completed, the (187*N)-byte RS frame is expanded to a ((N+2)*(187+P))-byte RS frame.

Meanwhile, FIG. 5 illustrates another example of a RS frame encoding process of the RS frame encoder 102a, wherein the error detection encoding process is omitted. In the example shown in FIG. 5, the process of creating one packet by grouping A number of enhanced data bytes (e.g., 187 enhanced data bytes) is identical to the process described in FIG. 4. More specifically, when the enhanced data being inputted correspond to a MPEG transport stream (TS) configured in 188-byte units, as shown in FIG. 5(a), a first MPEG synchronization data byte is removed (or deleted) in order to configure a packet formed of 187 data bytes, as shown in FIG. 5(b).

However, since the error detection encoding process is not performed in the example shown in FIG. 5, (N+2) number of packets, each configured of 187 data bytes, as shown in FIG. 5(c), is grouped so as to form one RS frame. At this point, an RS frame may be configured by serially inserting a 187-byte packet into a RS frame having the size of (N+2)(rows)*187 (columns). Herein, each column of (N+2) number of RS frames includes 187 bytes, as shown in FIG. 5(c). Therefore, in the present invention, a ((187+P),187)-RS encoding process is performed on each column, so as to generate P number of data bytes. Then, the generated P number of data bytes are added to the corresponding column behind the last data byte of the column, thereby creating a column of (187+P) bytes. Also, when the ((187+P),187)-RS encoding process is performed, as shown in FIG. 5(d), on all (N+2) number of columns, shown in FIG. 5(c), a RS frame having the size of (N+2)(rows)*(187+P)(columns) number of bytes may be created.

More specifically, the size of the RS frame being processed with error correction encoding and error detection encoding, as shown in FIG. 4, is the same as the size of the RS frame being process with error correction encoding, as shown in FIG. 5. Herein, the value of P may have the same value for each RS frame encoder 102a to 102c. Alternatively, depending upon the type of the encoded enhanced data, the value P may have different values. For example, the value P of the first RS frame encoder 102a may be set to be equal to 48 (i.e., P=48), and the value P of the second RS frame encoder 102b may be set to be equal to 36 (i.e., P=36). If the value P is set to be equal to 48 is the first RS frame encoder 102a, (235, 187)-RS encoding is performed on each column, thereby creating 48 parity data bytes.

Based upon an error correction scenario of a RS frame, the data bytes within the RS frame are transmitted through a channel in a row direction. At this point, when a large number of errors occur during a limited period of transmission time, errors also occur in a row direction within the RS frame being processed with a decoding process in the receiving system. However, in the perspective of RS encoding performed in a column direction, the errors are shown as being scattered. Therefore, error correction may be performed more effectively. At this point, a method of increasing the number of parity data bytes (P) may be used in order to perform a more intense error correction process. However, using this method may lead to a decrease in transmission efficiency. Therefore, a mutually advantageous method is required. Furthermore, when performing the decoding process, an erasure decoding process may be used to enhance the error correction performance.

Figure 6:
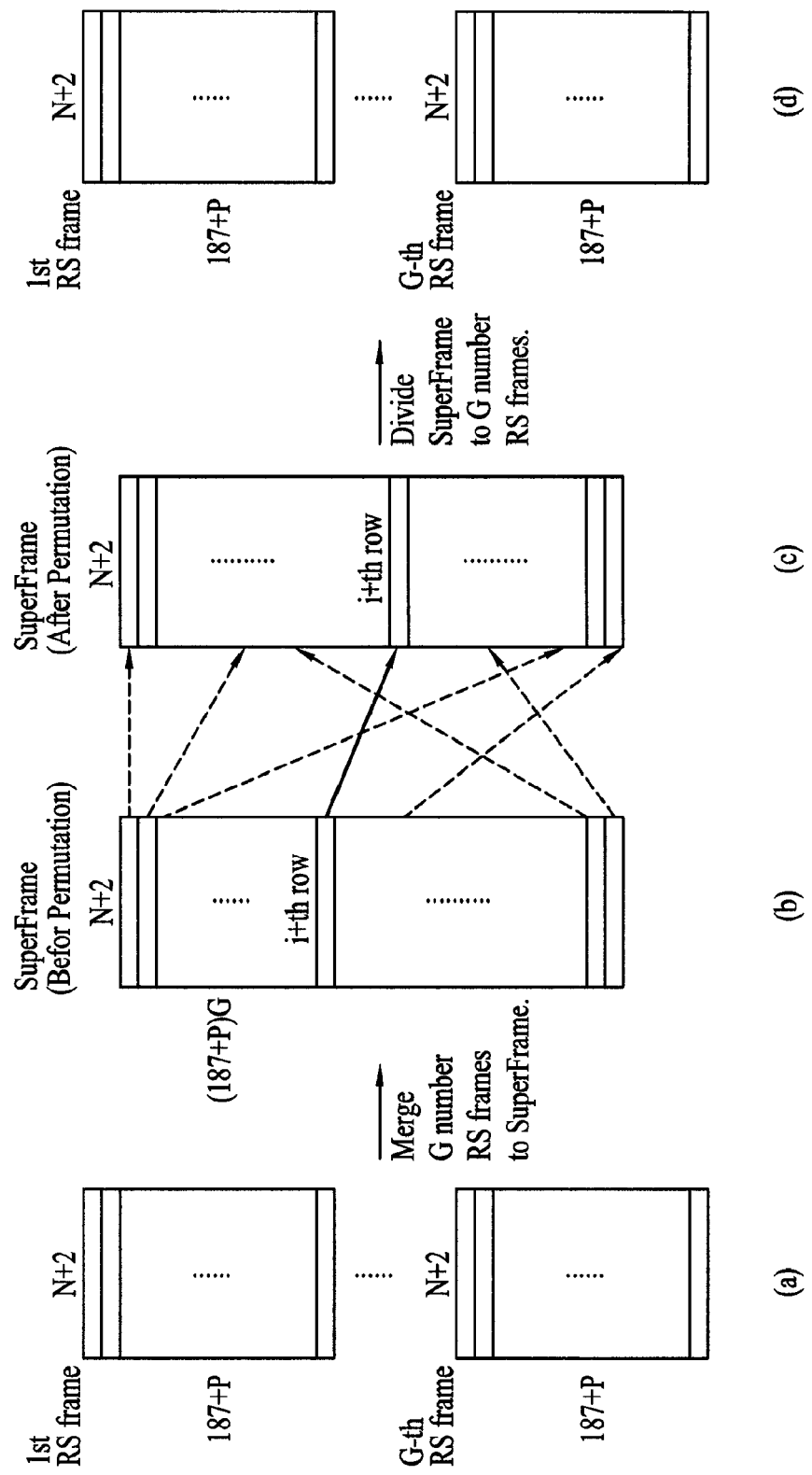
FIG. 6(a) to FIG. 6(d) illustrates an interleaving process in super frame units according to an embodiment of the present invention.

The RS frame encoder according to the present invention also performs an interleaving process in super frame units in order to further enhance the error correction performance when error correction the RS frame. FIG. 6 illustrates an example of performing an interleaving process in super frame units according to the present invention. More specifically, G number of RS frames encoded as shown in FIG. 4 or FIG. 5 is grouped to form a super frame, as shown in FIG. 6(a). At this point, since each RS frame is formed of (N+2)*(187+P) number of bytes, one super frame is configured to have the size of (N+2)*(187+P)*G bytes.

When an interleaving process permuting each column of the super frame configured as described above is performed based upon a pre-determined interleaving rule, the positions of the rows prior to and after being interleaved within the super frame may be altered. More specifically, the $i^{th}$ row of the super frame prior to the interleaving process, as shown in FIG. 6(b), is positioned in the $j^{th}$ row of the same super frame after the interleaving process. The above-described relation between i and j can be easily understood with reference to an interleaving rule as shown in Equation 2 below.

$$j = G(i \bmod (187+P)) + \lfloor i/(187+P) \rfloor$$

$$i = (187+P)(j \bmod G) + \lfloor j/G \rfloor$$

where $0 \leq i, j < (187+P)G - 1$  Equation 2

Herein, each row of the super frame is configured of (N+2) number of data bytes even after being interleaved in super frame units.

When all interleaving process in super frame units are completed, the super frame is once again divided into G number of interleaved RS frames, as shown in FIG. 6(d). Herein, the number of RS parity bytes and the number of columns should be equally provided in each of the RS frames, which configure a super frame. As described in the error correction scenario of a RS frame, in case of the super frame, a section having a large number of error occurring therein is so long that, even when one RS frame that is to be decoded includes an excessive number of errors (i.e., to an extent that the errors cannot be corrected), such errors are scattered throughout the entire super frame. Therefore, in comparison with a single RS frame, the decoding performance of the super frame is more enhanced.

As described above, the enhanced data being encoded on RS frame units and interleaved in super frame units by each of the RS frame encoders 102a to 102c are outputted to the RS frame multiplexer 103. The RS frame multiplexer 103 multiplexes the enhanced data being respectively outputted from the first to third RS frame encoders 102a to 102c in RS frame units. Then, the multiplexed enhanced data are outputted to the block processor 104. The block processor 104 encodes the encoded and interleaved enhanced data at a coding rate of G/H. Afterwards, the G/H-rate encoded enhanced data are outputted to the group formatter 105. More specifically, the block processor 104 divides the enhanced data, which are being inputted, into byte units. Then, G number of bits is encoded to H number of bits. Thereafter, the encoded bits are converted back to byte units and then outputted. For example, if 1 bit of the input data is coded to 2 bits and outputted, then G is equal to 1 and H is equal to 2 (i.e., G=1 and H=2). Alternatively, if 1 bit of the input data is coded to 4 bits and outputted, then G is equal to 1 and H is equal to 4 (i.e., G=1 and H=4). Hereinafter, the former coding rate will be referred to as a coding rate of ½ (½-rate coding), and the latter coding rate will be referred to as a coding rate of ¼ (¼-rate coding), for simplicity.

Herein, when using the ¼ coding rate, the coding efficiency is greater than when using the ½ coding rate, and may, therefore, provide greater and enhanced error correction ability. For such reason, when it is assumed that the data encoded at a ¼ coding rate in the group formatter 105, which is located near the end portion of the system, are allocated to an area in which the receiving performance may be deteriorated, and that the data encoded at a ½ coding rate are allocated to an area having excellent receiving performance, the difference in performance may be reduced. At this point, the block processor 104 may also receive supplemental information data, such as signaling information including system information. Herein, such supplemental information data may also be processed with either ½-rate coding or ¼-rate coding as in the step of processing enhanced data. Thereafter, the signaling information is also considered as being the same as the enhanced data and processed accordingly.

More specifically, the supplemental information data may be inputted to the block processor 104 by passing through the randomizer and the RS frame encoder. Alternatively, the supplemental information data may also be directly outputted to the block processor 104 bypassing the randomizer and the RS frame encoder. Herein, the signaling information corresponds to information required by the receiving system (or receiver) to receive and process data included in the data group. Such required information may include data group information, multiplexing information, and burst information. The signaling information will be described in more detail in a later process.

Meanwhile, the group formatter 105 inserts the enhanced data being outputted from the block processor 104 into a corresponding region within a data group being formed in accordance with a pre-defined rule. (Herein, the enhanced data may include supplemental information such as signaling data having transmission information included therein.) Additionally, with respect to the data deinterleaving process, various data place holders or known data sets are also inserted in corresponding regions within the data group. At this point, the data group may be divided into one or more hierarchical regions. Herein, different data types may be allocated to different regions in accordance with the characteristic of each hierarchically divided region.

Figure 7:
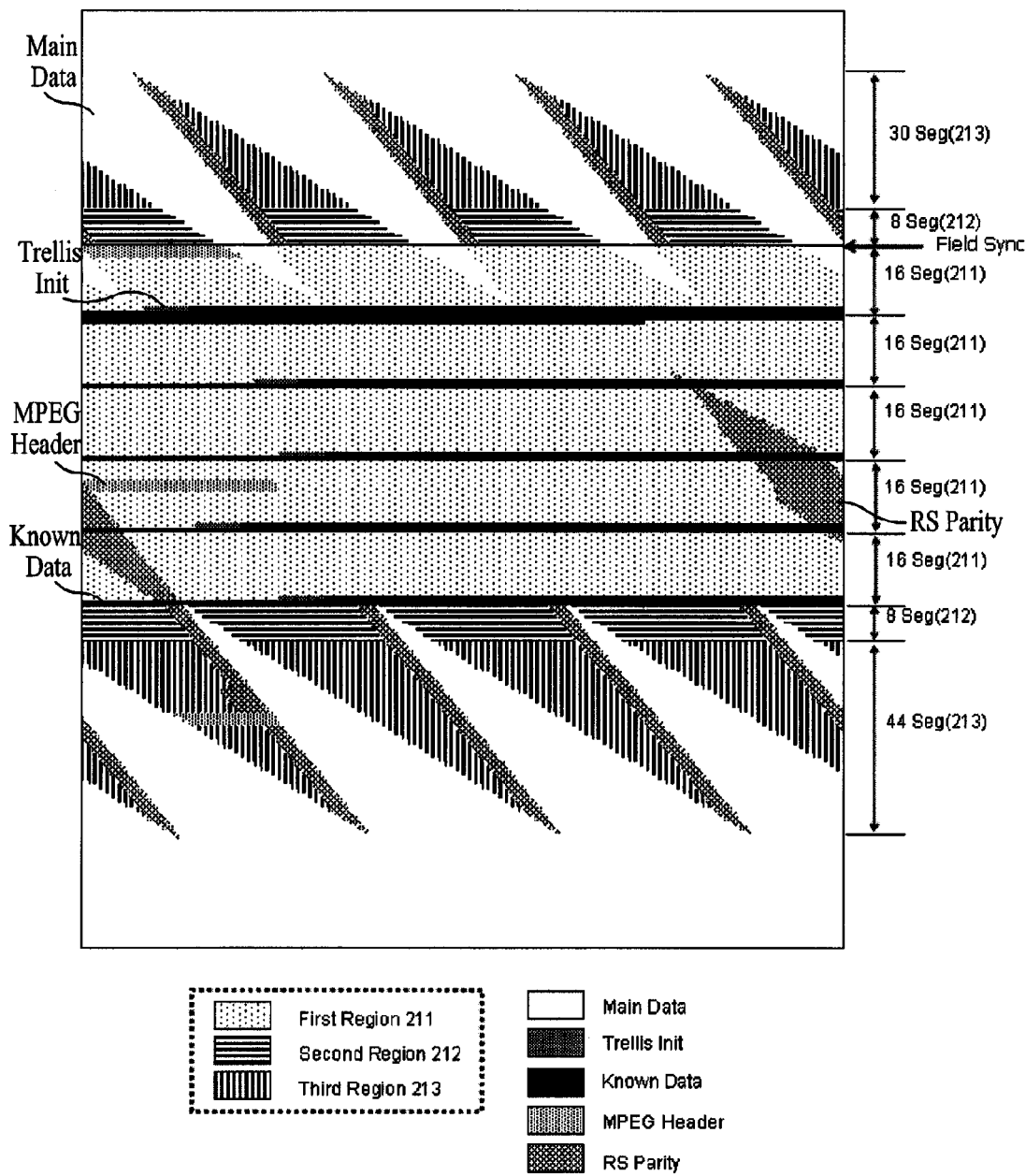
FIG. 7 and FIG. 8 respectively illustrate a data configuration before and after a data deinterleaver with the transmitting system according to the present invention.
Figure 8:
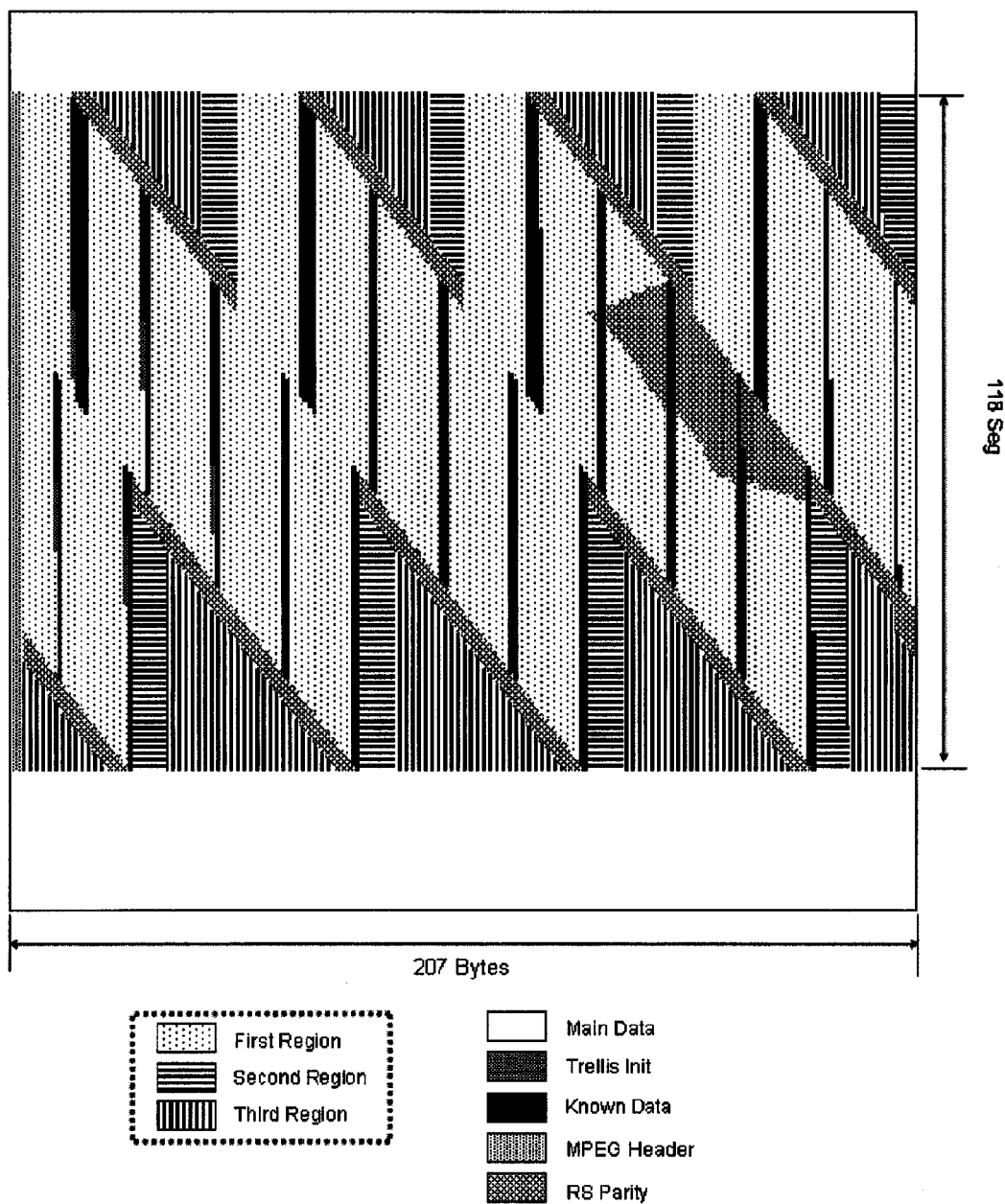

FIG. 7 illustrates an alignment of data prior to being data-deinterleaved. FIG. 8 illustrates an alignment of data after being data-deinterleaved. In other words, FIG. 7 illustrates a configuration of data that are interleaved, and FIG. 8 illustrates a configuration of data that are not yet interleaved. More specifically, FIG. 7 illustrates an example of a data group corresponding to the data configuration prior to being data-deinterleaved being broadly divided into three regions. Herein, each of the three regions will be respectively referred to as a first region, a second region, and a third region for simplicity. The first to third regions are divided into regions with similar receiving performance within the data group. Herein, depending upon the characteristic of each region, the type of enhanced data being inputted to each region may differ.

An example of dividing the data configuration into first to third regions based upon a degree of interference of the main data will now be described in detail. Herein, the data group is divided into a plurality of different regions so that each region can be used for different purposes. More specifically, a region having less or no interference from the main data may provide a more enhanced (or powerful) receiving performance as compared to a region having relatively more interference from the main data. Furthermore, when using a system inserting and transmitting known data into the data group, and when a long known data sequence is to be consecutively inserted into the enhanced data, a known data sequence having a predetermined length may be consecutively inserted into a region with no interference from the main data (e.g., the first region). Conversely, in case of the regions having interference from the main data, it is difficult to consecutively insert long known data sequences into the corresponding regions due to the interference from the main data. In the description of the present invention, the size of the data group, the number of hierarchically divided regions within the data group, the size of each hierarchically divided region, the number of enhanced data bytes that nay be inserted into each of the hierarchically divided regions correspond to an exemplary embodiment of the present invention.

At this point, the group formatter 105 configures the data group so that the data group includes places (or positions) in which field synchronization signals are to be inserted. Therefore, the data group may be configured as described below. More specifically, the first region 211 corresponds to a region in which a long known data sequence may be consecutively inserted into the data group. Herein, the first region 211 includes a region that is not mixed with main data. Additionally, the first region 211 also includes a region located between a field synchronization region that is to be inserted in the data group and a region in which the first known data sequence is to be inserted. Herein, the field synchronization region has the length of one segment (i.e., 832 symbols). As described above, if the first region 211 corresponds to a region having a known data sequence included in both end portions, the receiving system uses the channel information that may be obtained from the known data or the field synchronization region in order to perform equalization, thereby providing a powerful equalization performance.

The second region 212 includes a region located within the first 8 segments of the field synchronization region within the data group (i.e., a region chronologically located before the first region 211), and a region located within 8 segments after the last known data sequence inserted into the data group (i.e., a region chronologically located after the first region 211). In case of the second region 212, the receiving system may use the channel information that is obtained from the field synchronization region in order to perform equalization. Alternatively, the receiving system may use the channel information that may be obtained from the last known data sequence in order to perform equalization, thereby responding to the change in channel.

The third region 213 includes a region including the $9^{th}$ segment from the beginning of the field synchronization region to within 30 upper (or earlier) segments (i.e., a region chronologically located before the first region 211), and a region including the $9^{th}$ segment after the last known data sequence within the data group to with 44 segments below (or later) (i.e., a region chronologically located after the first region 211). At this point, since the third region 213 located earlier than the first region 211 is located further apart from the field synchronization region, which corresponds to the closest known data section, the third region 213 may use the channel information that is obtained from the field synchronization region so that the receiving system may perform the channel equalization process. Alternatively, the third region 213 may also use the most recent channel information of a previous data group. Furthermore, the third region 213 that is chronologically located later than the first region 211 may use the channel information obtained from the last known data sequence so that the receiving system may perform the channel equalization process. However, in this case, when the channel changes at a fast rate, the equalization may not be performed perfectly. Therefore, the equalization performance of the third region 213 may be more deteriorated that the equalization performance of the second region 212.

Assuming that the data group is allocated to a plurality of hierarchically divided regions, as described above, the enhanced data that are to be inserted into each respective region may be encoded at different coding rates based upon the characteristic of each hierarchically divided region. Furthermore, the actual amount of enhanced data that are transmitted may differ (or vary) depending upon the coding rate of each enhanced data set that is to be inserted into each respective region. Therefore, an example of identifying the amount of enhanced data being transmitted by a corresponding code mode will now be described in detail. Table 1 below shows an example of the number of enhanced data bytes that can actually be transmitted from each of the first to third regions 211 to 213. Herein, the enhanced data bytes that can actually be transmitted correspond to the enhanced data bytes that are not yet encoded at the coding rate of G/H by the block processor 104. Also, in Table 1 below, the numbers marked with a star (*) respectively correspond to the number of data bytes separately allocated for transmitting signaling information in the corresponding region. Furthermore, trellis initialization data or known data, MPEG headers, and RS parity data are excluded from the enhanced data.

TABLE 1

| | Coding rate of the block processor | |
|---|---|---|
| Region | 1/2 coding rate | 1/4 coding rate |
| First region | 6480(+36)* | 3240(+18)* |
| Second region | 1140 | 570 |
| Third region | 2074 | 1037 |

The number of data bytes indicated in Table 1 will be described in more detail in a later process. An example of code modes for encoding and transmitting the enhanced data in accordance with such coding rate combination are shown in Table 2 below.

TABLE 2

| | Coding rate of the block processor | | |
|---|---|---|---|
| Code Mode | First region | Second region | Third region |
| 1 | 1/2 | 1/2 | 1/2 |
| 2 | 1/2 | 1/2 | 1/4 |
| 3 | 1/2 | 1/4 | 1/2 |
| 4 | 1/2 | 1/4 | 1/4 |
| 5 | 1/4 | 1/2 | 1/2 |
| 6 | 1/4 | 1/2 | 1/4 |
| 7 | 1/4 | 1/4 | 1/2 |
| 8 | 1/4 | 1/4 | 1/4 |

Table 3 below shows examples of different combination modes of the regions and numbers of available service channels that may be independently transmitted in the corresponding combination mode.

TABLE 3

| Combination Mode | Combination | Available Service Channels |
|---|---|---|
| 1 | $1^{st}$ region, $2^{nd}$ region, $3^{rd}$ region | 3 |
| 2 | $1^{st}$ region + $2^{nd}$ region, $3^{rd}$ region | 2 |
| 3 | $1^{st}$ region + $3^{rd}$ region, $2^{nd}$ region | 2 |
| 4 | $2^{nd}$ region + $3^{rd}$ region, $1^{st}$ region | 2 |
| 5 | $1^{st}$ region + $2^{nd}$ region + $3^{rd}$ region | 1 |

Table 3 shows an example of the number of possible combination modes, when a data group is divided into first to third regions. Herein, the amount of enhanced data that can be allocated to each region may vary depending upon a code mode to which the corresponding combination mode is applied. Further, the number of possible combination modes may vary depending upon the number of divided regions of the data group. More specifically, as shown in Table 3, when the code mode is '1', first to third enhanced data (enhanced data 1 to enhanced data 3) each having different service types are received and, then, processed with randomizing and RS encoding. Thereafter, each enhanced data set is encoded at the corresponding coding rate, allocated to each corresponding region, and then transmitted. At this point, since different enhanced data types are respectively allocated to each corresponding region, the enhanced data set that is to be inserted into each region may be encoded by the block processor 104 at an independent coding rate.

Additionally, as shown in Table 3, when the code mode is '2', first and second enhanced data (enhanced data 1 and enhanced data 2) each having different service types are received and, then, processed with randomizing and RS encoding. Subsequently, the enhanced data that are to be inserted into the first and second regions are encoded at a first coding rate. And, the enhanced data that are to be inserted into the third region are encoded at a second coding rate. Thereafter, each of the encoded enhanced data sets is allocated to the corresponding region and, then, transmitted. Herein, the first and second coding rates may be identical to or different from one another. In the embodiment of the present invention, the coding rate corresponds to one of a 1/2 coding rate and a 1/4 coding rate.

Table 4 below shows an example of the combination mode 2, wherein the data group is divided into first region+second region, and third region. Herein, Table 4 shows the number of enhanced data bytes that can be inserted into the corresponding region depending upon each code mode, when the number of data bytes that can be inserted in each area depending upon the corresponding coding rate is the same as the number of data bytes shown in Table 1.

TABLE 4

| | Coding rate of the block processor | | | Combination Mode 2 | |
|---|---|---|---|---|---|
| Code Mode | First region | Second region | Third region | First region + Second region | Third region |
| 1 | 1/2 | 1/2 | 1/2 | 7620 | 2074 |
| 2 | 1/2 | 1/2 | 1/4 | 7620 | 1037 |
| 3 | 1/2 | 1/4 | 1/2 | 7050 | 2074 |
| 4 | 1/2 | 1/4 | 1/4 | 7050 | 1037 |
| 5 | 1/4 | 1/2 | 1/2 | 4380 | 2074 |
| 6 | 1/4 | 1/2 | 1/4 | 4380 | 1037 |
| 7 | 1/4 | 1/4 | 1/2 | 3810 | 2074 |
| 8 | 1/4 | 1/4 | 1/4 | 3810 | 1037 |

For example, in case of Combination 2 and Code mode 1, the number of enhanced data bytes that can be inserted in the first region+second region is equal to 7620 bytes, and the data bytes are encoded at the coding rate of ½. Also, the number of enhanced data bytes that can be inserted in the third region is equal to 2074, wherein the data bytes are also encoded at the coding rate of ½. Furthermore, in case of Combination 2 and Code mode 3, the number of enhanced data bytes that can be inserted in the first region+second region is equal to 7050 bytes. Herein, the data bytes corresponding to the first region are encoded at the coding rate of ½, and the data bytes corresponding to the second region are encoded at the coding rate of ¼. Also, the number of enhanced data bytes that can be inserted in the third region is equal to 2074, wherein the data bytes are encoded at the coding rate of ½.

Meanwhile, apart from the enhanced data encoded and outputted from the block processor 104, the group formatter 105 also inserts the MPEG header place holders, non-systematic RS parity place holders, and main data place holders with respect to data deinterleaving in a later process, as shown in FIG. 7. Herein, the main data place holders are inserted because of a region in which enhanced data are mixed with main data, based upon the input of the data deinterleaver shown in FIG. 7. For example, a data place holder for the MPEG header is allocated to the very beginning of each packet with respect to the output data that have been processed with data deinterleaving. Furthermore, the group formatter 105 inserts known data generated in accordance with a pre-decided method or inserts known data place holders for inserting known data in a later process. The group formatter 105 also inserts place holders for the initialization of the trellis encoding module (shown in FIG. 3) in the corresponding regions. For example, the initialization data place holder may be inserted at the beginning of the known data sequence.

The output of the group formatter 105 is inputted to the data deinterleaver 106. The data deinterleaver 106 deinterleaves the data and data place holders within the data group being outputted as an inverse process of the data interleaving process. Thereafter, the data deinterleaver 106 outputs the deinterelaved data and data place holders to the packet formatter 107. More specifically, when the data and data place holders of the data group, which is configured as shown in FIG. 7, are deinterleaved by the data deinterleaver 106, the data group being outputted to the packet formatter 107 is configured to have the same structure as that shown in FIG. 8.

The packet formatter 107 removes the main data place holders and the RS parity place holders that were allocated for the deinterleaving process from the deinterleaved data being inputted. Then, the packet formatter 107 groups the remaining portion and inserts a MPEG header in the 4-byte MPEG header place holder. Also, when the group formatter 105 inserts known data place holders, the packet formatter 107 may insert actual known data in the known data place holders, or may directly output the known data place holders without any modification in order to make replacement insertion in a later process. Thereafter, the packet formatter 107 identifies the data within the packet-formatted data group, as described above, as a 188-byte unit enhanced data packet (i.e., MPEG TS packet), which is then provided to the packet multiplexer 121. The process of pre-processing the enhanced data has been described with reference to the pre-processor 100 having the structure shown in FIG. 1.

FIG. 2 illustrates a pre-processor according to another embodiment of the present invention. Herein, the pre-processor includes the same number of randomizers and RS frame encoders, wherein the number corresponds to the type (or number of sets) of enhanced data that are to be independently processed with separate encoding processes. Such characteristics are identical to those of the pre-processor according to the first embodiment of the present invention shown in FIG. 1. On the other hand, the difference is that the randomizer for randomizing the enhanced data is positioned (or located) at the outputting end of the RS frame multiplexer in order to perform the randomizing process in disregard of the enhanced data type.

More specifically, the pre-processor 111 shown in FIG. 2 sequentially includes first to third RS frame encoders 111a to 111c, a RS frame multiplexer 112, an enhanced data randomizer 113, a block processor 114, a group formatter 115, a data deinterleaver 116, and a packet formatter 117. In the present invention having the above-described structure shown in FIG. 2, first to third enhanced data sets are respectively inputted to the first to third RS frame encoders 111a to 111c through each corresponding paths. Each of the first to third RS frame encoders 111a to 111c groups a plurality of enhanced data bytes that are being inputted, thereby creating a RS frame, respectively. Then, each RS frame encoder performs an error correction encoding in RS frame units. At this point, an error detection encoding process may or may not be performed. Thus, by providing robustness to the enhanced data, the corresponding data may respond to the severely vulnerable and frequently changing frequency environment.

Also, each of the first to third RS frame encoders 111a to 111c may group a plurality of RS frames to create a super frame so as to perform interleaving or permutation in super frame units. Thus, by providing robustness to the enhanced data, a group error that may occur due to a change in the frequency environment may be scattered, thereby enabling the corresponding data to respond to the severely vulnerable and frequently changing frequency environment. The structure and operations of the first to third RS frame encoders 111a to 111c are identical to those described in FIG. 1, FIG. 4, and FIG. 5. Therefore, detailed description of the same will be omitted for simplicity.

The enhanced data being processed with encoding processes in RS frame units and interleaving processes in super frame units by the first to third RS frame encoders 111a to 111c are then outputted to the RS frame multiplexer 112. The RS frame multiplexer 112 multiplexes the enhanced data being outputted from the first to third RS frame encoders 111a to 111c in RS frame units. Thereafter, the RS frame multiplexer 112 outputs the multiplexed enhanced data to the enhanced data randomizer 113. The enhanced data randomizer 113 randomizes the enhanced data that are outputted from the RS frame multiplexer 112 and, then, outputs the randomized enhanced data to the block processor 114. The operations of the blocks positioned (or located) after the enhanced data randomizer 113, i.e., the block processor 114, the group formatter 115, the data deinterleaver 116, and the packet formatter 117, are identical to those described in FIG. 1. Therefore, detailed descriptions of the same will be omitted for simplicity.

Figure 3:
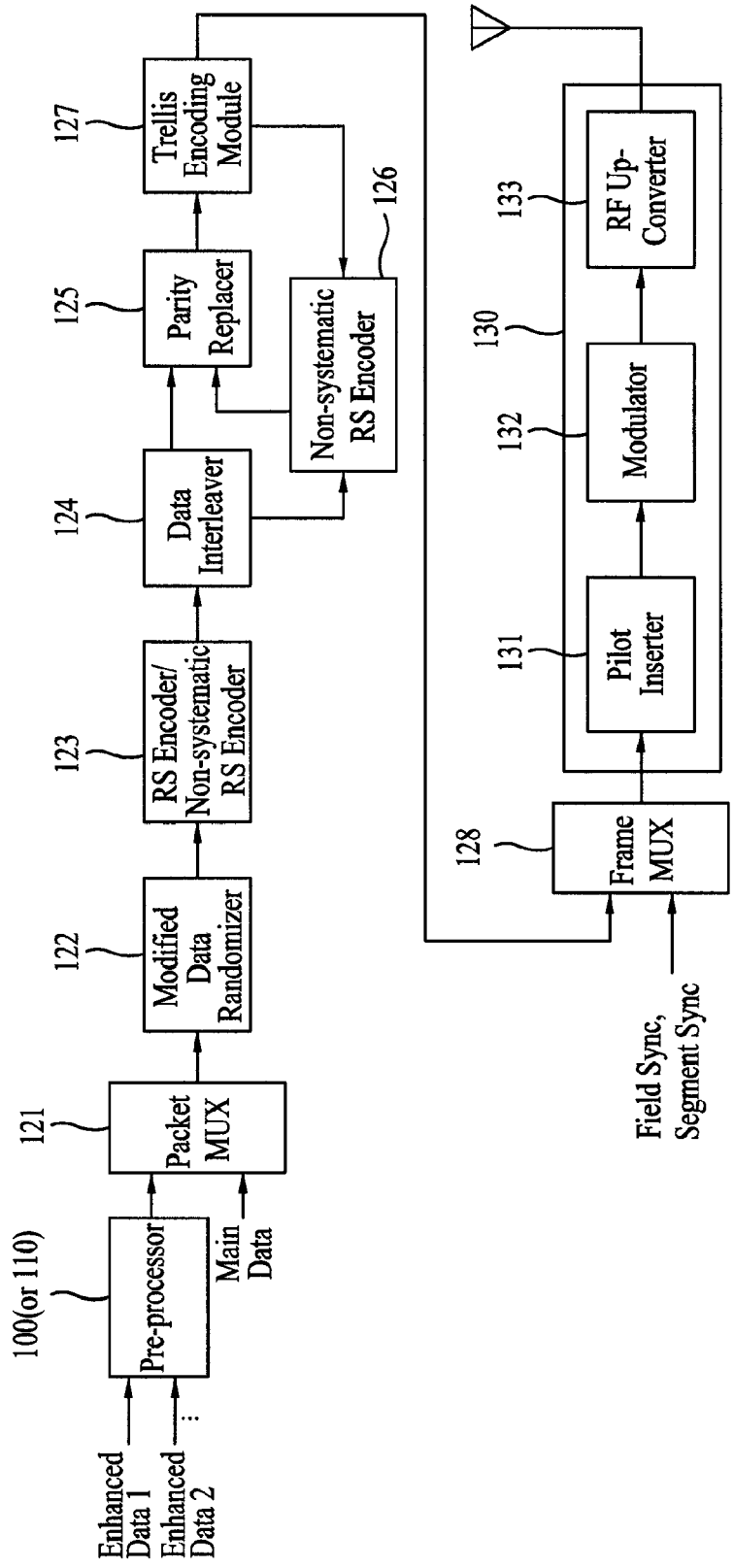
FIG. 3 illustrates a block diagram of a transmitting system according to an embodiment of the present invention.

FIG. 3 illustrates a block diagram of a transmitting system (or transmitter) including the pre-processors of FIG. 1 or FIG. 2 according to the present invention. Referring to FIG. 3, the transmitting system includes a pre-processor 100 or 110, a packet multiplexer 121, a data randomizer 122, a RS encoder/non-systematic RS encoder 123, a data interleaver 124, a parity replacer 125, a non-systematic RS encoder 126, a trellis encoding module 127, a frame multiplexer 128, and a transmitting unit 130. The enhanced data packet pre-processed by the pre-processor 100 or 110 is inputted to the packet multiplexer 121. The packet multiplexer 121 multiplexes the 188-byte unit enhanced data packet and main data packet outputted from the pre-processor 100 or 110 in accordance with a pre-defined multiplexing method. Then, the packet multiplexer 121 outputs the multiplexed enhanced data packet. Herein, the multiplexing method may be adjusted in accordance with a plurality of variables related with the system design.

One of the multiplexing methods of the packet multiplexer 121 may correspond to identifying enhanced data burst sections and main data sections along a time axis and alternately repeating the two sections. At this point, the enhanced data burst section may transmit at least one data group, and the main data section may only transmit main data. The enhanced data burst section may also transmit the main data. When the enhanced data are transmitted in a burst structure, as described above, a digital broadcast receiving system (or receiver) receiving only the enhanced data may turn on the power only during the burst section so as to receive the data. And, during the main data section to which only main data are transmitted, the digital broadcast receiving system may turn the power off so that the main data are not received, thereby reducing power consumption of the receiving system.

When the data being inputted correspond to the main data packet, the data randomizer 122 performs the same randomizing process of the conventional randomizer. More specifically, the MPEG synchronization byte included in the main data packet is discarded and a pseudo random byte generated from the remaining 187 bytes is used so as to randomize the data. Thereafter, the randomized data are outputted to the RS encoder/non-systematic RS encoder 123. However, when the inputted data correspond to the enhanced data packet, the MPEG synchronization byte of the 4-byte MPEG header included in the enhanced data packet is discarded, and data randomizing is performed only on the remaining 3-byte MPEG header. Randomizing is not performed on the remaining portion of the enhanced data. Instead, the remaining portion of the enhanced data is outputted to the RS encoder/non-systematic RS encoder 123. This is because the randomizing process has already been performed on the enhanced data by the randomizer of the pre-processor 100 or 110 in an earlier process. Herein, a data randomizing process may or may not be performed on the known data (or known data place holder) and the initialization data place holder included in the enhanced data packet.

The RS encoder/non-systematic RS encoder 123 RS-codes the data randomized by the data randomizer 122 or the data bypassing the data randomizer 122. Then, the RS encoder/non-systematic RS encoder 123 adds a 20-byte RS parity to the coded data, thereby outputting the RS-parity-added data to the data interleaver 124. At this point, if the inputted data correspond to the main data packet, the RS encoder/non-systematic RS encoder 123 performs a systematic RS-coding process identical to that of the conventional broadcasting system on the inputted data, thereby adding the 20-byte RS parity at the end of the 187-byte data. Alternatively, if the inputted data correspond to the enhanced data packet, the 20 bytes of RS parity gained by performing the non-systematic RS-coding are respectively inserted in the decided parity byte places within the enhanced data packet. Herein, the data interleaver 124 corresponds to a byte unit convolutional interleaver. The output of the data interleaver 124 is inputted to the parity byte replacer 125 and the non-systematic RS encoder 126.

Meanwhile, a memory within the trellis encoding module 127, which is positioned after the parity byte replacer 125, should first be initialized in order to allow the output data of the trellis encoding module 127 so as to become the known data defined based upon an agreement between the receiving system and the transmitting system. More specifically, the memory of the trellis encoding module 127 should first be initialized before the known data sequence being inputted is trellis-encoded. At this point, the beginning of the known data sequence that is inputted corresponds to the initialization data place holder inserted by the group formatter of the pre-processor 100 or 110 and not the actual known data. Therefore, a process of generating initialization data immediately before the trellis-encoding of the known data sequence being inputted and a process of replacing the initialization data place holder of the corresponding trellis encoding module memory with the newly generated initialization data are required.

A value of the trellis memory initialization data is decided based upon the memory status of the trellis encoding module 127, thereby generating the trellis memory initialization data accordingly. Due to the influence of the replace initialization data, a process of recalculating the RS parity, thereby replacing the RS parity outputted from the trellis encoding module 127 with the newly calculated RS parity is required. Accordingly, the non-systematic RS encoder 126 receives the enhanced data packet including the initialization data place holder that is to be replaced with the initialization data from the data interleaver 124 and also receives the initialization data from the trellis encoding module 127. Thereafter, among the received enhanced data packet, the initialization data place holder is replaced with the initialization data. Subsequently, the RS parity data added to the enhanced data packet are removed. Then, a new non-systematic RS parity is calculated and outputted to the parity byte replacer 125. Accordingly, the parity byte replacer 125 selects the output of the data interleaver 124 as the data within the enhanced data packet, and selects the output of the non-systematic RS encoder 126 as the RS parity. Thereafter, the parity byte replacer 125 outputs the selected data.

Meanwhile, if the main data packet is inputted, or if the enhanced data packet that does not include the initialization data place holder that is to be replaced, the parity byte replacer 125 selects the data and RS parity outputted from the data interleaver 124 and directly outputs the selected data to the trellis encoding module 127 without modification. The trellis encoding module 127 converts the byte-unit data to symbol-unit data and 12-way interleaves and trellis-encodes the converted data, which are then outputted to the frame multiplexer 128. The frame multiplexer 128 inserts field synchronization and segment synchronization signals in the output of the trellis encoding module 127 and then outputs the processed data to the transmitting unit 130. Herein, the transmitting unit 130 includes a pilot inserter 131, a modulator 132, and a radio frequency (RF) up-converter 133. The operation of the transmitting unit 130 is identical to the conventional transmitters. Therefore, a detailed description of the same will be omitted for simplicity.

Detailed Embodiment

Hereinafter, detailed embodiments of the pre-processor 100 or 110 and the packet multiplexer 121 will now be described. According to an embodiment of the present invention, the N value corresponding to the length of a row, which is included in the RS frame that is configured by the RS frame encoder, is set to be equal to 538. Accordingly, when the structure of FIG. 4 is applied, the RS frame encoder receives 538 transport stream (TS) packets so as to configure a RS frame having the size of 538*187 bytes. Alternatively, when the structure of FIG. 5 is applied, the RS frame encoder receives 540 transport stream (TS) packets so as to configure a RS frame having the size of 540*187 bytes.

More specifically, in case of FIG. 4, the RS frame is processed with a (235,187)-RS encoding process so as to configure another RS frame having the size of 538*235 bytes. The RS frame is then processed with generating a 16-bit checksum so as to be expanded to a RS frame having the size of 540*235. Alternatively, in case of FIG. 5, the RS frame having the size of 540*187 is processed with a (235,187)-RS encoding process so as to be expanded to a RS frame having the size of 540*235.

Meanwhile, referring to Table 2 and Table 3, it is assumed that the enhanced data are encoded, grouped, and transmitted in accordance with the code mode 3 and the combination mode 2. Referring to Table 2, in case of the code mode 3, the first region and the third region are encoded at the ½ coding rate, and the second region is encoded at the ¼ coding rate. Also, referring to Table 3, in case of the combination mode 2, the data group is divided into the first region+second region, and a third region. Herein, the enhanced data being inserted in the first region+second region correspond to the same service type. Alternatively, the enhanced data being inserted in the third region correspond to a different service type. These examples are merely exemplary and do not limit the scope of the present invention.

In the above described example, referring to Table 1 to Table 4, 7050 bytes are transmitted to the first region+second region, and 2074 bytes are transmitted to the third region. At this point, it is assumed that one super frame is configured of 2 RS frame, and that 18 data groups are grouped to form a RS frame. Herein, when it is also assumed that the enhanced data of the 2 RS frames configuring the super frame are inserted into the first region+second region, the super frame is configured of 253800 bytes, and the RS frame is configured of 126900 bytes. Herein, the number of RS parity bytes P is set to be equal to 48 (i.e., P=48), and 2 CRC checksums are set to be included for each row. Accordingly, in one super frame, a total of 1076 188-byte enhanced data packets may be transmitted. This indicates that 538 enhanced data packets may be transmitted for one RS frame.

Similarly, 2074 bytes are transmitted to the third region. At this point, when it is assumed that 18 data groups are grouped to form a RS frame, and that the enhanced data of the RS frame are inserted into the third region, the RS frame is configured of 37332 bytes. Herein, the number of RS parity bytes P is set to be equal to 36 (i.e., P=36), and 2 CRC checksums are set to be included for each row. Accordingly, when one super frame is configured of 2 RS frames, a total of 330 188-byte enhanced data packets may be transmitted for each super frame. In this case, 91 bytes may remain for each RS frame of the third region within the data group. Remaining data bytes may occur, when dividing each RS frame into a plurality of data groups having the same size. More specifically, remaining data bytes may occur in particular regions in each RS frame depending upon the size of the RS frames, the size and number of divided data groups, the number of enhanced data bytes that may be inserted into each data group, the coding rate of the corresponding region, the number of RS parity bytes, whether or not a CRC checksum has been allocated, and, if any, the number of CRC checksums allocated.

Figure 9:
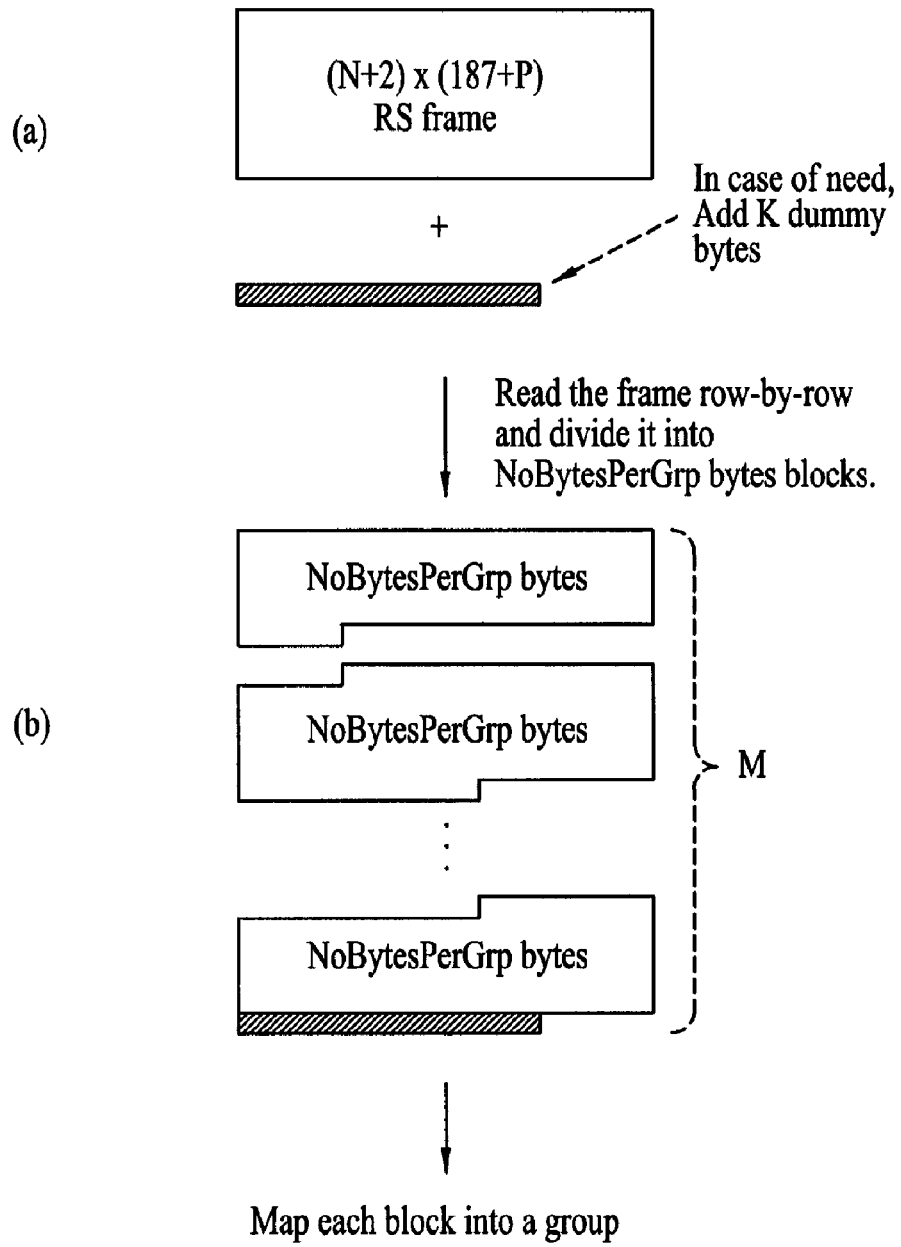
FIG. 9(a) and FIG. 9(b) each illustrates an exemplary process of dividing a RS frame in order to configure a data group according to an embodiment of the present invention.

When dividing the RS frame into a plurality of data groups having the same size, and when remaining data bytes occur in the corresponding RS frame, K number of dummy bytes are added to the corresponding RS frame, wherein K is equal to the number of remaining data bytes within the RS frame. Then, the dummy byte-added RS frame is divided into a plurality of data groups. This process is illustrated in FIG. 9. More specifically, FIG. 9 illustrates an example of processing K number of remaining data bytes, which are produced by dividing the RS frame having the size of (N+2)*(187+P) bytes into M number of data groups having equal sizes. In this case, as shown in FIG. 9(a), K number of dummy bytes are added to the RS frame having the size of (N+2)*(187+P) bytes. Subsequently, the RS frame is read in row units, thereby being divided into M number of data groups, as shown in FIG. 9(b). At this point, each data group has the size of NoBytesPerGrp bytes.

This may be described by Equation 3 shown below.

$$M \times \text{NoBytesPerGrp} = (N+2) \times (187+P) \times K \quad \text{Equation 3}$$

Herein, NoBytesPerGrp indicates the number of bytes allocated for each group (i.e., the Number of Bytes Per Group). More specifically, the size corresponding to the number of byte in one RS frame+K bytes is equal to the size of the M number of data groups.

When transmitting the enhanced data by using the above-described method and mode, the pre-processors shown in FIG. 1 and FIG. 2 may receive 1076 packets through a first enhanced data path and 330 packets through a second enhanced data path. Referring to FIG. 1, the 1076 packets inputted through the first enhanced data path and the 330 packets inputted through the second enhanced data path are respectively randomized by the first and second enhanced data randomizers 101a and 101b. Thereafter, an encoding process in RS frame units and an interleaving process in super frame units are each performed on the randomized data packets by the first and second RS frame encoders 102a and 102b. Subsequently, the processed packets are divided into RS frame units, thereby inputted to the block processor 104 through the RS frame multiplexer 103.

In the embodiment of the present invention, 48 parity bytes are added in a column direction for each corresponding RS frame by the first RS frame encoder 102a, and 2 CRC checksums are added to the corresponding RS frame in a row direction. Also, 36 parity bytes are added in a column direction for each corresponding RS frame by the second RS frame encoder 102b, and 2 CRC checksums are added to the corresponding RS frame in a row direction. Thereafter, the block processor 104 receives the enhanced data that are divided into byte units allocated to one data group, which are then encoded and interleaved. At this point, as described above, 91 data bytes remain for each RS frame in the third region within the data group. Therefore, when all data bytes that are to be allocated to the third region are inputted, 91 dummy bytes are also added (or inputted) to the third region. Herein, the dummy bytes may be added by the block processor 104 or inputted by an external block (not shown).

The block processor 104 encoded each of the data bytes at a ½ coding rate or a ¼ coding rate based upon the region to which the data bytes are to be allocated. Afterwards, the block processor 104 outputs the encoded data bytes to the group formatter 105. For example, the first enhanced data that are to be inserted into the first region are encoded at a ½ coding rate, the first enhanced data that are to be inserted into the second region are encoded at a ¼ coding rate, and the second enhanced data that are to be inserted into the third region are encoded at a ½ coding rate. The group formatter 105 receives the encoded enhanced data and other types of data (e.g., MPEG header place holders, non-systematic RS parity place holders, main data place holders, known data or known data place holders, initialization data place holders, etc.) and inserts (or allocates) the received data to the corresponding region within the data group shown in FIG. 7. More specifically, the ½-rate encoded first enhanced data and the ¼-rate encoded first enhanced data are inserted into the first region+ second region, and the ½-rate encoded second enhanced data are inserted to the third region.

The data bytes within the data group configured as shown in FIG. 7 are deinterleaved by the data deinterleaver 106 and converted as shown in FIG. 8. Subsequently, the converted data are converted to 187-byte enhanced data packets (i.e., MPEG-2 transport packets) by the packet formatter 107, which are then outputted to the packet multiplexer 121. The packet multiplexer 121 multiplexes the packet including the enhanced data and the packet including the main data into burst units, which are then outputted to the randomizer 122.

Figure 10:
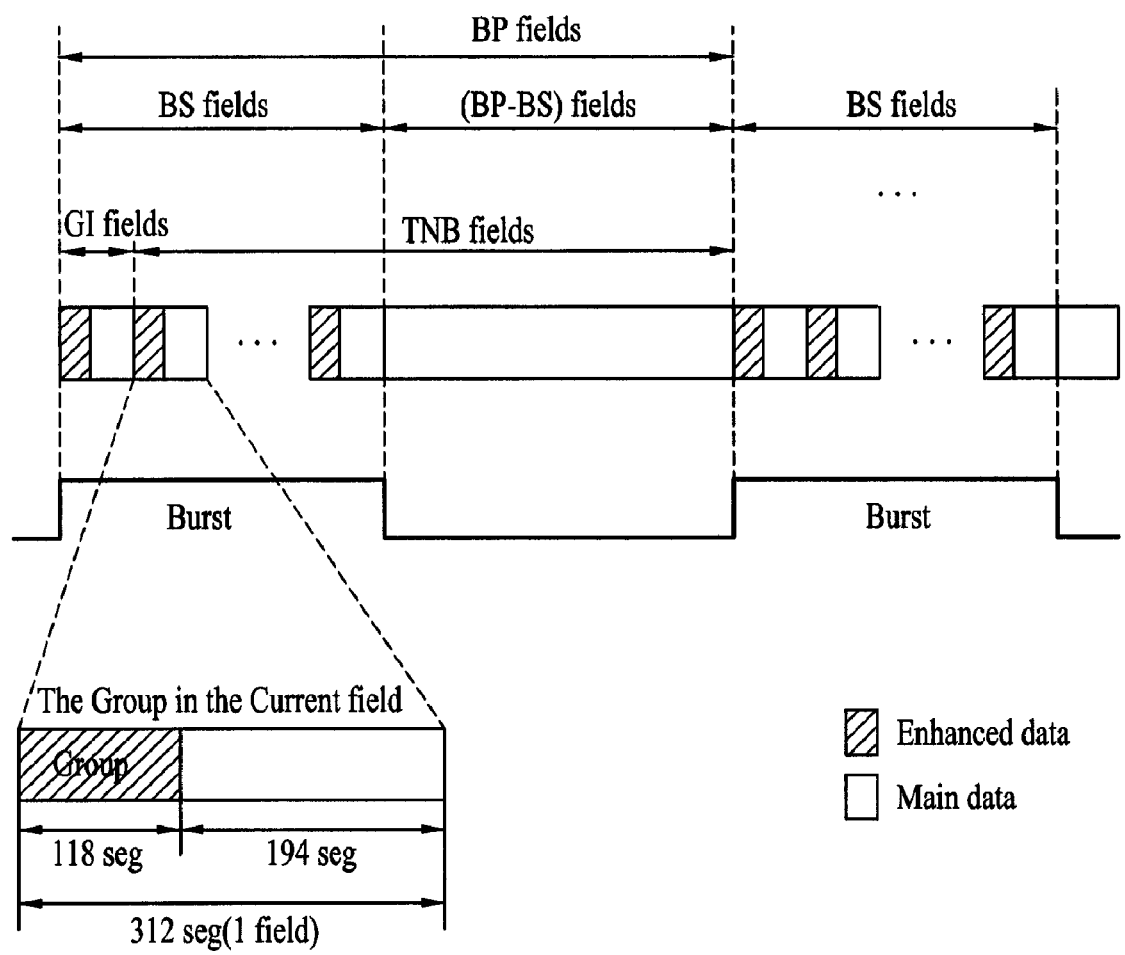
FIG. 10 illustrates exemplary operations of a packet multiplexer for transmitting a data group according to the present invention.

FIG. 10 illustrates detailed exemplary operations of the packet multiplexer 121 according to the embodiment of the present invention. Particularly, FIG. 10 illustrates an example of transmitting data in burst units. More specifically, the packet multiplexer 121 configures one burst section (or BP section) with BP number of fields. In other words, the BP section includes the number of fields from the beginning of the current burst to the beginning of the next burst.

The BP section is then configured of BS number of fields and BP-BS number of fields. The section configured of BP number of fields (or BS section) includes data fields having enhanced data groups and main data mixed therein, and the section configured of BP-BS number of fields (or BP-BS section) includes fields configured only of the main data. Each field of the BS section is configured of a field synchronization segment and 312 data segments. Herein, a data group and main data are multiplexed in the 312 data segments. Referring to FIG. 10, in the BS section, the data within the data group are allocated to 118 segments, and the main data are allocated to 195 segments, thereby configuring a field.

Also, referring to FIG. 10, each field within the BS section includes a data group index. Herein, GI indicates an order of data group currently being transmitted within one burst section. Also, a TNB section includes a number of fields starting from a current data group (GI) within a burst section to a starting point of the next burst section. The TNB value may be updated in accordance with the GI index of the data group that is currently being transmitted. Herein, the number of fields included in the TNB section may be obtained based upon the number of fields included in the BP section and the CI index of the data group currently being transmitted. Furthermore, the power-on period of the next burst may be estimated by subtracting GI from BP (i.e., BP-GI), or estimated by the TNB value.

In the above-described example, one RS frame is divided into 18 data groups and then transmitted. Therefore, referring to FIG. 10, the BS section is configured of 18 fields, and one super frame is divided into 36 data groups (i.e., 2 RS frames) and then transmitted. Accordingly, the digital broadcast receiving system may turn the power on only during the corresponding burst section including the desired data service, so as to receive the corresponding data. And, by turning the power off during the remaining sections, excessive power consumption of the receiving system may be reduced. Furthermore, by turning the power on during the 18 data fields included in the data group, and by turning the power off during the (BP-18) data fields, excessive power consumption may be controlled without influencing the receiving performance of the digital broadcast signals. The digital broadcast receiving system according to the present invention is advantageous in that one RS frame may be configured by the 18 data groups received in one burst section, thereby facilitating the decoding process.

Signaling Information

As described above, in order to enable the receiving system to properly and adequately process the enhanced data, the receiving system should be accurately aware of the transmission parameters used by the transmitting system. Examples of such parameters essentially required by the above-described pre-processor include the number of RS frames configuring a super frame (i.e., a super frame size (SFS)), the number of RS parity data bytes (P) for each column within the RS frame, whether or not a checksum, which is added to determine the presence of an error in a row direction within the RS frame, has been used, the type and size of the checksum if the checksum is used (presently, 2 data bytes are added to the CRC), the number of data groups configuring one RS frame—since the RS frame is transmitted to one burst section, the number of data groups configuring the one RS frame is identical to the number of data groups within one burst (i.e., burst size (BS)), and various code modes shown in Table 2 and Table 3.

Also, the parameters required for receiving a burst includes a burst period—herein, one burst period corresponds to a value obtained by counting the number of fields starting from the beginning of a current burst until the beginning of a next burst, a positioning order of the RS frames that are currently being transmitted within a super frame (i.e., a permuted frame index (PFI)) or a positioning order of groups that are currently being transmitted within a RS frame (burst) (i.e., a group index (GI)), and a burst size. Depending upon the method of managing a burst, the transmission parameter also includes the number of fields remaining until the beginning of the next burst (i.e., time to next burst (TNB)). And, by transmitting such information as the transmission parameter, each data group being transmitted to the receiving system may indicate a relative distance (or number of fields) between a current position and the beginning of a next burst.

In the embodiment of the present invention, a parameter is transmitted by grouping parameters to create small-sized block codes using Kerdock codes, and BCH or RS codes, which are added to a data byte allocated for signaling within the data group (as shown in FIG. 1). However, in this case, the parameter value is obtained by passing through the block decoder from the receiving end. Therefore, mode parameters of Table 2 and Table 3 that are required for the block decoding process should first be obtained. For this reason, the mode parameter inserts a parameter in a portion of an unused (or reserved) section of the known data. More specifically, this corresponds to a method of using a correlation of symbols for a faster decoding process. In other words, one of 8 sequences having excellent orthogonality (e.g., 8 different modes shown in Table 2) is matched with the current mode and inserted in the corresponding section of each data group. The receiving system then determines the code mode and combination mode based upon the correlation between each of the sequences and the sequence currently being received.

For example, a transmission parameter may be allocated and inserted to a predetermined region of an enhanced data packet or an enhanced data group. In this case, the transmission parameter is treated and processed as enhanced data. In addition, the transmission parameter may be multiplexed with other data and then inserted. For example, when multiplexing the known data and the enhanced data, the transmission parameter may be inserted instead of the known data in a place (or position) where known data is to be inserted. Alternatively, the transmission parameter may be mixed with the known data and then inserted. Furthermore, the transmission parameter may be allocated and inserted to a portion of a reserved region within the field synchronization segment of a transmission frame. Meanwhile, when the transmission parameter is inserted in the field synchronization segment region or the known data region and then transmitted, the reliability of the transmission parameter is reduced when the transmission parameter passes through the transmission channel. Therefore, a method of inserting one of a plurality of pre-defined patterns based upon the transmission parameter may also be used. At this point, the receiving system may recognize and acknowledge the transmission parameter by performing a correlation calculation between the received signal and the pre-defined patterns.

Receiving System

Figure 11:
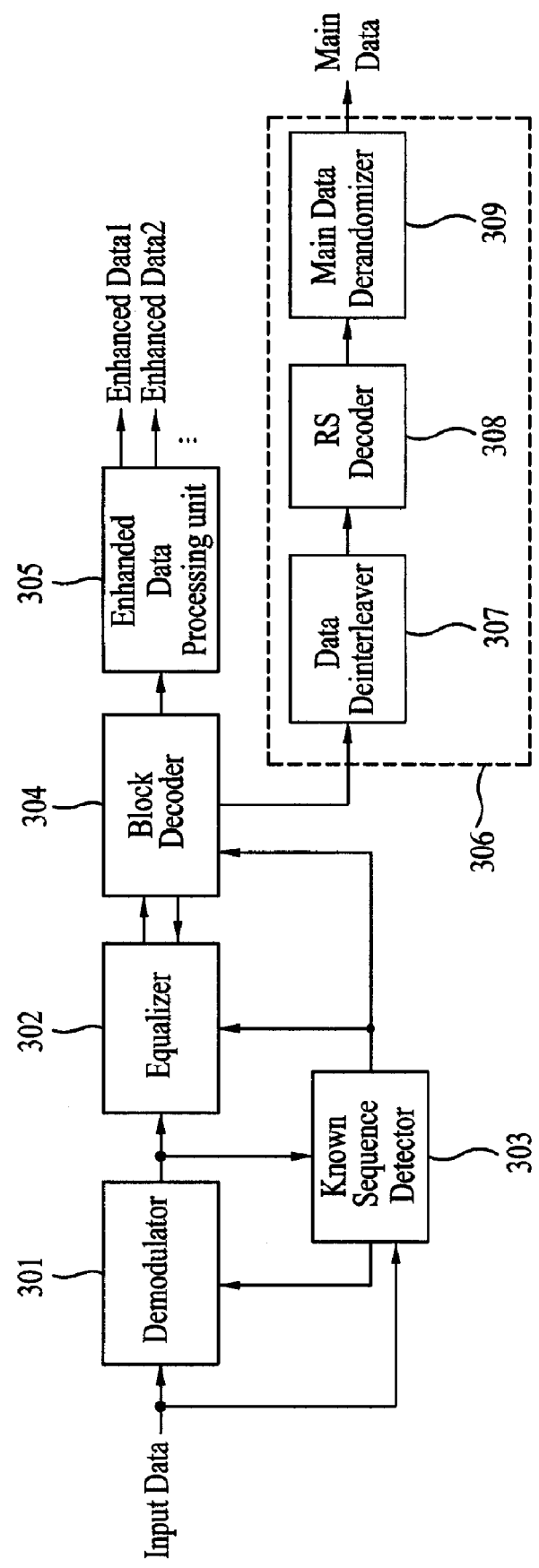
FIG. 11 illustrates a demodulating unit within a receiving system according to an embodiment of the present invention.

FIG. 11 illustrates a block diagram of a demodulating unit included in the receiving system according to an embodiment of the present invention. Herein, the demodulating unit of FIG. 11 may use known data information being inserted in an enhanced data section and transmitted from the transmitting system so as to perform processes, such as carrier synchronization recovery, frame synchronization recovery, and channel equalization, thereby enhancing the receiving performance. In order to do so, the demodulating unit according to the present invention includes a demodulator 301, a channel equalizer 302, a known sequence detector 303, a block decoder 304, an enhanced data processing unit 305, and a main data processing unit 306. Herein, the main data processing unit 306 includes a data deinterleaver 307, a RS decoder 308, and a main data derandomizer 309. The enhanced data processing unit 305 may have a plurality of structures depending upon the configuration of the pre-processor included in the transmitting system.

Figure 12:
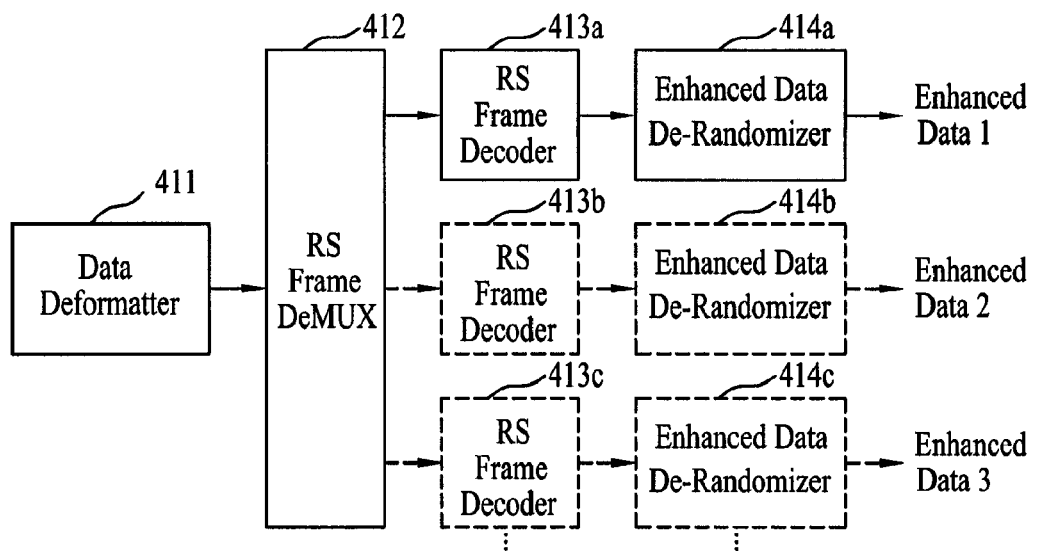
FIG. 12 and FIG. 13 respectively illustrate different examples of an enhanced data processing unit according to the present invention.
Figure 13:
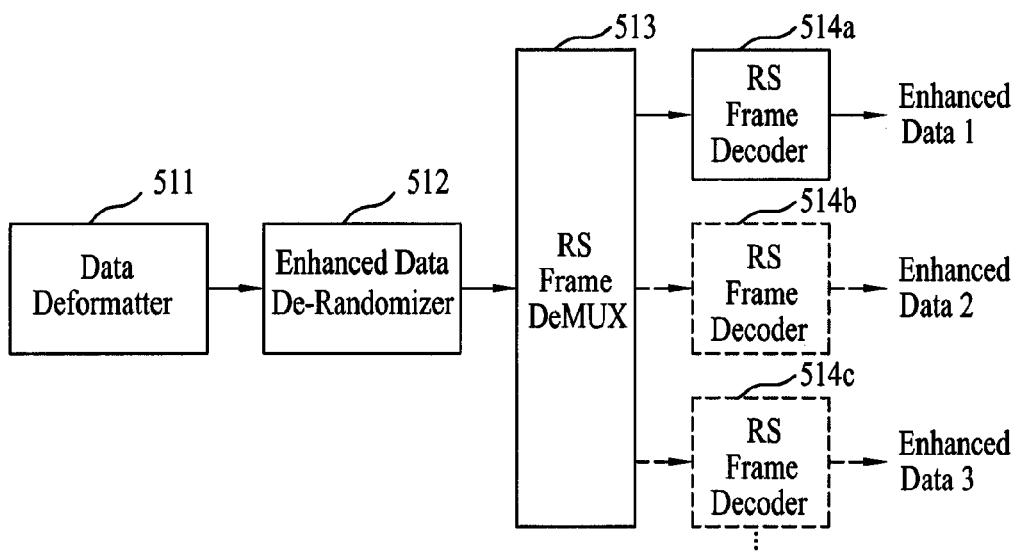

FIG. 12 and FIG. 13 illustrate detailed block diagrams of the enhanced data processing unit 305. The enhanced data processing unit 305 of FIG. 12 is more efficient when the pre-processor of the transmitting system shown in FIG. 1 is applied thereto. Alternatively, the enhanced data processing unit 305 of FIG. 13 is more efficient when the pre-processor of the transmitting system shown in FIG. 2 is applied thereto. More specifically, an IF signal of a particular channel is tuned by a tuner. Then, the tuned IF signal is inputted to the demodulator 301 and the known sequence detector 303. The demodulator 301 performs automatic gain control, carrier recovery, and timing recovery on the IF signal that is being inputted, thereby creating baseband data, which are then outputted to the equalizer 302 and the known sequence detector 303. The equalizer 302 compensates the distortion within the channel included in the demodulated signal. Then, the equalizer 302 outputs the compensated data to the block decoder 304.

At this point, the known sequence detector 303 detects the known data place inserted by the transmitting system to the input/output data of the demodulator 301 (i.e., data prior to demodulation or data after demodulation). Then, along with the position information, the known sequence detector 303 outputs the symbol sequence of the known data generated from the corresponding position to the demodulator 301 and the equalizer 302. Additionally, the known sequence detector 303 outputs information enabling the block decoder 304 to identify the enhanced data being additionally encoded by the transmitting system and the main data that are not additionally encoded to the block decoder 304. Furthermore, although the connection is not shown in FIG. 11, the information detected by the known sequence detector 303 may be used in the overall receiving system and may also be used in the enhanced data processing unit 305.

By using the known data symbol sequence when performing the timing recovery or carrier recovery, the demodulating performance of the demodulator 301 may be enhanced. Similarly, by using the known data, the channel equalizing performance of the channel equalizer 302 may be enhanced. Furthermore, by feeding-back the demodulation result of the block demodulator 304, the channel equalizing performance may also be enhanced. Herein, the channel equalizer 302 may perform channel equalization through various methods. In the present invention, a method of estimating a channel impulse response (CIR) for performing the channel equalization process will be given as an example of the present invention. More specifically, in the present invention, the channel impulse response (CIR) is differently estimated and applied in accordance with each hierarchical region within the data group that are transmitted from the transmitting system. Furthermore, by using the known data having the position (or place) and contents pre-known according to an agreement between the transmitting system and the receiving system, so as to estimate the CIR, the channel equalization process may be processed with more stability.

In the present invention, one data group that is inputted for channel equalization is divided into first to third regions, as shown in FIG. 7. As described above, the present invention uses the CIR estimated from the field synchronization data and the known data sequences in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Herein, when a value $F(A)$ of a function $F(x)$ at a particular point A and a value $F(B)$ of the function $F(x)$ at another particular point B are known, interpolation refers to estimating a function value of a point within the section between points A and B. Linear interpolation corresponds to the simplest form among a wide range of interpolation operations. The linear interpolation described herein is merely exemplary among a wide range of possible interpolation methods. And, therefore, the present invention is not limited only to the examples set forth herein.

Alternatively, when a value $F(A)$ of a function $F(x)$ at a particular point A and a value $F(B)$ of the function $F(x)$ at another particular point B are known, extrapolation refers to estimating a function value of a point outside of the section between points A and B. Linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

Meanwhile, if the data being inputted to the block decoder 304 after being channel equalized from the equalizer 302 correspond to the enhanced data having additional encoding and trellis encoding processes performed thereon by the transmitting system, trellis decoding and additional decoding processes are performed on the inputted data as inverse processes of the transmitting system. Alternatively, if the data being inputted to the block decoder 304 correspond to the main data having only a trellis encoding process performed thereon, and not the additional encoding process, only the trellis decoding process is performed on the inputted data as the inverse process of the transmitting system. The data group decoded by the block decoder 304 is inputted to the enhanced data processing unit 305, and the main data packet is inputted to the data deinterleaver 307 of the main data processing unit 306.

More specifically, if the inputted data correspond to the main data, the block decoder 304 performs Viterbi decoding on the inputted data so as to output a hard decision value or to perform a hard-decision on a soft decision value, thereby outputting the result. Meanwhile, if the inputted data correspond to the enhanced data, the block decoder 304 outputs a hard decision value or a soft decision value with respect to the inputted enhanced data. In other words, if the inputted data correspond to the enhanced data, the block decoder 304 performs a decoding process on the data encoded by the block processor and trellis encoding module of the transmitting system.

At this point, the RS frame encoder of the pre-processor included in the transmitting system may be viewed as an external code. And, the block processor and the trellis encoder may be viewed as an internal code. In order to maximize the performance of the external code when decoding such concatenated codes, the decoder of the internal code should output a soft decision value. Therefore, the block decoder 304 may output a hard decision value on the enhanced data. However, when required, it may be more preferable for the block decoder 304 to output a soft decision value.

Meanwhile, the data deinterleaver 307, the RS decoder 308, and the main data derandomizer 309 of the main data processing unit 306 are blocks required for receiving the main data. Therefore, the above-mentioned blocks may not be required in the structure of a digital broadcast receiving system that only receives the enhanced data. The data deinterleaver 307 performs an inverse process of the data interleaver included in the transmitting system. In other words, the data deinterleaver 307 deinterleaves the main data outputted from the block decoder 304 and outputs the deinterleaved main data to the RS decoder 308. The RS decoder 308 performs a systematic RS decoding process on the deinterleaved data and outputs the processed data to the main data derandomizer 309. The main data derandomizer 309 receives the output of the RS decoder 308 and generates a pseudo random data byte identical to that of the randomizer included in the digital broadcast transmitting system. Thereafter, the main data derandomizer 309 performs a bitwise exclusive OR (XOR) operation on the generated pseudo random data byte, thereby inserting the MPEG synchronization bytes to the beginning of each packet so as to output the data in 188-byte main data packet units.

Hereinafter, the enhanced data processing unit 305 will now be described in detail with reference to FIG. 12 and FIG. 13. The enhanced data processing unit of FIG. 12 includes a data deformatter 411, a RS frame demultiplexer 412, a plurality of RS frame decoders 413a to 413c, and a plurality of enhanced data derandomizers 414a to 414c. The number of RS frame decoders and the number of derandomizers included in FIG. 12 are merely exemplary and may vary depending upon the structure of the transmitting system, the types of enhanced data available for service, and the degree of importance of the available enhanced data. Therefore, the present invention is not limited to the numbers presented in the following description.

Referring to FIG. 12, the data being outputted from the block decoder 304 to the data deformatter 411 of the enhanced data processing unit 305 are outputted in the form of a data group. At this point, the data deformatter 411 is already aware of the configuration of the input data group. Therefore, the signaling information having system information included therein and the enhanced data are identified in the data group. The identified signaling information is transmitted to a place related with the system information, and the enhanced data are outputted to the RS frame demultiplexer 412. The RS frame demultiplexer 412 identifies the enhanced data based upon the service type transmitted from the transmitting system. Thereafter, the RS frame demultiplexer 412 respectively outputs the identified enhanced data sets to each RS frame decoder 413a to 413c.

At this point, the data deformatter 411 removes the known data, trellis initialization data, and MPEG header bytes that were inserted in the main data and the data group, and also removed the RS parity bytes that were added by the RS encoder/non-systematic RS encoder of the transmitting system. Thereafter, the data deformatter 411 outputs the processed data to the RS frame demultiplexer 412. Therefore, the first to third RS frame decoders 413a to 413c each receives only the enhanced data that are RS-encoded and CRC-encoded in RS frame units and that are interleaved in super frame units.

The first to third RS frame decoders 413a to 413c performs inverse processes of the corresponding RS frame encoders included in the transmitting system, so as to correct the errors within the RS frame. Then, the 1 MPEG synchronization data byte, which was removed during the RS frame encoding process, is added to the error-corrected enhanced data packet. Thereafter, the processed data are respectively outputted to each of the first to third enhanced data derandomizers 414a to 414c. The operations of each RS frame decoder will be described in detail in a later process. The first to third enhanced data derandomizers 414a to 414c respectively perform derandomizing processes, each corresponding to the inverse process of the randomizers included in the transmitting system, on the received enhanced data. Then, by outputting the derandomized enhanced data, the enhanced data initially outputted from the transmitting system may be obtained. For example, assuming that the first to third enhanced data derandomizers 414a to 414c are all included in the structure of the present invention, and that each of the first to third enhanced data derandomizers 414a to 414c is operational, three different types of enhanced data services may be available.

FIG. 13 illustrates an enhanced data processing unit according to another embodiment of the present invention. The difference between the enhanced data processing unit shown in FIG. 13 and that shown in FIG. 12 is the position (or location) of the derandomizer. More specifically, the derandomizer of the receiving system performs the inverse process of the randomizer of the transmitting system. Therefore, depending upon the position of the randomizer in the transmitting system shown in FIG. 1 and FIG. 2, the derandomizer of the receiving system may be positioned behind the RS frame demultiplexer, as shown in FIG. 12, or positioned before the RS frame multiplexer, as shown in FIG. 13.

The enhanced data processing unit of FIG. 13 includes a data deformatter 511, an enhanced data derandomizer 512, a RS frame demultiplexer 513, and a plurality of RS frame decoders 514a to 514c. The number of RS frame decoders included in FIG. 13 are merely exemplary and may vary depending upon the structure of the transmitting system, the types of enhanced data available for service, and the degree of importance of the available enhanced data. Therefore, the present invention is not limited to the numbers presented in the following description. The structure and operations of the data deformatter 511 is identical to those of the data deformatter 411 shown in FIG. 12. Therefore, a detailed description of the same will be omitted for simplicity.

Referring to FIG. 13, the enhanced data derandomizer 512 is positioned before the RS frame decoders 514a to 514c. As a result, when performing the derandomizing process, a soft decision is required to be made by the RS frame decoders 514a to 514c in a later process. Accordingly, when the block decoder 304 receives the soft decision value, it is difficult to perform a bitwise exclusive OR (XOR) operation between the soft decision value of the enhanced data and the pseudo random bit in order to perform the derandomizing process. Then, when an XOR operation is performed between the pseudo random bit and the soft decision value, if the pseudo random bit is equal to '1', the code of the soft decision value is inversed (or changed) and outputted. And, if the pseudo random bit is equal to '0', the code of the soft decision value is directly outputted without any modification, thereby maintaining the soft decision status, which is then transmitted to the corresponding RS frame decoder.

As described above, if the pseudo random bit is equal to '1', the code of the soft decision value is changed because, when an XOR operation is performed between the pseudo random bit and the input data in the randomizer of the transmitting system, and when the pseudo random bit is equal to '1', the code of the output data bit becomes the inverse of the input data (i.e., 0 XOR 1=1 and 1 XOR 1=0). More specifically, if the pseudo random bit generated from the enhanced data derandomizer 512 is equal to '1', and when an XOR operation is performed on the hard decision value of the enhanced data bit, the XOR-operated value becomes the opposite value of the hard decision value. Therefore, when the soft decision value is outputted, a code inversed from (or opposite to) that of the soft decision value is outputted. Hereinafter, the operations of one of the RS frame decoders shown in FIG. 12 and FIG. 13 will now be described in detail with reference to FIG. 14.

Figure 14:
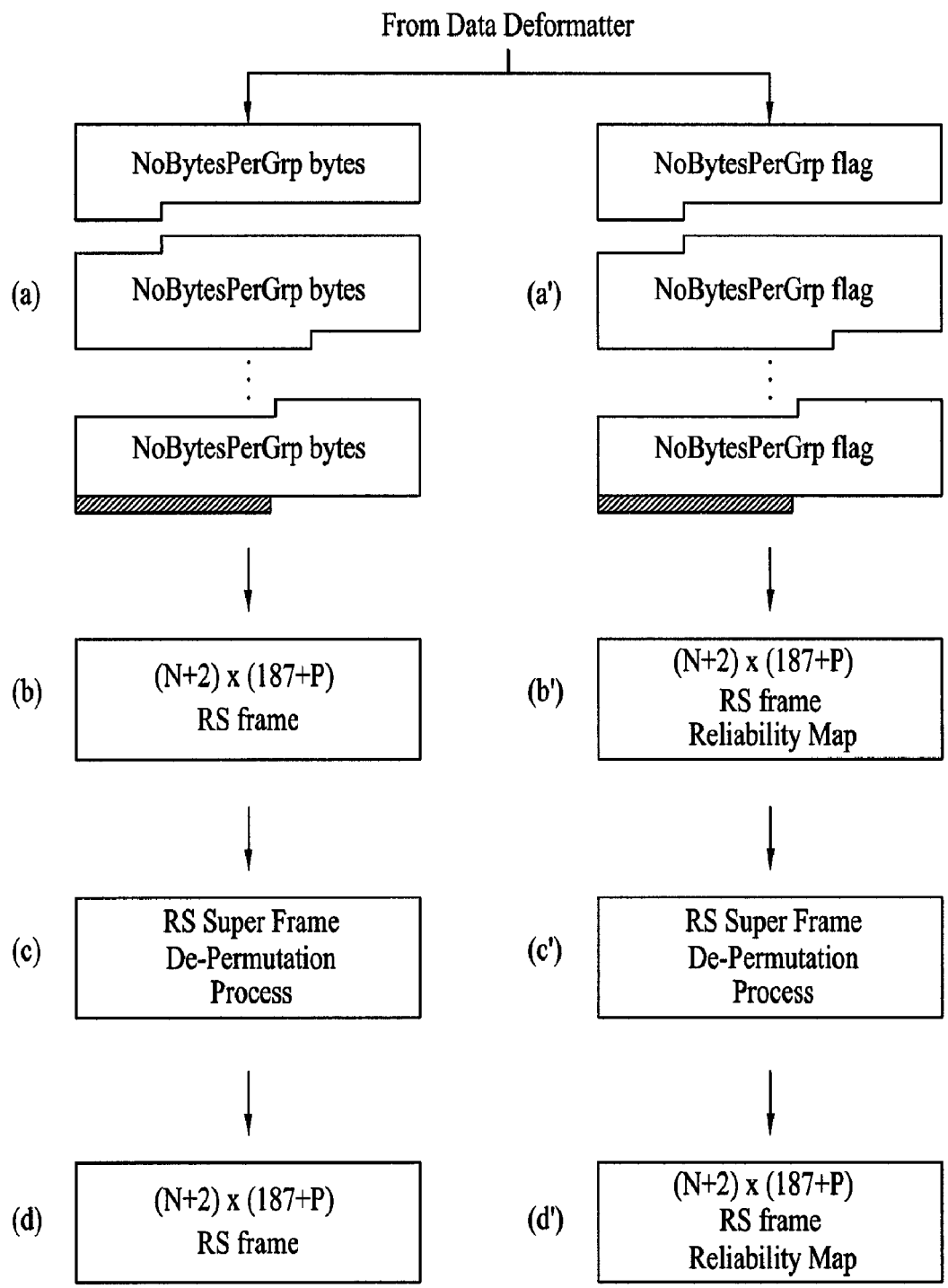
FIG. 14 to FIG. 16 respectively illustrate different examples of a decoding process of a RS frame decoder according to the present invention.

FIG. 14 illustrates a process of grouping a plurality of data groups (e.g., 18 data groups) to create a RS frame and a RS frame reliability map, and also a process of performing data deinterleaving in super frame units as an inverse process of the transmitting system and identifying the deinterleaved RS frame and RS frame reliability map. More specifically, the RS frame decoder groups the inputted enhanced data so as to create a RS frame. The enhanced data have been RS-encoded RS frame units by the transmitting system, and then interleaved in super frame units. At this point, the error correction encoding process (e.g., the CRC encoding process) may have been performed on the enhanced data (as shown in FIG. 4), or may not have been performed on the enhanced data (as shown in FIG. 5).

If it is assumed that the transmitting system has divided the RS frame having the size of (N+2)*(187+P) bytes into M number of data groups (wherein, for example, M is equal to 18) and then transmitted the divided RS frame, the receiving system groups the enhanced data of each data group, as shown in FIG. 14(a), so as to create a RS frame having the size of (N+2)*(187+P) bytes. At this point, if a dummy byte has been added to at least one of the data groups configuring the corresponding RS frame and, then, transmitted, the dummy byte is removed, and a RS frame and a RS frame reliability map are created. For example, as shown in FIG. 9, if K number of dummy bytes has been added, the RS frame and RS frame reliability map are created after the K number of dummy bytes has been removed.

Furthermore, if it is assumed that the RS frame is divided into 18 data groups, which are then transmitted from a single burst section, the receiving system also groups enhanced data of 18 data groups within the corresponding burst section, thereby creating the RS frame. Herein, when it is assumed that the block decoder 304 outputs a soft decision value for the decoding result, the RS frame decoder may decide the '0' and '1' of the corresponding bit by using the codes of the soft decision value. 8 bits that are each decided as described above are grouped to create one data byte. If the above-described process is performed on all soft decision values of the 18 data groups included in a single burst, the RS frame having the size of (N+2)*(187+P) bytes may be configured. Additionally, the present invention uses the soft decision value not only to configure the RS frame but also to configure a reliability map. Herein, the reliability map indicates the reliability of the corresponding data byte, which is configured by grouping 8 bits, the 8 bits being decided by the codes of the soft decision value.

For example, when the absolute value of the soft decision value exceeds a pre-determined threshold value, the value of the corresponding bit, which is decided by the code of the corresponding soft decision value, is determined to be reliable. Conversely, when the absolute value of the soft decision value does not exceed the pre-determined threshold value, the value of the corresponding bit is determined to be unreliable. Thereafter, if even a single bit among the 8 bits, which are decided by the codes of the soft decision value and group to configure one data byte, is determined to be unreliable, the corresponding data byte is marked on the reliability map as an unreliable data byte.

Herein, determining the reliability of one data byte is only exemplary. More specifically, when a plurality of data bytes (e.g., at least 4 data bytes) are determined to be unreliable, the corresponding data bytes may also be marked as unreliable data bytes within the reliability map. Conversely, when all of the data bits within the one data byte are determined to be reliable (i.e., when the absolute value of the soft decision values of all 8 bits included in the one data byte exceed the predetermined threshold value), the corresponding data byte is marked to be a reliable data byte on the reliability map. Similarly, when a plurality of data bytes (e.g., at least 4 data bytes) are determined to be reliable, the corresponding data bytes may also be marked as reliable data bytes within the reliability map. The numbers proposed in the above-described example are merely exemplary and, therefore, do not limit the scope or spirit of the present invention.

The process of configuring the RS frame and the process of configuring the reliability map both using the soft decision value may be performed at the same time. Herein, the reliability information within the reliability map is in a one-to-one correspondence with each byte within the RS frame. For example, if a RS frame has the size of (N+2)*(187+P) bytes, the reliability map is also configured to have the size of (N+2)*(187+P) bytes. FIG. 14(a') and FIG. 14(b') respectively illustrate the process steps of configuring the reliability map according to the present invention.

At this point, the RS frame of FIG. 14(b) and the RS frame reliability map of FIG. 14(b') are interleaved in super frame units (as shown in FIG. 6). Therefore, the RS frame and the RS frame reliability maps are grouped to create a super frame and a super frame reliability map. Subsequently, as shown in FIG. 14(c) and FIG. 14(c'), a deinterleaving process is performed in super frame units on the RS frame and the RS frame reliability maps, as an inverse process of the transmitting system. Then, when the deinterleaving process is performed in super frame units, the processed data are divided into deinterleaved RS frames having the size of (N+2)*(187+P) bytes and deinterleaved RS frame reliability maps having the size of (N+2)*(187+P) bytes, as shown in FIG. 14(d) and FIG. 14(d'). Subsequently, the RS frame reliability map is used on the deinterleaved RS frames so as to perform error correction.

Figure 15:
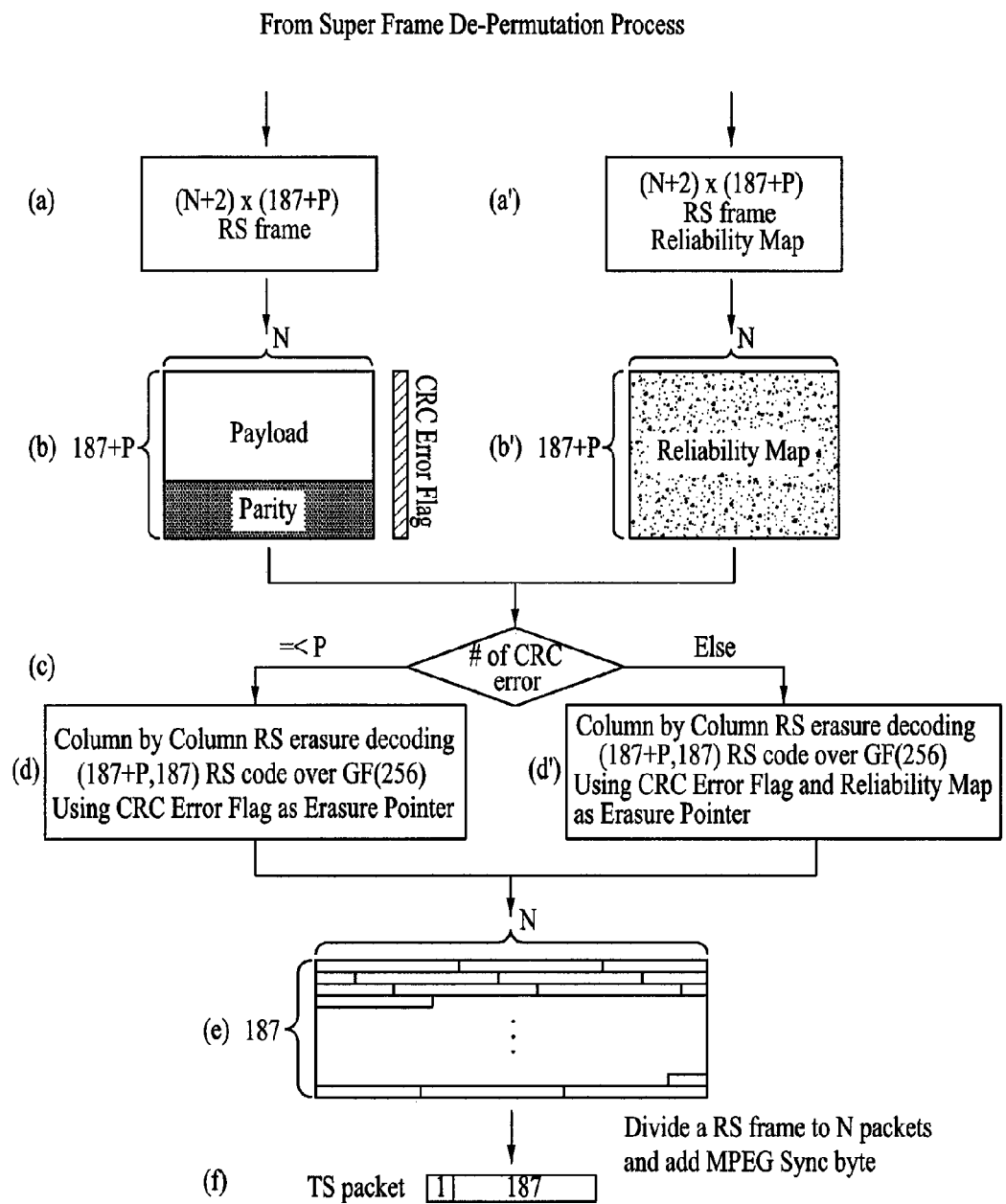
Figure 16:
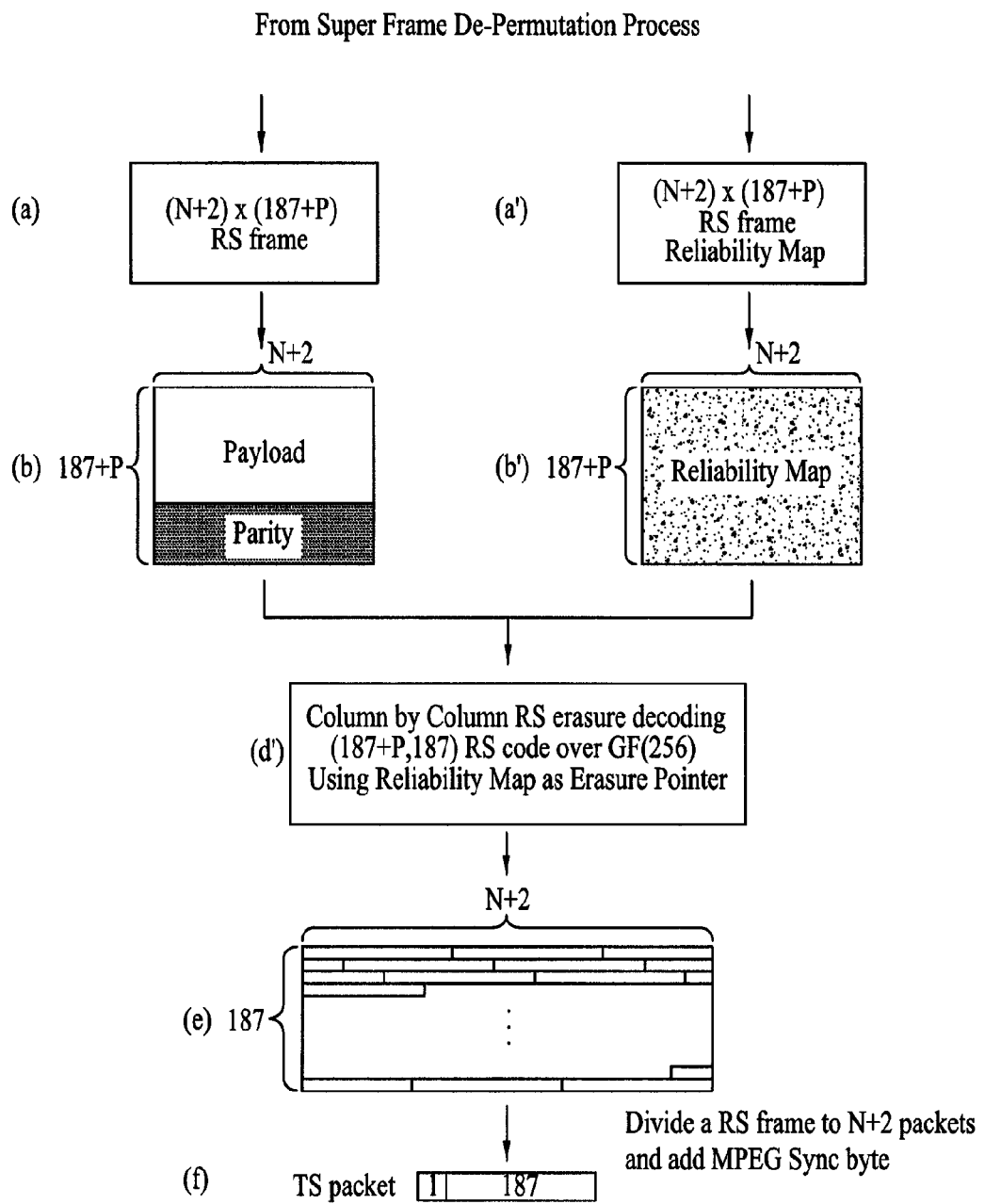

FIG. 15 and FIG. 16 illustrate example of the error correction processed according to embodiments of the present invention. FIG. 15 illustrates an example of performing an error correction process when the transmitting system has performed both RS encoding and CRC encoding processes on the RS frame (as shown in FIG. 4). And, FIG. 16 illustrates an example of performing an error correction process when the transmitting system has performed only the RS encoding process and not the CRC encoding process on the RS frame (as shown in FIG. 5). Hereinafter, the error correction process will now be described in detail with reference to FIG. 15.

As shown in FIG. 15(a) and FIG. 15(a'), when the RS frame having the size of (N+2)*(187+P) bytes and the RS frame reliability map having the size of (N+2)*(187+P) bytes are created, a CRC syndrome checking process is performed on the created RS frame, thereby verifying whether any error has occurred in each row. Subsequently, as shown in FIG. 15(b), a 2-byte checksum is removed to configure an RS frame having the size of N*(187+P) bytes. Herein, the presence (or existence) of an error is indicated on an error flag corresponding to each row. Similarly, since the portion of the reliability map corresponding to the CRC checksum has hardly any applicability, this portion is removed so that only N*(187+P) number of the reliability information bytes remain, as shown in FIG. 15(b').

After performing the CRC syndrome checking process, as described above, a RS decoding process is performed in a column direction. Herein, a RS erasure correction process may be performed in accordance with the number of CRC error flags. More specifically, as shown in FIG. 15(c), the CRC error flag corresponding to each row within the RS frame is verified. Thereafter, the RS frame decoder 606 determines whether the number of rows having a CRC error occurring therein is equal to or smaller than the maximum number of errors on which the RS erasure correction may be performed, when performing the RS decoding process in a column direction. The maximum number of errors corresponds to P number of parity bytes inserted when performing the RS encoding process. In the embodiment of the present invention, it is assumed that 48 parity bytes have been added to each column (i.e., P=48).

If the number of rows having the CRC errors occurring therein is smaller than or equal to the maximum number of errors (i.e., 48 errors according to this embodiment) that can be corrected by the RS erasure decoding process, a (235,187)-RS erasure decoding process is performed in a column direction on the RS frame having (187+P) number of N-byte rows (i.e., 235 N-byte rows), as shown in FIG. 15(d). Thereafter, as shown in FIG. 15(e), the 48-byte parity data that have been added at the end of each column are removed. Conversely, however, if the number of rows having the CRC errors occurring therein is greater than the maximum number of errors (i.e., 48 errors) that can be corrected by the RS erasure decoding process, the RS erasure decoding process cannot be performed. In this case, the error may be corrected by performing a general RS decoding process. In addition, the reliability map, which has been created based upon the soft decision value along with the RS frame, may be used to further enhance the error correction ability (or performance) of the present invention.

More specifically, the RS frame decoder compares the absolute value of the soft decision value of the block decoder 304 with the pre-determined threshold value, so as to determine the reliability of the bit value decided by the code of the corresponding soft decision value. Also, 8 bits, each being determined by the code of the soft decision value, are grouped to form one data byte. Accordingly, the reliability information on this one data byte is indicated on the reliability map. Therefore, as shown in FIG. 15(c), even though a particular row is determined to have an error occurring therein based upon a CRC syndrome checking process on the particular row, the present invention does not assume that all bytes included in the row have errors occurring therein. The present invention refers to the reliability information of the reliability map and sets only the bytes that have been determined to be unreliable as erroneous bytes. In other words, with disregard to whether or not a CRC error exists within the corresponding row, only the bytes that are determined to be unreliable based upon the reliability map are set as erasure points.

According to another method, when it is determined that CRC errors are included in the corresponding row, based upon the result of the CRC syndrome checking result, only the bytes that are determined by the reliability map to be unreliable are set as errors. More specifically, only the bytes corresponding to the row that is determined to have errors included therein and being determined to be unreliable based upon the reliability information, are set as the erasure points. Thereafter, if the number of error points for each column is smaller than or equal to the maximum number of errors (i.e., 48 errors) that can be corrected by the RS erasure decoding process, an RS erasure decoding process is performed on the corresponding column. Conversely, if the number of error points for each column is greater than the maximum number of errors (i.e., 48 errors) that can be corrected by the RS erasure decoding process, a general decoding process is performed on the corresponding column.

More specifically, if the number of rows having CRC errors included therein is greater than the maximum number of errors (i.e., 48 errors) that can be corrected by the RS erasure decoding process, either an RS erasure decoding process or a general RS decoding process is performed on a column that is decided based upon the reliability information of the reliability map, in accordance with the number of erasure points within the corresponding column. For example, it is assumed that the number of rows having CRC errors included therein within the RS frame is greater than 48. And, it is also assumed that the number of erasure points decided based upon the reliability information of the reliability map is indicated as 40 erasure points in the first column and as 50 erasure points in the second column. In this case, a (235,187)-RS erasure decoding process is performed on the first column. Alternatively, a (235,187)-RS decoding process is performed on the second column. When error correction decoding is performed on all column directions within the RS frame by using the above-described process, the 48-byte parity data which were added at the end of each column are removed, as shown in FIG. 15(e).

As described above, even though the total number of CRC errors corresponding to each row within the RS frame is greater than the maximum number of errors that can be corrected by the RS erasure decoding process, when the number of bytes determined to have a low reliability level, based upon the reliability information on the reliability map within a particular column, while performing error correction decoding on the particular column. Herein, the difference between the general RS decoding process and the RS erasure decoding process is the number of errors that can be corrected. More specifically, when performing the general RS decoding process, the number of errors corresponding to half of the number of parity bytes (i.e., (number of parity bytes)/2) that are inserted during the RS encoding process may be error corrected (e.g., 24 errors may be corrected). Alternatively, when performing the RS erasure decoding process, the number of errors corresponding to the number of parity bytes that are inserted during the RS encoding process may be error corrected (e.g., 48 errors may be corrected).

After performing the error correction decoding process, as described above, a RS frame configured of 187 N-byte rows (or packet) may be obtained as shown in FIG. 15(e). The RS frame having the size of 187*N bytes is outputted by the order of N number of 187-byte units. At this point, 1 MPEG synchronization byte, which had been removed by the transmitting system, is added to each 187-byte packet, as shown in FIG. 15(*f*). Therefore, a 188-byte unit enhanced data packet is outputted. Hereinafter, another error correction process will be described in detail with reference to FIG. 16.

As shown in FIG. 16(*a*) and FIG. 16(*a'*), when the RS frame having the size of (N+2)*(187+P) bytes and the RS frame reliability map having the size of (N+2)*(187+P) bytes are created, reference is made to a reliability map with respect to the RS frame, so as to perform a RS decoding process in a column direction. Referring to FIG. 16, since a CRC encoding process has not been performed on the enhanced data by the transmitting system, the CRC syndrome checking process is omitted. Therefore, a CRC error flag which is to be referred to during the RS decoding process does not exist. In other words, the system is unable to determine whether an error exists in each row or not. Therefore, in performing RS decoding in each column as shown in FIG. 16, the RS decoding process is performed by referring to a reliability map, which was created along with the RS frame by using the soft decision value.

FIG. 16(*b*) and FIG. 16(*b'*) respectively illustrate more detailed views of the RS frame having the size of (N+2)*(187+P) bytes and the RS frame reliability map having the size of (N+2)*(187+P) bytes. Herein, FIG. 16(*b*) and FIG. 16(*b'*) represent the same RS frame and RS frame reliability map as those shown in FIG. 16(*a*) and FIG. 16(*a'*). More specifically, the RS frame decoder compares an absolute value of the soft decision value of the block decoder 304 with a pre-determined threshold value, so as to determine the reliability of bit value, which is decided by a code of the corresponding soft decision value. Further, 8 bits determined by the codes of the soft decision values are grouped to form a byte. And, the reliability information of the corresponding byte is marked in the reliability map. Therefore, the present invention determines a data byte to be erroneous (or to have errors included therein) when the system decides that the corresponding data byte is not reliable based upon the reliability information within the reliability map, as shown in FIG. 16(*c*). More specifically, only the data bytes determined to be unreliable based upon the reliability information within the reliability map are set as erasure points.

Thereafter, when the number of error points for each column is equal to or smaller than the maximum number (P) of errors that can be corrected by RS erasure decoding (e.g., when P=48), a RS erasure decoding process is performed on the corresponding column. Conversely, when the number of error points for each column is greater than the maximum number (P) of errors that can be corrected by RS erasure decoding (e.g., when P=48), a general RS decoding process is performed on the corresponding column. For example, it is assumed that the number of erasure points decided based upon the reliability information of the reliability map within the RS frame is marked as '40' in the first column and marked as '50' in the second column. Then, (235,187)-RS erasure decoding is performed on the first column, and (235,187)-RS decoding is performed on the second column.

Meanwhile, in decoding each column, another method of referring to the reliability information includes performing a general RS decoding process, when the number of unreliable data bytes is smaller than P/2, performing a RS erasure decoding process, when the number of unreliable data bytes is greater than P/2 and smaller than P, and performing a general RS decoding process, when the number of unreliable data bytes is greater than P. At this point, depending upon the threshold value deciding the reliability information or other particular situations, the first reference method may provide a more enhanced performance. Alternatively, in other case, the second reference method may provide better performance.

The selecting of the appropriate RS decoding method does not only apply in the structure shown in FIG. 16. The selecting of the appropriate and effective RS decoding method also applies in the structure shown in FIG. 15. More specifically, only the method of decoding all of the columns with the same erasure point, when the number of CRC errors is smaller than P, is described and illustrated in FIG. 15. However, as another decoding method, the process may be more fractionalized even when the number of CRC errors is smaller than or equal to P. In other words, a RS decoding process is performed, when the number of CRC errors is smaller than or equal to P/2. And, a RS erasure decoding process may be performed, when the number of CRC errors is greater than P/2 and smaller than or equal to P. Similarly, when the number of CRC errors is greater than P, reference is made to both CRC error information and reliability information of each data byte within the reliability map. Accordingly, when the number of data bytes included in a row indicating the CRC error and, at the same time, determined to have unreliable reliability information is smaller than or equal to P/2, a RS decoding process is performed. When the number of such data bytes is greater than P/2 and smaller than or equal to P, a RS erasure decoding process is performed. Finally, when the number of such data bytes is greater than P, a RS decoding process may be performed. Furthermore, according to another embodiment of the present invention, based upon whether the number of unreliable data bytes is smaller than or equal to P or whether the number of unreliable data bytes is greater than P, the system decides whether to perform a RS erasure decoding process or a general RS decoding process.

Meanwhile, by performing the above-described process so as to perform a error correction decoding process in all column directions within the RS frame, 48 bytes of parity data, which were added to the last portion of each column, are removed, as shown in FIG. 16(*d*). As described above, in performing an error correction decoding process on a specific column within the corresponding RS frame, when the number of data bytes having a low reliability level based upon the reliability information in the reliability map of the corresponding column is equal to or smaller than a maximum number of error that can be corrected by a RS erasure decoding process, the present invention may perform a RS erasure decoding process of the corresponding column.

After performing the error correction decoding process, as described above, a RS frame configured of 187 (N+2)-byte rows (i.e., packets), as shown in FIG. 16(*d*). The RS frame having the size of (N+2)*(187+P) bytes is outputted by the order of (N+2) number of 187-byte units. At this point, 1 MPEG synchronization byte, which had been removed by the transmitting system, is added to each 187-byte packet, as shown in FIG. 16(*e*). Therefore, a 188-byte unit enhanced data packet is outputted.

Figure 17:
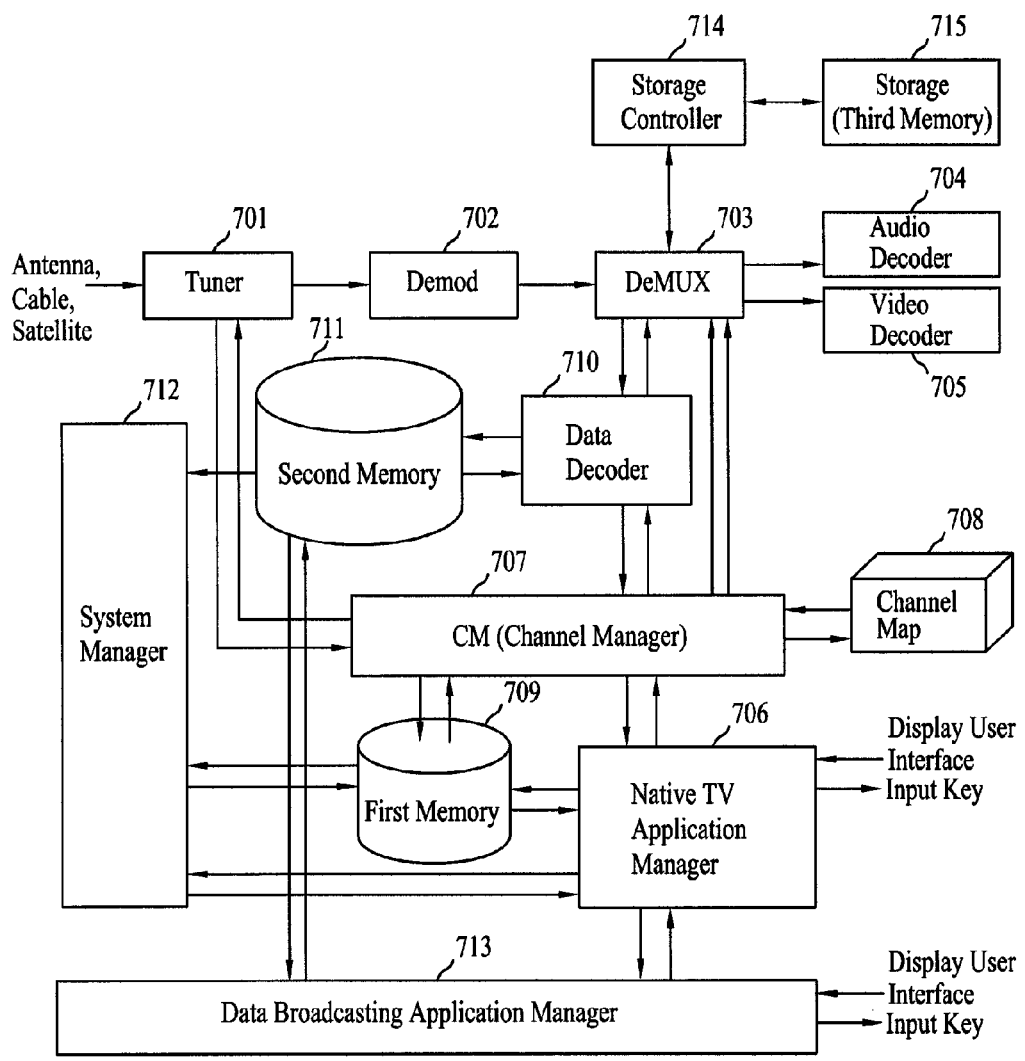
FIG. 17 illustrates a block diagram showing a structure of a receiving system according to an embodiment of the present invention.

FIG. 17 illustrates a block diagram showing the structure of a digital broadcast receiving system according to an embodiment of the present invention. Referring to FIG. 17, the digital broadcast receiving system includes a tuner 701, a demodulating unit 702, a demultiplexer 703, an audio decoder 704, a video decoder 705, a native TV application manager 706, a channel manager 707, a channel map 708, a first memory 709, a data decoder 710, a second memory 711, a system manager 712, a data broadcasting application manager 713, a storage controller 714, and a third memory 715. Herein, the third memory 715 is a mass storage device, such as a hard disk drive (HDD) or a memory chip. The tuner 701 tunes a frequency of a specific channel through any one of an antenna, cable, and satellite. Then, the tuner 701 down-converts the tuned frequency to an intermediate frequency (IF), which is then outputted to the demodulating unit 702. At this point, the tuner 701 is controlled by the channel manager 707. Additionally, the result and strength of the broadcast signal of the tuned channel are also reported to the channel manager 707. The data that are being received by the frequency of the tuned specific channel include main data, enhanced data, and table data for decoding the main data and enhanced data.

In the embodiment of the present invention, examples of the enhanced data may include data provided for data service, such as Java application data, HTML application data, XML data, and so on. The data provided for such data services may correspond either to a Java class file for the Java application, or to a directory file designating positions (or locations) of such files. Furthermore, such data may also correspond to an audio file and/or a video file used in each application. The data services may include weather forecast services, traffic information services, stock information services, services providing information quiz programs providing audience participation services, real time poll, user interactive education programs, gaming services, services providing information on soap opera (or TV series) synopsis, characters, original sound track, filing sites, services providing information on past sports matches, profiles and accomplishments of sports players, product information and product ordering services, services providing information on broadcast programs by media type, airing time, subject, and so on. The types of data services described above are only exemplary and are not limited only to the examples given herein. Furthermore, depending upon the embodiment of the present invention, the enhanced data may correspond to meta data. For example, the meta data use the XML application so as to be transmitted through a DSM-CC protocol.

The demodulating unit 702 performs demodulation and channel equalization on the signal being outputted from the tuner 701, thereby identifying the main data and the enhanced data. Thereafter, the identified main data and enhanced data are outputted in TS packet units. An example of the demodulating unit 702 is shown in FIG. 11. The demodulating unit shown in FIG. 11 is merely exemplary and the scope of the present invention is not limited to the examples set forth herein. In the embodiment given as an example of the present invention, only the enhanced data packet outputted from the demodulating unit 702 is inputted to the demultiplexer 703. In this case, the main data packet is inputted to another demultiplexer (not shown) that processes main data packets. Herein, the storage controller 714 is also connected to the other demultiplexer in order to store the main data after processing the main data packets. The demultiplexer of the present invention may also be designed to process both enhanced data packets and main data packets in a single demultiplexer.

The storage controller 714 is interfaced with the demultipelxer so as to control instant recording, reserved (or preprogrammed) recording, time shift, and so on of the enhanced data and/or main data. For example, when one of instant recording, reserved (or pre-programmed) recording, and time shift is set and programmed in the receiving system (or receiver) shown in FIG. 17, the corresponding enhanced data and/or main data that are inputted to the demultiplexer are stored in the third memory 715 in accordance with the control of the storage controller 714. The third memory 715 may be described as a temporary storage area and/or a permanent storage area. Herein, the temporary storage area is used for the time shifting function, and the permanent storage area is used for a permanent storage of data according to the user's choice (or decision).

When the data stored in the third memory 715 need to be reproduced (or played), the storage controller 714 reads the corresponding data stored in the third memory 715 and outputs the read data to the corresponding demultiplexer (e.g., the enhanced data are outputted to the demultiplexer 703 shown in FIG. 17). At this point, according to the embodiment of the present invention, since the storage capacity of the third memory 715 is limited, the compression encoded enhanced data and/or main data that are being inputted are directly stored in the third memory 715 without any modification for the efficiency of the storage capacity. In this case, depending upon the reproduction (or reading) command, the data read from the third memory 715 pass trough the demultiplexer so as to be inputted to the corresponding decoder, thereby being restored to the initial state.

The storage controller 714 may control the reproduction (or play), fast-forward, rewind, slow motion, instant replay functions of the data that are already stored in the third memory 715 or presently being buffered. Herein, the instant replay function corresponds to repeatedly viewing scenes that the viewer (or user) wishes to view once again. The instant replay function may be performed on stored data and also on data that are currently being received in real time by associating the instant replay function with the time shift function. If the data being inputted correspond to the analog format, for example, if the transmission mode is NTSC, PAL, and so on, the storage controller 714 compression encodes the inputted data and stored the compression-encoded data to the third memory 715. In order to do so, the storage controller 714 may include an encoder, wherein the encoder may be embodied as one of software, middleware, and hardware. Herein, an MPEG encoder may be used as the encoder according to an embodiment of the present invention. The encoder may also be provided outside of the storage controller 714.

Meanwhile, in order to prevent illegal duplication (or copies) of the input data being stored in the third memory 715, the storage controller 714 scrambles the input data and stores the scrambled data in the third memory 715. Accordingly, the storage controller 714 may include a scramble algorithm for scrambling the data stored in the third memory 715 and a descramble algorithm for descrambling the data read from the third memory 715. Herein, the definition of scramble includes encryption, and the definition of descramble includes decryption. The scramble method may include using an arbitrary key (e.g., control word) to modify a desired set of data, and also a method of mixing signals.

Meanwhile, the demultiplexer 703 receives the real-time data outputted from the demodulating unit 702 or the data read from the third memory 715 and demultiplexes the received data. In the example given in the present invention, the demultiplexer 703 performs demultiplexing on the enhanced data packet. Therefore, in the present invention, the receiving and processing of the enhanced data will be described in detail. It should also be noted that a detailed description of the processing of the main data will be omitted for simplicity starting from the description of the demultiplexer 703 and the subsequent elements.

The demultiplexer 703 demultiplexes enhanced data and program specific information/program and system information protocol (PSI/PSIP) tables from the enhanced data packet inputted in accordance with the control of the data decoder 710. Thereafter, the demultiplexed enhanced data and PSI/PSIP tables are outputted to the data decoder 710 in a section format. In order to extract the enhanced data from the channel through which enhanced data are transmitted and to decode the extracted enhanced data, system information is required. Such system information may also be referred to as service information. The system information may include channel information, event information, etc. In the embodiment of the present invention, the PSI/PSIP tables are applied as the system information. However, the present invention is not limited to the example set forth herein. More specifically, regardless of the name, any protocol transmitting system information in a table format may be applied in the present invention.

The PSI table is an MPEG-2 system standard defined for identifying the channels and the programs. The PSIP table is an advanced television systems committee (ATSC) standard that can identify the channels and the programs. The PSI table may include a program association table (PAT), a conditional access table (CAT), a program map table (PMT), and a network information table (NIT). Herein, the PAT corresponds to special information that is transmitted by a data packet having a PID of '0'. The PAT transmits PID information of the PMT and PID information of the NIT corresponding to each program. The CAT transmits information on a paid broadcast system used by the transmitting system. The PMT transmits PID information of a transport stream (TS) packet, in which program identification numbers and individual bit sequences of video and audio data configuring the corresponding program are transmitted, and the PID information, in which PCR is transmitted. The NIT transmits information of the actual transmission network.

The PSIP table may include a virtual channel table (VCT), a system time table (STT), a rating region table (RRT), an extended text table (ETT), a direct channel change table (DCCT), an event information table (EIT), and a master guide table (MGT). The VCT transmits information on virtual channels, such as channel information for selecting channels and information such as packet identification (PID) numbers for receiving the audio and/or video data. More specifically, when the VCT is parsed, the PID of the audio/video data of the broadcast program may be known. Herein, the corresponding audio/video data are transmitted within the channel along with the channel name and the channel number. The STT transmits information on the current data and timing information. The RRT transmits information on region and consultation organs for program ratings. The ETT transmits additional description of a specific channel and broadcast program. The EIT transmits information on virtual channel events (e.g., program title, program start time, etc.). The DCCT/DCCSCT transmits information associated with automatic (or direct) channel change. And, the MGT transmits the versions and PID information of the above-mentioned tables included in the PSIP.

Each of the above-described tables included in the PSI/PSIP is configured of a basic unit referred to as a "section" and a combination of one or more sections forms a table. For example, the VCT may be divided into 256 sections. Herein, one section may include a plurality of virtual channel information. However, a single set of virtual channel information is not divided into two or more sections. At this point, the receiving system may parse and decode the data for the data service that are transmitting by using only the tables included in the PSI, or only the tables included in the PISP, or a combination of tables included in both the PSI and the PSIP. In order to parse and decode the data for the data service, at least one of the PAT and PMT included in the PSI, and the VCT included in the PSIP is required. For example, the PAT may include the system information for transmitting the data corresponding to the data service, and the PID of the PMT corresponding to the data service data (or program number) The PMT may include the PID of the TS packet used for transmitting the data service data. The VCT may include information on the virtual channel for transmitting the data service data, and the PID of the TS packet for transmitting the data service data.

Meanwhile, depending upon the embodiment of the present invention, a DVB-SI may be applied instead of the PSIP. The DVB-SI may include a network information table (NIT), a service description table (SDT), an event information table (EIT), and a time and data table (TDT). The DVB-SI may be used in combination with the above-described PSI. Herein, the NIT divides the services corresponding to particular network providers by specific groups. The NIT includes all tuning information that are used during the IRD set-up. The NIT may be used for informing or notifying any change in the tuning information. The SDT includes the service name and different parameters associated with each service corresponding to a particular MPEG multiplex. The EIT is used for transmitting information associated with all events occurring in the MPEG multiplex. The EIT includes information on the current transmission and also includes information selectively containing different transmission streams that may be received by the IRD. And, the TDT is used for updating the clock included in the IRD.

Furthermore, three selective SI tables (i.e., a bouquet associate table (BAT), a running status table (RST), and a stuffing table (ST)) may also be included. More specifically, the bouquet associate table (BAT) provides a service grouping method enabling the IRD to provide services to the viewers. Each specific service may belong to at least one 'bouquet' unit. A running status table (RST) section is used for promptly and instantly updating at least one event execution status. The execution status section is transmitted only once at the changing point of the event status. Other SI tables are generally transmitted several times. The stuffing table (ST) may be used for replacing or discarding a subsidiary table or the entire SI tables.

In the present invention, the enhanced data included in the payload within the TS packet consist of a digital storage media-command and control (DSM-CC) section format. However, the TS packet including the data service data may correspond either to a packetized elementary stream (PES) type or to a section type. More specifically, either the PES type data service data configure the TS packet, or the section type data service data configure the TS packet. The TS packet configured of the section type data will be given as the example of the present invention. At this point, the data service data are includes in the digital storage media-command and control (DSM-CC) section. Herein, the DSM-CC section is then configured of a 188-byte unit TS packet.

Furthermore, the packet identification of the TS packet configuring the DSM-CC section is included in a data service table (DST). When transmitting the DST, '0x95' is assigned as the value of a stream_type field included in the service location descriptor of the PMT or the VCT. More specifically, when the PMT or VCT stream_type field value is '0x95', the receiving system may acknowledge that data broadcasting including enhanced data (i.e., the enhanced data) is being received. At this point, the enhanced data may be transmitted by a data carousel method. The data carousel method corresponds to repeatedly transmitting identical data on a regular basis.

At this point, according to the control of the data decoder 710, the demultiplexer 703 performs section filtering, thereby discarding repetitive sections and outputting only the non-repetitive sections to the data decoder 710. The demultiplexer

703 may also output only the sections configuring desired tables (e.g., VCT) to the data decoder 710 by section filtering. Herein, the VCT may include a specific descriptor for the enhanced data. However, the present invention does not exclude the possibilities of the enhanced data being included in other tables, such as the PMT. The section filtering method may include a method of verifying the PID of a table defined by the MGT, such as the VCT, prior to performing the section filtering process. Alternatively, the section filtering method may also include a method of directly performing the section filtering process without verifying the MGT, when the VCT includes a fixed PID (i.e., a base PID). At this point, the demultiplexer 703 performs the section filtering process by referring to a table_id field, a version_number field, a section_number field, etc.

As described above, the method of defining the PID of the VCT broadly includes two different methods. Herein, the PID of the VCT is a packet identifier required for identifying the VCT from other tables. The first method consists of setting the PID of the VCT so that it is dependent to the MGT. In this case, the receiving system cannot directly verify the VCT among the many PSI and/or PSIP tables. Instead, the receiving system must check the PID defined in the MGT in order to read the VCT. Herein, the MGT defines the PID, size, version number, and so on, of diverse tables. The second method consists of setting the PID of the VCT so that the PID is given a base PID value (or a fixed PID value), thereby being independent from the MGT. In this case, unlike in the first method, the VCT according to the present invention may be identified without having to verify every single PID included in the MGT. Evidently, an agreement on the base PID must be previously made between the transmitting system and the receiving system.

Meanwhile, in the embodiment of the present invention, the demultiplexer 703 may output only an application information table (AIT) to the data decoder 710 by section filtering. The AIT includes information on an application being operated in the receiving system for the data service. The AIT may also be referred to as an XAIT, and an AMT. Therefore, any table including application information may correspond to the following description. When the AIT is transmitted, a value of '0x05' may be assigned to a stream_type field of the PMT. The AIT may include application information, such as application name, application version, application priority, application ID, application status (i.e., auto-start, user-specific settings, kill, etc.), application type (i.e., Java or HTML), position (or location) of stream including application class and data files, application platform directory, and location of application icon.

In the method for detecting application information for the data service by using the AIT, component_tag, original_network_id, transport_stream_id, and service_id fields may be used for detecting the application information. The component_tag field designates an elementary stream carrying a DSI of a corresponding object carousel. The original_network_id field indicates a DVB-SI original_network_id of the TS providing transport connection. The transport_stream_id field indicates the MPEG TS of the TS providing transport connection, and the service_id field indicates the DVB-SI of the service providing transport connection. Information on a specific channel may be obtained by using the original_network_id field, the transport_stream_id field, and the service_id field. The data service data, such as the application data, detected by using the above-described method may be stored in the second memory 711 by the data decoder 710.

The data decoder 710 parses the DSM-CC section configuring the demultiplexed enhanced data. Then, the enhanced data corresponding to the parsed result are stored as a database in the second memory 711. The data decoder 710 groups a plurality of sections having the same table identification (table_id) so as to configure a table, which is then parsed. Thereafter, the parsed result is stored as a database in the second memory 711. At this point, by parsing data and/or sections, the data decoder 710 reads all of the remaining actual section data that are not section-filtered by the demultiplexer 703. Then, the data decoder 710 stores the read data to the second memory 711. The second memory 711 corresponds to a table and data carousel database storing system information parsed from tables and enhanced data parsed from the DSM-CC section. Herein, a table_id field, a section_number field, and a last_section_number field included in the table may be used to indicate whether the corresponding table is configured of a single section or a plurality of sections. For example, TS packets having the PID of the VCT are grouped to form a section, and sections having table identifiers allocated to the VCT are grouped to form the VCT.

When the VCT is parsed, information on the virtual channel to which enhanced data are transmitted may be obtained. The obtained application identification information, service component identification information, and service information corresponding to the data service may either be stored in the second memory 711 or be outputted to the data broadcasting application manager 713. In addition, reference may be made to the application identification information, service component identification information, and service information in order to decode the data service data. Alternatively, such information may also prepare the operation of the application program for the data service. Furthermore, the data decoder 710 controls the demultiplexing of the system information table, which corresponds to the information table associated with the channel and events. Thereafter, an A.V PID list may be transmitted to the channel manager 707.

The channel manager 707 may refer to the channel map 708 in order to transmit a request for receiving system-related information data to the data decoder 710, thereby receiving the corresponding result. In addition, the channel manager 707 may also control the channel tuning of the tuner 701. Furthermore, the channel manager 707 may directly control the demultiplexer 703, so as to set up the A/V PID, thereby controlling the audio decoder 704 and the video decoder 705. The audio decoder 704 and the video decoder 705 may respectively decode and output the audio data and video data demultiplexed from the main data packet. Alternatively, the audio decoder 704 and the video decoder 705 may respectively decode and output the audio data and video data demultiplexed from the enhanced data packet. Meanwhile, when the enhanced data include data service data, and also audio data and video data, it is apparent that the audio data and video data demultiplexed by the demultiplexer 703 are respectively decoded by the audio decoder 704 and the video decoder 705. For example, an audio-coding (AC)-3 decoding algorithm may be applied to the audio decoder 704, and a MPEG-2 decoding algorithm may be applied to the video decoder 705.

Meanwhile, the native TV application manager 706 operates a native application program stored in the first memory 709, thereby performing general functions such as channel change. The native application program refers to software stored in the receiving system upon shipping of the product. More specifically, when a user request (or command) is transmitted to the receiving system through a user interface (UI), the native TV application manger 706 displays the user request on a screen through a graphic user interface (GUI), thereby responding to the user's request. The user interface receives the user request through an input device, such as a remote controller, a key pad, a jog controller, an a touch-screen provided on the screen, and then outputs the received user request to the native TV application manager 706 and the data broadcasting application manager 713. Furthermore, the native TV application manager 706 controls the channel manager 707, thereby controlling channel-associated, such as the management of the channel map 708, and controlling the data decoder 710. The native TV application manager 706 also controls the GUI of the overall receiving system, thereby storing the user request and status of the receiving system in the first memory 709 and restoring the stored information.

The channel manager 707 controls the tuner 701 and the data decoder 710, so as to managing the channel map 708 so that it can respond to the channel request made by the user. More specifically, channel manager 707 sends a request to the data decoder 710 so that the tables associated with the channels that are to be tuned are parsed. The results of the parsed tables are reported to the channel manager 707 by the data decoder 710. Thereafter, based on the parsed results, the channel manager 707 updates the channel map 708 and sets up a PID in the demultiplexer 703 for demultiplexing the tables associated with the data service data from the enhanced data.

The system manager 712 controls the booting of the receiving system by turning the power on or off. Then, the system manager 712 stores ROM images (including downloaded software images) in the first memory 709. More specifically, the first memory 709 stores management programs such as operating system (OS) programs required for managing the receiving system and also application program executing data service functions. The application program is a program processing the data service data stored in the second memory 711 so as to provide the user with the data service. If the data service data are stored in the second memory 711, the corresponding data service data are processed by the above-described application program or by other application programs, thereby being provided to the user. The management program and application program stored in the first memory 709 may be updated or corrected to a newly downloaded program. Furthermore, the storage of the stored management program and application program is maintained without being deleted even if the power of the system is shut down. Therefore, when the power is supplied the programs may be executed without having to be newly downloaded once again.

The application program for providing data service according to the present invention may either be initially stored in the first memory 709 upon the shipping of the receiving system, or be stored in the first 709 after being downloaded. The application program for the data service (i.e., the data service providing application program) stored in the first memory 709 may also be deleted, updated, and corrected. Furthermore, the data service providing application program may be downloaded and executed along with the data service data each time the data service data are being received.

When a data service request is transmitted through the user interface, the data broadcasting application manager 713 operates the corresponding application program stored in the first memory 709 so as to process the requested data, thereby providing the user with the requested data service. And, in order to provide such data service, the data broadcasting application manager 713 supports the graphic user interface (GUI). Herein, the data service may be provided in the form of text (or short message service (SMS)), voice message, still image, and moving image. The data broadcasting application manager 713 may be provided with a platform for executing the application program stored in the first memory 709. The platform may be, for example, a Java virtual machine for executing the Java program. Hereinafter, an example of the data broadcasting application manager 713 executing the data service providing application program stored in the first memory 709, so as to process the data service data stored in the second memory 711, thereby providing the user with the corresponding data service will now be described in detail.

Assuming that the data service corresponds to a traffic information service, the data service according to the present invention is provided to the user of a receiving system that is not equipped with an electronic map and/or a GPS system in the form of at least one of a text (or short message service (SMS)), a voice message, a graphic message, a still image, and a moving image. In this case, is a GPS module is mounted on the receiving system shown in FIG. 17, the GPS module receives satellite signals transmitted from a plurality of low earth orbit satellites and extracts the current position (or location) information (e.g., longitude, latitude, altitude), thereby outputting the extracted information to the data broadcasting application manager 713.

At this point, it is assumed that the electronic map including information on each link and nod and other diverse graphic information are stored in one of the second memory 711, the first memory 709, and another memory that is not shown. More specifically, according to the request made by the data broadcasting application manager 713, the data service data stored in the second memory 711 are read and inputted to the data broadcasting application manager 713. The data broadcasting application manager 713 translates (or deciphers) the data service data read from the second memory 711, thereby extracting the necessary information according to the contents of the message and/or a control signal.

Figure 18:
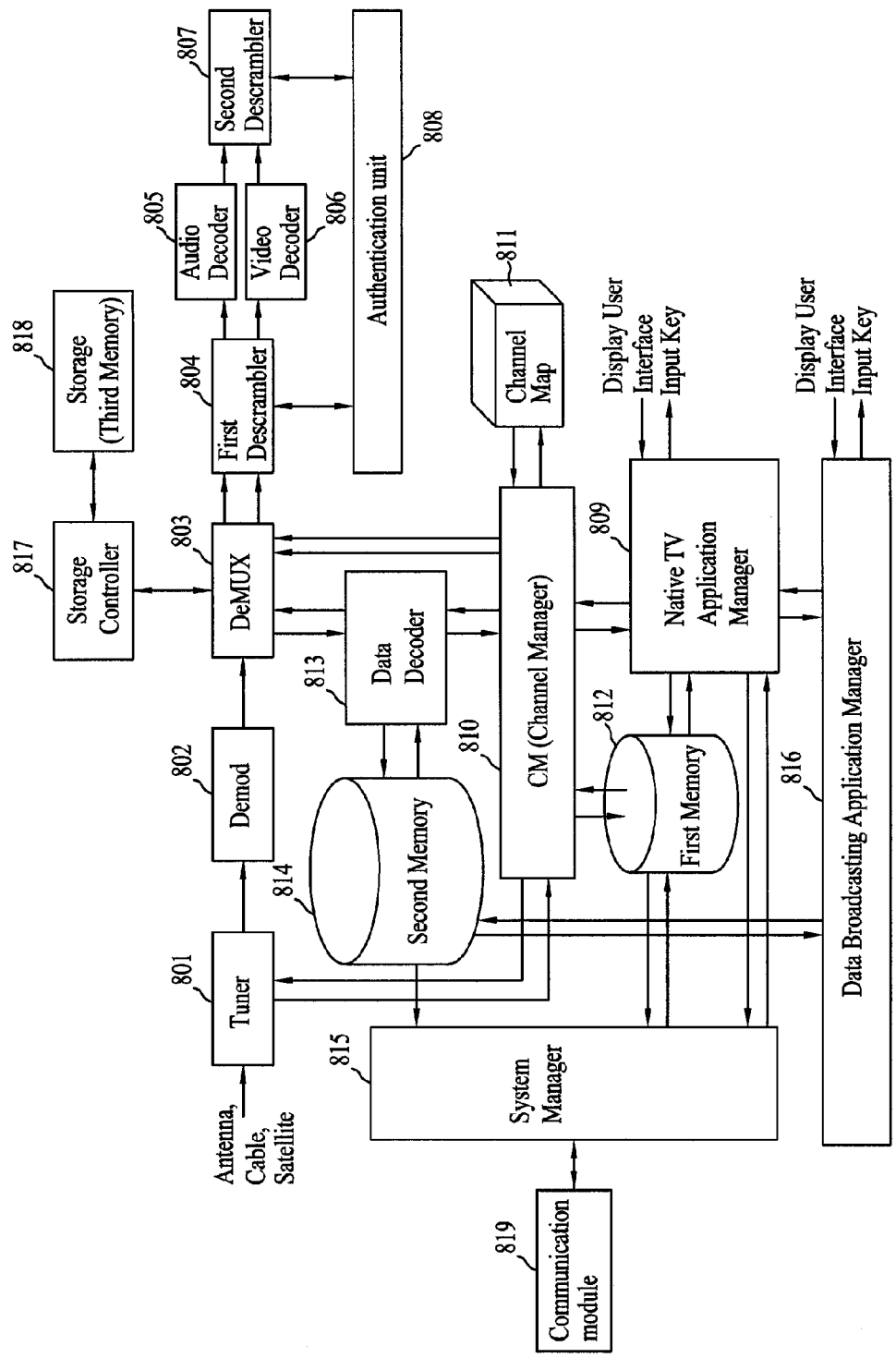
FIG. 18 illustrates a block diagram showing a structure of a receiving system according to another embodiment of the present invention.

FIG. 18 illustrates a block diagram showing the structure of a digital broadcast (or television) receiving system according to another embodiment of the present invention. Referring to FIG. 18, the digital broadcast receiving system includes a tuner 801, a demodulating unit 802, a demultiplexer 803, a first descrambler 804, an audio decoder 805, a video decoder 806, a second descrambler 807, an authentication unit 808, a native TV application manager 809, a channel manager 810, a channel map 811, a first memory 812, a data decoder 813, a second memory 814, a system manager 815, a data broadcasting application manager 816, a storage controller 817, a third memory 818, and a telecommunication module 819. Herein, the third memory 818 is a mass storage device, such as a hard disk drive (HDD) or a memory chip. Also, during the description of the digital broadcast (or television or DTV) receiving system shown in FIG. 18, the components that are identical to those of the digital broadcast receiving system of FIG. 17 will be omitted for simplicity.

As described above, in order to provide services for preventing illegal duplication (or copies) or illegal viewing of the enhanced data and/or main data that are transmitted by using a broadcast network, and to provide paid broadcast services, the transmitting system may generally scramble and transmit the broadcast contents. Therefore, the receiving system needs to descramble the scrambled broadcast contents in order to provide the user with the proper broadcast contents. Furthermore, the receiving system may generally be processed with an authentication process with an authentication means before the descrambling process. Hereinafter, the receiving system including an authentication means and a descrambling means according to an embodiment of the present invention will now be described in detail.

According to the present invention, the receiving system may be provided with a descrambling means receiving scrambled broadcasting contents and an authentication means authenticating (or verifying) whether the receiving system is entitled to receive the descrambled contents. Hereinafter, the descrambling means will be referred to as first and second descramblers 804 and 807, and the authentication means will be referred to as an authentication unit 808. Such naming of the corresponding components is merely exemplary and is not limited to the terms suggested in the description of the present invention. For example, the units may also be referred to as a decryptor. Although FIG. 18 illustrates an example of the descramblers 804 and 807 and the authentication unit 808 being provided inside the receiving system, each of the descramblers 804 and 807 and the authentication unit 808 may also be separately provided in an internal or external module. Herein, the module may include a slot type, such as a SD or CF memory, a memory stick type, a USB type, and so on, and may be detachably fixed to the receiving system.

As described above, when the authentication process is performed successfully by the authentication unit 808, the scrambled broadcasting contents are descrambled by the descramblers 804 and 807, thereby being provided to the user. At this point, a variety of the authentication method and descrambling method may be used herein. However, an agreement on each corresponding method should be made between the receiving system and the transmitting system. Hereinafter, the authentication and descrambling methods will now be described, and the description of identical components or process steps will be omitted for simplicity.

The receiving system including the authentication unit 808 and the descramblers 804 and 807 will now be described in detail. The receiving system receives the scrambled broadcasting contents through the tuner 801 and the demodulating unit 802. Then, the system manager 815 decides whether the received broadcasting contents have been scrambled. Herein, the demodulating unit 802 may be included as a demodulating mean according to an embodiment of the present invention as described in FIG. 11. However, the present invention is not limited to the examples given in the description set forth herein. If the system manager 815 decides that the received broadcasting contents have been scrambled, then the system manager 815 controls the system to operate the authentication unit 808. As described above, the authentication unit 808 performs an authentication process in order to decide whether the receiving system according to the present invention corresponds to a legitimate host entitled to receive the paid broadcasting service. Herein, the authentication process may vary in accordance with the authentication methods.

For example, the authentication unit 808 may perform the authentication process by comparing an IP address of an IP datagram within the received broadcasting contents with a specific address of a corresponding host. At this point, the specific address of the corresponding receiving system (or host) may be a MAC address. More specifically, the authentication unit 808 may extract the IP address from the decapsulated IP datagram, thereby obtaining the receiving system information that is mapped with the IP address. At this point, the receiving system should be provided, in advance, with information (e.g., a table format) that can map the IP address and the receiving system information. Accordingly, the authentication unit 808 performs the authentication process by determining the conformity between the address of the corresponding receiving system and the system information of the receiving system that is mapped with the IP address. In other words, if the authentication unit 808 determines that the two types of information conform to one another, then the authentication unit 808 determines that the receiving system is entitled to receive the corresponding broadcasting contents.

In another example, standardized identification information is defined in advance by the receiving system and the transmitting system. Then, the identification information of the receiving system requesting the paid broadcasting service is transmitted by the transmitting system. Thereafter, the receiving system determines whether the received identification information conforms with its own unique identification number, so as to perform the authentication process. More specifically, the transmitting system creates a database for storing the identification information (or number) of the receiving system requesting the paid broadcasting service. Then, if the corresponding broadcasting contents are scrambled, the transmitting system includes the identification information in the EMM, which is then transmitted to the receiving system.

If the corresponding broadcasting contents are scrambled, messages (e.g., entitlement control message (ECM), entitlement management message (EMM)), such as the CAS information, mode information, message position information, that are applied to the scrambling of the broadcasting contents are transmitted through a corresponding data header or anther data packet. The ECM may include a control word (CW) used for scrambling the broadcasting contents. At this point, the control word may be encoded with an authentication key. The EMM may include an authentication key and entitlement information of the corresponding data. Herein, the authentication key may be encoded with a receiving system-specific distribution key. In other words, assuming that the enhanced data are scrambled by using the control word, and that the authentication information and the descrambling information are transmitted from the transmitting system, the transmitting system encodes the CW with the authentication key and, then, includes the encoded CW in the entitlement control message (ECM), which is then transmitted to the receiving system. Furthermore, the transmitting system includes the authentication key used for encoding the CW and the entitlement to receive data (or services) of the receiving system (i.e., a standardized serial number of the receiving system that is entitled to receive the corresponding broadcasting service or data) in the entitlement management message (EMM), which is then transmitted to the receiving system.

Accordingly, the authentication unit 808 of the receiving system extracts the identification information of the receiving system and the identification information included in the EMM of the broadcasting service that is being received. Then, the authentication unit 808 determines whether the identification information conform to each other, so as to perform the authentication process. More specifically, if the authentication unit 808 determines that the information conform to each other, then the authentication unit 808 eventually determines that the receiving system is entitled to receive the request broadcasting service.

In yet another example, the authentication unit 808 of the receiving system may be detachably fixed to an external module. In this case, the receiving system is interfaced with the external module through a common interface (CI). In other words, the external module may receive the data scrambled by the receiving system through the common interface, thereby performing the descrambling process of the received data. Alternatively, the external module may also transmit only the information required for the descrambling process to the receiving system. The common interface is configured on a physical layer and at least one protocol layer. Herein, in consideration of any possible expansion of the protocol layer in a later process, the corresponding protocol layer may be configured to have at least one layer that can each provide an independent function.

The external module may either consist of a memory or card having information on the key used for the scrambling process and other authentication information but not including any descrambling function, or consist of a card having the above-mentioned key information and authentication information and including the descrambling function. Both the receiving system and the external module should be authenticated in order to provide the user with the paid broadcasting service provided (or transmitted) from the transmitting system. Therefore, the transmitting system can only provide the corresponding paid broadcasting service to the authenticated pair of receiving system and external module.

Additionally, an authentication process should also be performed between the receiving system and the external module through the common interface. More specifically, the module may communicate with the system manager 815 included in the receiving system through the common interface, thereby authenticating the receiving system. Alternatively, the receiving system may authenticate the module through the common interface. Furthermore, during the authentication process, the module may extract the unique ID of the receiving system and its own unique ID and transmit the extracted IDs to the transmitting system. Thus, the transmitting system may use the transmitted ID values as information determining whether to start the requested service or as payment information. Whenever necessary, the system manager 815 transmits the payment information to the remote transmitting system through the telecommunication module 819.

The authentication unit 808 authenticates the corresponding receiving system and/or the external module. Then, if the authentication process is successfully completed, the authentication unit 808 certifies the corresponding receiving system and/or the external module as a legitimate system and/or module entitled to receive the requested paid broadcasting service. In addition, the authentication unit 808 may also receive authentication-associated information from a mobile telecommunications service provider to which the user of the receiving system is subscribed, instead of the transmitting system providing the requested broadcasting service. In this case, the authentication-association information may either be scrambled by the transmitting system providing the broadcasting service and, then, transmitted to the user through the mobile telecommunications service provider, or be directly scrambled and transmitted by the mobile telecommunications service provider. Once the authentication process is successfully completed by the authentication unit 808, the receiving system may descramble the scrambled broadcasting contents received from the transmitting system. At this point, the descrambling process is performed by the first and second descramblers 804 and 807. Herein, the first and second descramblers 804 and 807 may be included in an internal module or an external module of the receiving system.

The receiving system is also provided with a common interface for communicating with the external module including the first and second descramblers 804 and 807, so as to perform the descrambling process. More specifically, the first and second descramblers 804 and 807 may be included in the module or in the receiving system in the form of hardware, middleware or software. Herein, the descramblers 804 and 807 may be included in any one of or both of the module and the receiving system. If the first and second descramblers 804 and 807 are provided inside the receiving system, it is advantageous to have the transmitting system (i.e., at least any one of a service provider and a broadcast station) scramble the corresponding data using the same scrambling method.

Alternatively, if the first and second descramblers 804 and 807 are provided in the external module, it is advantageous to have each transmitting system scramble the corresponding data using different scrambling methods. In this case, the receiving system is not required to be provided with the descrambling algorithm corresponding to each transmitting system. Therefore, the structure and size of receiving system may be simplified and more compact. Accordingly, in this case, the external module itself may be able to provide CA functions, which are uniquely and only provided by each transmitting systems, and functions related to each service that is to be provided to the user. The common interface enables the various external modules and the system manager 815, which is included in the receiving system, to communicate with one another by a single communication method. Furthermore, since the receiving system may be operated by being connected with at least one or more modules providing different services, the receiving system may be connected to a plurality of modules and controllers.

In order to maintain successful communication between the receiving system and the external module, the common interface protocol includes a function of periodically checking the status of the opposite correspondent. By using this function, the receiving system and the external module is capable of managing the status of each opposite correspondent. This function also reports the user or the transmitting system of any malfunction that may occur in any one of the receiving system and the external module and attempts the recovery of the malfunction.

In yet another example, the authentication process may be performed through software. More specifically, when a memory card having CAS software downloaded, for example, and stored therein in advanced is inserted in the receiving system, the receiving system receives and loads the CAS software from the memory card so as to perform the authentication process. In this example, the CAS software is read out from the memory card and stored in the first memory 812 of the receiving system. Thereafter, the CAS software is operated in the receiving system as an application program. According to an embodiment of the present invention, the CAS software is mounted on (or stored) in a middleware platform and, then executed. A Java middleware will be given as an example of the middleware included in the present invention. Herein, the CAS software should at least include information required for the authentication process and also information required for the descrambling process.

Therefore, the authentication unit 808 performs authentication processes between the transmitting system and the receiving system and also between the receiving system and the memory card. At this point, as described above, the memory card should be entitled to receive the corresponding data and should include information on a normal receiving system that can be authenticated. For example, information on the receiving system may include a unique number, such as a standardized serial number of the corresponding receiving system. Accordingly, the authentication unit 808 compares the standardized serial number included in the memory card with the unique information of the receiving system, thereby performing the authentication process between the receiving system and the memory card.

If the CAS software is first executed in the Java middleware base, then the authentication between the receiving system and the memory card is performed. For example, when the unique number of the receiving system stored in the memory card conforms to the unique number of the receiving system read from the system manager 815, then the memory card is verified and determined to be a normal memory card that may be used in the receiving system. At this point, the CAS software may either be installed in the first memory 812 upon the shipping of the present invention, or be downloaded to the first memory 812 from the transmitting system or the module or memory card, as described above. Herein, the descrambling function may be operated by the data broadcasting application manger 816 as an application program.

Thereafter, the CAS software parses the EMM/ECM packets outputted from the demultiplexer 803, so as to verify whether the receiving system is entitled to receive the corresponding data, thereby obtaining the information required for descrambling (i.e., the CW) and providing the obtained CW to the descramblers 804 and 807. More specifically, the CAS software operating in the Java middleware platform first reads out the unique (or serial) number of the receiving system from the corresponding receiving system and compares it with the unique number of the receiving system transmitted through the EMM, thereby verifying whether the receiving system is entitled to receive the corresponding data. Once the receiving entitlement of the receiving system is verified, the corresponding broadcasting service information transmitted to the ECM and the entitlement of receiving the corresponding broadcasting service are used to verify whether the receiving system is entitled to receive the corresponding broadcasting service. Once the receiving system is verified to be entitled to receive the corresponding broadcasting service, the authentication key transmitted to the EMM is used to decode (or decipher) the encoded CW, which is transmitted to the ECM, thereby transmitting the decoded CW to the descramblers 804 and 807. Each of the descramblers 804 and 807 uses the CW to descramble the broadcasting service.

Meanwhile, the CAS software stored in the memory card may be expanded in accordance with the paid service which the broadcast station is to provide. Additionally, the CAS software may also include other additional information other than the information associated with the authentication and descrambling. Furthermore, the receiving system may download the CAS software from the transmitting system so as to upgrade (or update) the CAS software originally stored in the memory card. As described above, regardless of the type of broadcast receiving system, as long as an external memory interface is provided, the present invention may embody a CAS system that can meet the requirements of all types of memory card that may be detachably fixed to the receiving system. Thus, the present invention may realize maximum performance of the receiving system with minimum fabrication cost, wherein the receiving system may receive paid broadcasting contents such as broadcast programs, thereby acknowledging and regarding the variety of the receiving system. Moreover, since only the minimum application program interface is required to be embodied in the embodiment of the present invention, the fabrication cost may be minimized, thereby eliminating the manufacturer's dependence on CAS manufacturers. Accordingly, fabrication costs of CAS equipments and management systems may also be minimized.

Meanwhile, the descramblers 804 and 807 may be included in the module either in the form of hardware or in the form of software. In this case, the scrambled data that being received are descrambled by the module and then demodulated. Also, if the scrambled data that are being received are stored in the third memory 818, the received data may be descrambled and then stored, or stored in the memory at the point of being received and then descrambled later on prior to being played (or reproduced). Thereafter, in case scramble/descramble algorithms are provided in the storage controller 817, the storage controller 817 scrambles the data that are being received once again and then stores the re-scrambled data to the third memory 818.

In yet another example, the descrambled broadcasting contents (transmission of which being restricted) are transmitted through the broadcasting network. Also, information associated with the authentication and descrambling of data in order to disable the receiving restrictions of the corresponding data are transmitted and/or received through the telecommunications module 819. Thus, the receiving system is able to perform reciprocal (or two-way) communication. The receiving system may either transmit data to the telecommunication module within the transmitting system or be provided with the data from the telecommunication module within the transmitting system. Herein, the data correspond to broadcasting data that are desired to be transmitted to or from the transmitting system, and also unique information (i.e., identification information) such as a serial number of the receiving system or MAC address.

The telecommunication module 819 included in the receiving system provides a protocol required for performing reciprocal (or two-way) communication between the receiving system, which does not support the reciprocal communication function, and the telecommunication module included in the transmitting system. Furthermore, the receiving system configures a protocol data unit (PDU) using a tag-length-value (TLV) coding method including the data that are to be transmitted and the unique information (or ID information). Herein, the tag field includes indexing of the corresponding PDU. The length field includes the length of the value field. And, the value field includes the actual data that are to be transmitted and the unique number (e.g., identification number) of the receiving system.

The receiving system may configure a platform that is equipped with the Java platform and that is operated after downloading the Java application of the transmitting system to the receiving system through the network. In this case, a structure of downloading the PDU including the tag field arbitrarily defined by the transmitting system from a storage means included in the receiving system and then transmitting the downloaded PDU to the telecommunication module 819 may also be configured. Also, the PDU may be configured in the Java application of the receiving system and then outputted to the telecommunication module 819. The PDU may also be configured by transmitting the tag value, the actual data that are to be transmitted, the unique information of the corresponding receiving system from the Java application and by performing the TLV coding process in the receiving system. This structure is advantageous in that the firmware of the receiving system is not required to be changed even if the data (or application) desired by the transmitting system is added.

The telecommunication module within the transmitting system either transmits the PDU received from the receiving system through a wireless data network or configures the data received through the network into a PDU which is transmitted to the host. At this point, when configuring the PDU that is to be transmitted to the host, the telecommunication module within the transmitting end may include unique information (e.g., IP address) of the transmitting system which is located in a remote location. Additionally, in receiving and transmitting data through the wireless data network, the receiving system may be provided with a common interface, and also provided with a WAP, CDMA 1× EV-DO, which can be connected through a mobile telecommunication base station, such as CDMA and GSM, and also provided with a wireless LAN, mobile internet, WiBro, WiMax, which can be connected through an access point. The above-described receiving system corresponds to the system that is not equipped with a telecommunication function. However, a receiving system equipped with telecommunication function does not require the telecommunication module 819.

The broadcasting data being transmitted and received through the above-described wireless data network may include data required for performing the function of limiting data reception. Meanwhile, the demultiplexer 803 receives either the real-time data outputted from the demodulating unit 802 or the data read from the third memory 818, thereby performing demultiplexing. In this embodiment of the present invention, the demultiplexer 803 performs demultiplexing on the enhanced data packet. Similar process steps have already been described earlier in the description of the present invention. Therefore, a detailed of the process of demultiplexing the enhanced data will be omitted for simplicity.

The first descrambler 804 receives the demultiplexed signals from the demultiplexer 803 and then descrambles the received signals. At this point, the first descrambler 804 may receive the authentication result received from the authentication unit 808 and other data required for the descrambling process, so as to perform the descrambling process. The audio decoder 805 and the video decoder 806 receive the signals descrambled by the first descrambler 804, which are then decoded and outputted. Alternatively, if the first descrambler 804 did not perform the descrambling process, then the audio decoder 805 and the video decoder 806 directly decode and output the received signals. In this case, the decoded signals are received and then descrambled by the second descrambler 807 and processed accordingly.

As described above, the present invention has the following advantages. More specifically, the present invention is highly protected against (or resistant to) any error that may occur when transmitting supplemental data through a channel. And, the present invention is also highly compatible to the conventional receiving system. Moreover, the present invention may also receive the supplemental data without any error even in channels having severe ghost effect and noise.

Additionally, by performing an error correction encoding process and by performing interleaving in super frame units and transmitting the processed data, robustness is provided to the enhanced data, thereby enabling the enhanced data to respond adequately and strongly against the fast and frequent change in channels. Most particularly, by creating a reliability map when performing error correction decoding on the received data, and by performing the error correction decoding process while referring to the reliability information of the reliability map, the error correction performance on the received enhanced data may be enhanced. Furthermore, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A receiving system, comprising:
    a receiving unit for receiving a broadcast signal, in which M number of data groups, which include first error correction encoded first data, and second error correction encoded second data are multiplexed, wherein a size of the M number of data groups is a sum of K bytes (K≧0) of dummy data and (N+2)*(187+P) bytes of a Reed-Solomon (RS) frame including the first data, wherein (N+2) is a number of bytes included in each row of the RS frame, wherein (187+P) is a number of bytes included in each column of the RS frame, wherein N is a number of bytes of the first data included in each row, and wherein P is a number of bytes of RS parity data included in each column;
    a demodulator for demodulating the broadcast signal;
    a block decoder for decoding the first data included in the demodulated broadcast signal in block units; and
    at least one RS frame decoder for performing error correction decoding on the block-decoded first data in RS frame units and correcting errors generated in the first data.

2. The receiving system of claim 1, wherein a size of each of the M number of data groups is the same.

3. The receiving system of claim 1, wherein the RS frame is received in a plurality of data packets including the first data, the P bytes of RS parity data included in each column based on the plurality of data packets, and Cyclic Redundancy Check (CRC) checksum data generated for each row based on the plurality of data packets and the RS parity data.

4. The receiving system of claim 1, wherein the at least one RS frame decoder corrects the errors generated in the first data in RS frame units based on a number of errors estimated from the RS frame and a reliability map representing reliability information of the first data.

5. The receiving system of claim 4, wherein the at least one RS frame decoder estimates the number of errors in the first data by performing Cyclic Redundancy Check (CRC) decoding on the RS frame.

6. The receiving system of claim 5, wherein the at least one RS frame decoder performs RS eraser decoding on all columns of the RS frame in a column direction if the number of errors estimated by the CRC decoding and indicated in an error flag corresponding to each row within the RS frame is equal to or smaller than the number of the RS parity data added in the column direction of the RS frame.

7. The receiving system of claim 5, wherein the at least one RS frame decoder determines either general RS decoding or RS erase decoding for each column based upon the reliability map and performs error correction by using the determined general RS decoding or RS erase decoding for each corresponding column if the number of errors estimated by the CRC decoding and indicated in an error flag corresponding to each row within the RS frame is greater than the number of the RS parity data added in the column direction of the RS frame.

8. The receiving system of claim 1, further comprising:
    a known data detector for detecting known data sequences received by being inserted in a partial region of the M number of data groups included in the demodulated broadcast signal.

9. The receiving system of claim 8, further comprising:
    an equalizer for compensating for channel distortion generated from the demodulated first data using the detected known data sequences, and outputting the compensated first data to the block decoder.

10. A method of processing data in a receiving system, the method comprising:
    receiving a broadcast signal in which M number of data groups, which include first error correction encoded first data, and second error correction encoded second data are multiplexed, wherein a size of the M number of data groups is a sum of K bytes (K≧0) of dummy data and (N+2)*(187+P) bytes of a Reed-Solomon (RS) frame including the first data, wherein (N+2) is a number of bytes included in each row of the RS frame, wherein (187+P) is a number of bytes included in each column of the RS frame, wherein N is a number of bytes of the first data included in each row, and wherein P is a number of bytes of RS parity data included in each column;

demodulating the broadcast signal;

decoding the first data included in the demodulated broadcast signal in block units; and performing error correction decoding on the block-decoded first data in RS frame units to correct errors generated in the first data.

11. The method of claim 10, wherein a size of each of the M number of data groups is the same.

12. The method of claim 10, wherein the RS frame is received in a plurality of data packets including the first data, the P bytes of RS parity data included in each column based on the plurality of data packets, and Cyclic Redundancy Check (CRC) checksum data generated for each row based on the plurality of data packets and the RS parity data.

13. The method of claim 10, wherein performing error correction decoding comprises correcting the errors generated in the first data in RS frame units based on a number of errors estimated from the RS frame and a reliability map representing reliability information of the first data.

14. The method of claim 13, wherein performing error correction decoding further comprises estimating the number of errors in the first data by performing Cyclic Redundancy Check (CRC) decoding on the RS frame.

15. The method of claim 14, wherein performing error correction decoding further comprises:

performing RS eraser decoding on all columns of the RS frame in a column direction if the number of errors estimated by the CRC decoding and indicated in an error flag corresponding to each row within the RS frame is equal to or smaller than the number of the RS parity data added in the column direction of the RS frame.

16. The method of claim 14, wherein performing error correction decoding further comprises:

determining either general RS decoding or RS erase decoding for each column based upon the reliability map and performing error correction by using the determined general RS decoding or RS erase decoding for each corresponding column if the number of errors estimated by the CRC decoding and indicated in an error flag corresponding to each row within the RS frame is greater than the number of the RS parity data added in a column direction of the RS frame.

17. The method of claim 10, further comprising:

detecting known data sequences received by being inserted in a partial region of the M number of data groups included in the demodulated broadcast signal.

18. The method of claim 17, further comprising:

compensating for channel distortion generated from the demodulated first data using the detected known data sequences and outputting the compensated first data for block decoding.

* * * * *